(12) United States Patent
Fukuzawa et al.

(10) Patent No.: US 7,924,202 B2
(45) Date of Patent: Apr. 12, 2011

(54) INTEGRATED CIRCUIT DEVICE AND ELECTRONIC INSTRUMENT

(75) Inventors: Akihiro Fukuzawa, Hino (JP); Satoru Ito, Okaya (JP); Nobuyuki Imai, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 125 days.

(21) Appl. No.: 12/389,681

(22) Filed: Feb. 20, 2009

(65) Prior Publication Data
US 2009/0212860 A1 Aug. 27, 2009

(30) Foreign Application Priority Data

Feb. 21, 2008 (JP) ................................ 2008-040161

(51) Int. Cl.
*H03M 1/12* (2006.01)
(52) U.S. Cl. .................... 341/155; 341/118; 341/120
(58) Field of Classification Search .................. 341/155, 341/143, 144, 118, 120; 330/98
See application file for complete search history.

(56) References Cited

U.S. PATENT DOCUMENTS

| | | | | |
|---|---|---|---|---|
| 3,501,625 | A * | 3/1970 | Gorbatenko ................. | 341/156 |
| 5,892,472 | A * | 4/1999 | Shu et al. ..................... | 341/139 |
| 6,414,615 | B1 * | 7/2002 | Cheng ........................... | 341/143 |
| 6,975,259 | B1 * | 12/2005 | Jensen .......................... | 341/143 |
| 7,085,587 | B2 | 8/2006 | Oono et al. | |
| 7,129,867 | B2 * | 10/2006 | Kim et al. ..................... | 341/118 |
| 7,257,385 | B2 | 8/2007 | Ono et al. | |
| 7,755,527 | B2 * | 7/2010 | Lee et al. ...................... | 341/144 |
| 2004/0120423 | A1 * | 6/2004 | Clara et al. ................... | 375/319 |
| 2005/0062855 | A1 | 3/2005 | Tani et al. | |
| 2007/0202813 | A1 | 8/2007 | Ono et al. | |
| 2007/0202814 | A1 | 8/2007 | Ono et al. | |

FOREIGN PATENT DOCUMENTS

| | | |
|---|---|---|
| JP | A-4-185018 | 7/1992 |
| JP | A-2002-217762 | 8/2002 |
| JP | A-2005-101870 | 4/2005 |
| JP | A-2005-110080 | 4/2005 |
| JP | A-2007-117586 | 5/2007 |
| JP | A-2007-285745 | 11/2007 |

OTHER PUBLICATIONS

New U.S. Patent Application filed on Feb. 20, 2009 in the name of Fukuzawa et al.
U.S. Appl. No. 12/338,547, filed Dec. 18, 2008 in name of Fukuzawa et al.
U.S. Appl. No. 12/343,796, filed Dec. 24, 2008 in name of Fukuzawa et al.

* cited by examiner

*Primary Examiner* — Peguy JeanPierre
(74) *Attorney, Agent, or Firm* — Oliff & Berridge, PLC

(57) ABSTRACT

An integrated circuit device includes an amplifier circuit that includes first to Nth amplifiers that are cascaded and receives an input signal, an A/D converter that performs an A/D conversion process on a signal amplified by the amplifier circuit, first to Nth D/A converters that are provided corresponding to the first to Nth amplifiers and used to perform an offset adjustment of the first to Nth amplifiers, and a control circuit that sets an offset adjustment of the first to Nth amplifiers using the first to Nth D/A converters and a gain adjustment of the first to Nth amplifiers.

19 Claims, 25 Drawing Sheets $VQ = -\frac{R2}{R1}(Vin+VD)$ $VQ = \frac{R2}{R1}(VD-Vin)$ $VQ = -\frac{R2}{R1}Vin + \left(1+\frac{R2}{R1}\right)VD$

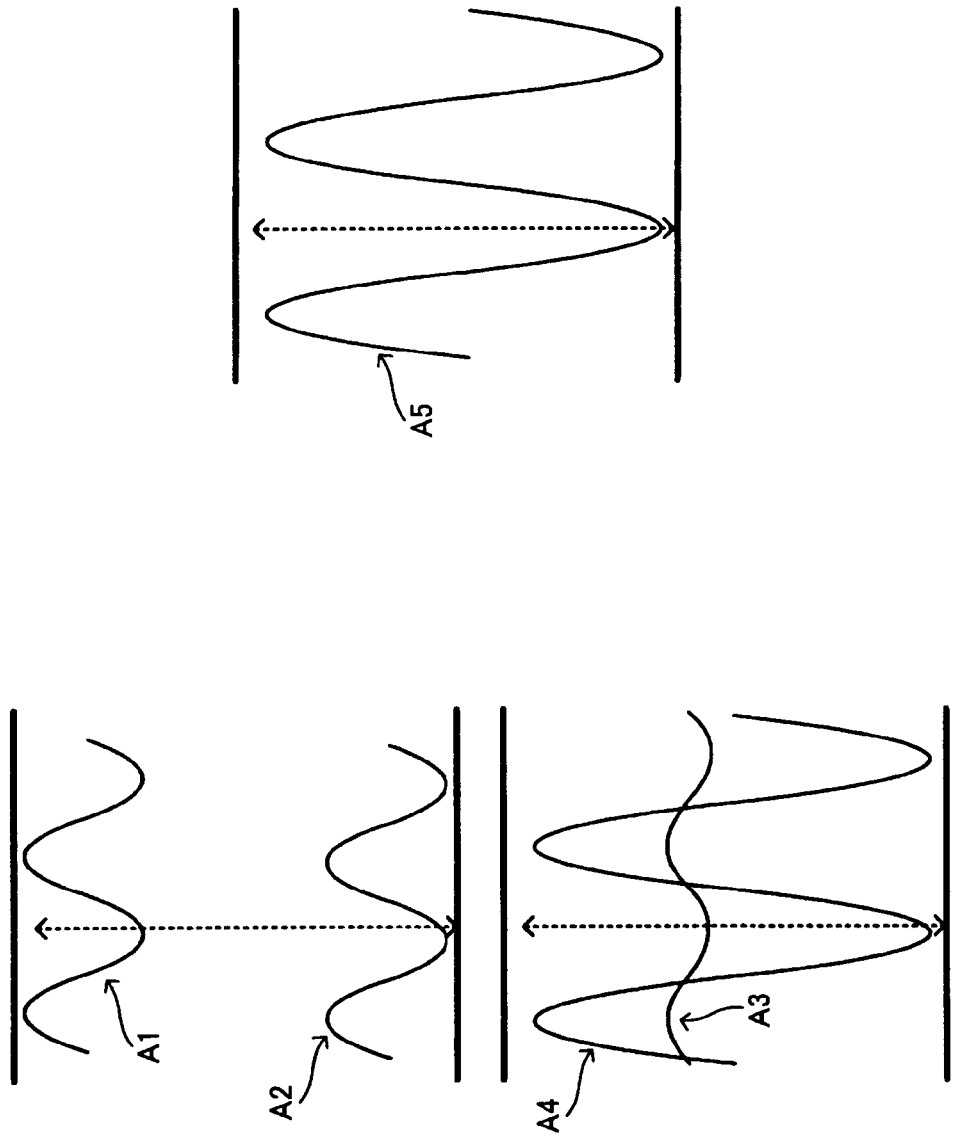

FIG. 5A
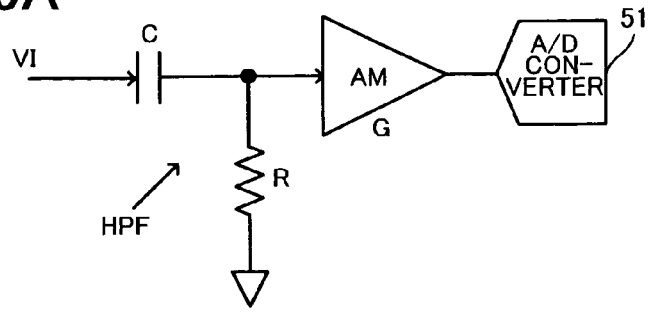
FIG. 5B
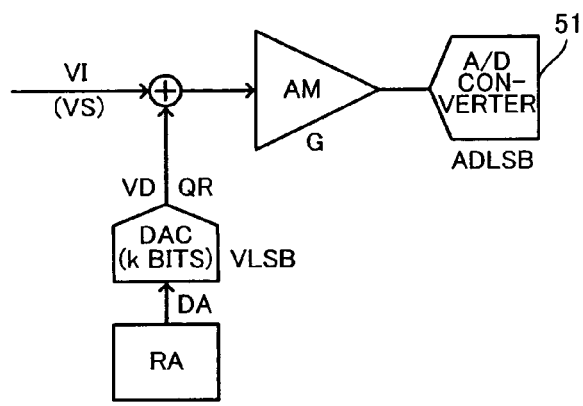
FIG. 5C
| | HPF | SINGLE-STAGE AMPLIFIER/SINGLE-STAGE DAC | MULTI-STAGE AMPLIFIER/MULTI-STAGE DAC |
|---|---|---|---|
| CALIBRATION RESPONSE SPEED | × | ○ | ○ |
| SIZE | × | × | ○ |
| ACCURACY | ○ | × | ○ |
FIG. 5D
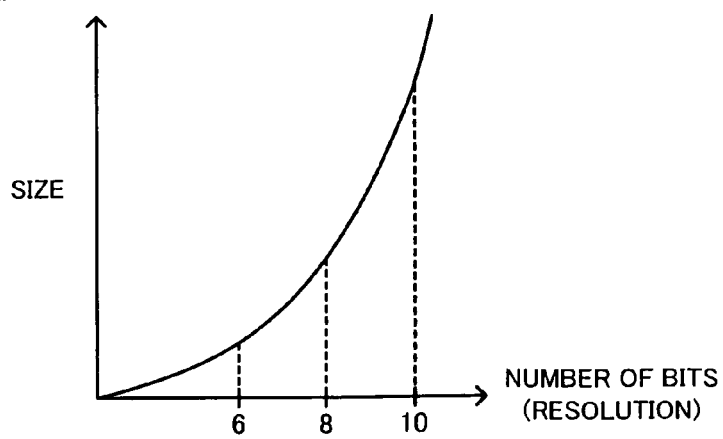

FIG. 6A  SINGLE-STAGE AMPLIFIER/SINGLE-STAGE DAC

| RESOLUTION (NUMBER OF BITS) | OUTPUT RANGE | DAC ACCURACY (1LSB-EQUIVALENT VOLTAGE) |
|---|---|---|
| 15 BITS | 3V | 93.75 μV |

FIG. 6B

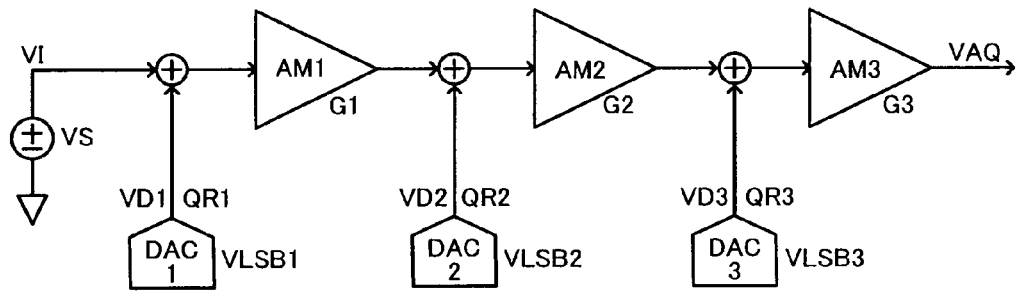

$VAQ = G1 \times G2 \times G3 \times VS + G1 \times G2 \times G3 \times VD1 + G2 \times G3 \times VD2 + G3 \times VD3$ $VS = -\left(VD1 + \dfrac{VD2}{G1} + \dfrac{VD3}{G1 \times G2}\right)$

FIG. 6C  MULTI-STAGE AMPLIFIER/MULTI-STAGE DAC

| DAC | RESOLUTION (NUMBER OF BITS) | OUTPUT RANGE | DAC ACCURACY (1LSB-EQUIVALENT VOLTAGE) |
|---|---|---|---|
| DAC1 | 5 | 3V (QR1) | 96mV (VLSB1) |
| DAC2 | 5 | 0.384V (QR2) | 12mV (VLSB2) |
| DAC3 | 5 | 48mV (QR3) | 1.5mV (VLSB3) |

G1=4, G2=4, G3=2

QR1 > QR2 > QR3

VLSB1 > VLSB2 > VLSB3

$$DV3 = \frac{ADQ}{G3}$$

$$DA3 = -\text{Round}\left(\frac{DV3}{VLSB3}\right)$$

$$DV2 = \frac{ADQ}{G2 \times G3}$$

$$DA2 = -\text{Round}\left(\frac{DV2}{VLSB2}\right) \quad DA3 = -\text{Round}\left(\frac{DV3 + RER2 \times G2}{VLSB3}\right)$$

RER2: ROUNDING ERROR DUE TO DAC2

$$DV1 = \frac{ADQ}{G1 \times G2 \times G3}$$

INTEGRATED CIRCUIT DEVICE AND ELECTRONIC INSTRUMENT

Japanese Patent Application No. 2008-40161 filed on Feb. 21, 2008, is hereby incorporated by reference in its entirety.

BACKGROUND

The present invention relates to an integrated circuit device, an electronic instrument, and the like.

In order to implement a ubiquitous network society, a sensor network that is formed by connecting a plurality of sensors through a network and acquires information from each sensor to comprehensively determine the situation is necessary. Such a sensor network utilizes various sensors such as a temperature sensor, a smoke sensor, an optical sensor, a human detection sensor, a pressure sensor, a biosensor, and a gyrosensor. A sensor detection signal varies in amplitude, DC offset, frequency band, and the like corresponding to the type of sensor.

Since the sensor detection signal (sensor signal) is an analog signal, the analog sensor detection signal must be converted into digital data in order to analyze and determine information using a CPU or the like. For example, JP-A-2007-117586 and JP-A-2007-285745 disclose A/D converters that convert an analog detection signal output from a sensor into digital data.

However, an integrated circuit device (IC) that includes such an A/D converter has been generally developed as a sensor-specific integrated circuit device. Therefore, when a new sensor has been developed, an integrated circuit device for the new sensor must be developed and produced by way of trial. This process is very expensive. In this case, a general-purpose integrated circuit device may be used. However, since a sensor detection signal varies in amplitude and DC offset corresponding to the type of sensor, it is substantially impossible to deal with a new sensor using a general-purpose integrated circuit device. Therefore, the user cannot easily produce an integrated circuit device for various sensors by way of trial.

In order to deal with various sensors, it is desirable that the offset and the gain of a sensor detection signal that varies in amplitude and DC offset corresponding to the type of sensor be adjusted arbitrarily.

However, when implementing such an offset adjustment and the like using a single-stage amplifier and a single-stage D/A converter provided corresponding to the single-stage amplifier, the size of the D/A converter increases, or the response speed decreases, for example.

SUMMARY

According to one aspect of the invention, there is provided an integrated circuit device comprising:

an amplifier circuit that includes first to Nth (N is an integer equal to or larger than two) amplifiers and receives an input signal, the first to Nth amplifiers being cascaded;

an A/D converter that performs an A/D conversion process on a signal amplified by the amplifier circuit;

first to Nth D/A converters that are provided corresponding to the first to Nth amplifiers and used to perform an offset adjustment of the first to Nth amplifiers; and a control circuit that sets an offset adjustment of the first to Nth amplifiers using the first to Nth D/A converters and sets a gain adjustment of the first to Nth amplifiers.

According to anther aspect of the invention, there is provided an electronic instrument comprising the above integrated circuit device.

BRIEF DESCRIPTION OF THE DRAWINGS

FIG. 3 is a view illustrative of a method that increases the A/D conversion dynamic range.

FIGS. 5A to 5D are views illustrative of the advantages of a multi-stage amplifier/multi-stage D/A configuration.

FIGS. 6A to 6C are views illustrative of the advantages of a multi-stage amplifier/multi-stage D/A configuration.

DESCRIPTION OF EXEMPLARY EMBODIMENTS

Figure 1:
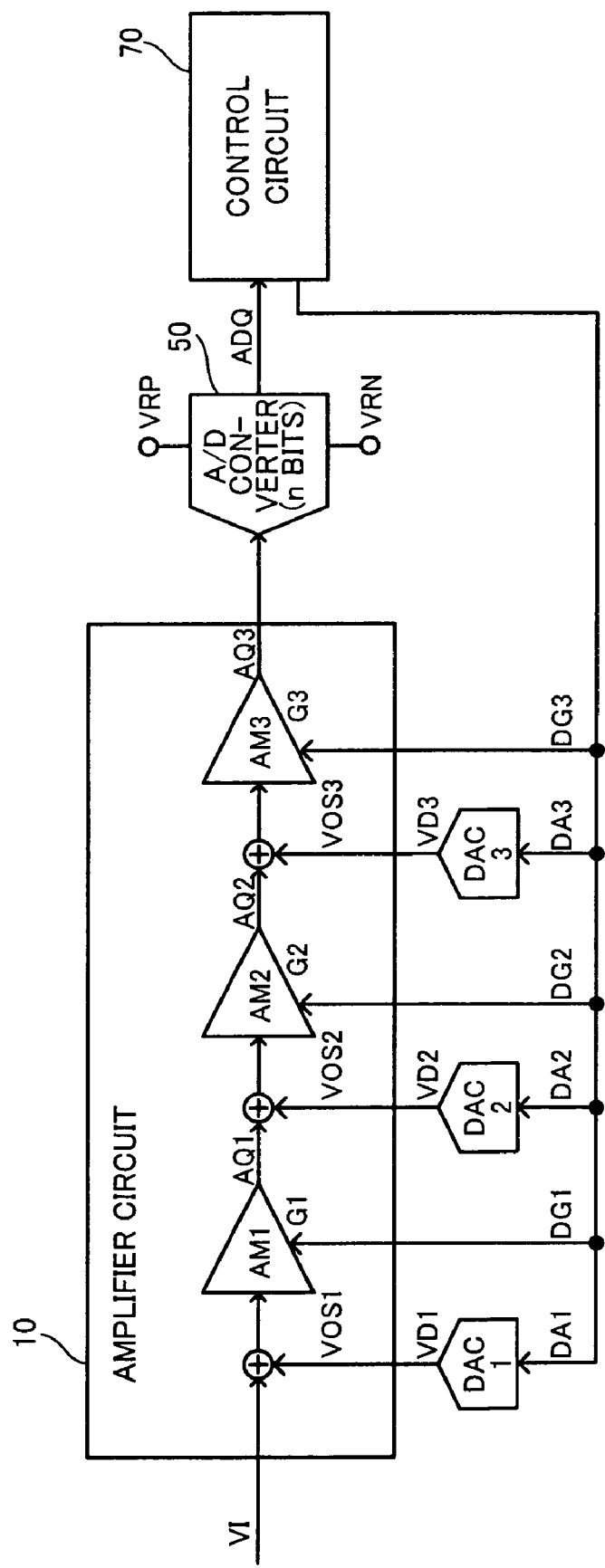
FIG. 1 shows a configuration example of an integrated circuit device according to one embodiment of the invention.

Several aspects of the invention may provide an integrated circuit device that implements an accurate offset adjustment and the like while suppressing an increase in circuit scale, an electronic instrument including the same, and the like, According to one embodiment of the invention, there is provided an integrated circuit device comprising:

an amplifier circuit that includes first to Nth (N is an integer equal to or larger than two) amplifiers and receives an input signal, the first to Nth amplifiers being cascaded;

an A/D converter that performs an A/D conversion process on a signal amplified by the amplifier circuit;

first to Nth D/A converters that are provided corresponding to the first to Nth amplifiers and used to perform an offset adjustment of the first to Nth amplifiers; and a control circuit that sets an offset adjustment of the first to Nth amplifiers using the first to Nth D/A converters and sets a gain adjustment of the first to Nth amplifiers.

According to this embodiment, the first to Nth multi-stage D/A converters used to performed an offset adjustment are provided corresponding to the first to Nth amplifiers of the amplifier circuit. The control circuit sets an offset adjustment of the first to Nth amplifiers using the first to Nth D/A converters and a gain adjustment of the first to Nth amplifiers. According to this embodiment, an offset adjustment and a gain adjustment are implemented by utilizing the multi-stage amplifier/multi-stage DAC configuration. Therefore, an accurate offset adjustment and the like can be implemented while suppressing an increase in circuit scale as compared with the case of using a single-stage amplifier/single-stage D/A configuration.

In the integrated circuit device, an output range QR1 of an ith (i is an integer that satisfies $1 \leq i < N$) D/A converter among the first to Nth D/A converters may be wider than an output range QR2 of an (i+1)th D/A converter among the first to Nth D/A converters that is provided in a subsequent stage of the ith D/A converter.

When the output range QR1 of the ith D/A converter is set to be wider than the output range QR2 of the (i+1)th D/A converter, the DC offset and the like of the input signal can be roughly corrected by the ith D/A converter having a wide output range QR1, and an error value that has not been removed by correction can be corrected by the subsequent-stage (i+1)th D/A converter having a narrow output range QR2. This enables an efficient offset adjustment.

In the integrated circuit device, when a gain of an ith amplifier among the first to Nth amplifiers is referred to as G1 and a 1 LSB-equivalent voltage of the ith D/A converter is referred to as VLSB1, $QR2 \geq G1 \times VLSB1$ may be satisfied.

This prevents a situation in which an error value that has not been removed by the ith D/A converter is amplified by the ith amplifier and exceeds the output range QR2 of the (i+1)th D/A converter.

In the integrated circuit device, a 1 LSB-equivalent voltage VLSB1 of an ith (i is an integer that satisfies $1 \leq i < N$) D/A converter among the first to Nth D/A converters may be higher than a 1 LSB-equivalent voltage VLSB2 of an (i+1)th D/A converter among the first to Nth D/A converters that is provided in a subsequent stage of the ith D/A converter According to this configuration, an error value that has not been removed by the ith D/A converter can be removed by the subsequent-stage (i+1)th D/A converter that has a 1 LSB-equivalent voltage lower than (i.e., a D/A conversion accuracy higher than) that of the ith D/A converter. Therefore, a more accurate offset adjustment and the like can be implemented.

In the integrated circuit device may further comprise:

first to Nth offset adjustment registers that are provided corresponding to the first to Nth amplifiers and store first to Nth offset adjustment data, the first to Nth offset adjustment data being used to perform an offset adjustment of the first to Nth amplifiers; and first to Nth gain adjustment registers that are provided corresponding to the first to Nth amplifiers and store first to Nth gain adjustment data, the first to Nth gain adjustment data being used to perform a gain adjustment of the first to Nth amplifiers.

According to this configuration, an offset adjustment of the first to Nth amplifiers can be implemented by setting the first to Nth offset adjustment data in the first to Nth offset adjustment registers, or a gain adjustment of the first to Nth amplifiers can be implemented by setting the first to Nth gain adjustment data in the first to Nth gain adjustment registers.

In the integrated circuit device, the control circuit may calculate the first to Nth offset adjustment data based on gains of the first to Nth amplifiers, and may set the first to Nth offset adjustment data in the first to Nth offset adjustment registers when performing signal offset calibration of the input signal.

According to this configuration, even when the first to Nth amplifiers are set at various gains, an offset adjustment that reflects the set gains can be implemented.

In the integrated circuit device, the control circuit may calculate (i+1)th (i is an integer that satisfies $1 \leq i < N$) offset adjustment data among the first to Nth offset adjustment data based on a rounding error value and a gain of an ith amplifier among the first to Nth amplifiers, and may set the (i+1)th offset adjustment data in an (i+1)th offset adjustment register among the first to Nth offset adjustment registers, the rounding error value being due to a rounding calculation process that calculates ith offset adjustment data among the first to Nth offset adjustment data.

According to this configuration, since the rounding error value due to the rounding calculation process that calculates the ith offset adjustment data can be reflected in the (i+1)th offset adjustment data and set in the (i+1)th offset adjustment register, the signal offset calibration accuracy can be improved.

In the integrated circuit device, the control circuit may set the gains of the first to Nth amplifiers at gains under a first gain condition, may calculate signal offset value data of the input signal, the control circuit may set the gains of the first to Nth amplifiers at gains under a second gain condition, and again may calculate the signal offset value data of the input signal, the gains under the second gain condition may be set to be higher than the gains under the first gain condition.

The measurement accuracy can be further improved by again measuring the signal offset value data while changing the gain condition.

In the integrated circuit device may further comprise:

a selector that selects an output signal among output signals from the first to Nth amplifiers, and outputs the selected output signal to the A/D converter as a selector output signal; and a determination circuit that determines whether or not a voltage of the output signal from each of the first to Nth amplifiers is within a determination voltage range specified by a high-potential-side determination voltage and a low-potential-side determination voltage, the control circuit may instruct the selector to select an output signal among the output signals from the first to Nth amplifiers based on a determination result of the determination circuit.

According to this configuration, an output signal of which the voltage is within the determination voltage range can be selected from the output signals from the first to Nth amplifiers, and subjected to A/D conversion. Therefore, an integrated circuit device that can subject the input signal to A/D conversion with a wide dynamic range can be provided.

In the integrated circuit device, the control circuit may instruct the selector to select an output signal from a (j−1)th (j is an integer that satisfies 1<j≦N) amplifier among the first to Nth amplifiers when the determination circuit has determined that a voltage of an output signal from a jth amplifier among the first to Nth amplifiers is not within the determination voltage range.

According to this configuration, whether or not to select the output signal from the (j−1)th amplifier can be determined by determining whether or not the voltage of the output signal from the jth amplifier is within the determination voltage range.

In the integrated circuit device, the control circuit may instruct the selector to select an output signal from a (j−1)th (j is an integer that satisfies 1<j≦N) amplifier among the first to Nth amplifiers when the determination circuit has determined that a voltage of a signal input to a jth amplifier among the first to Nth amplifiers is not within a jth determination voltage range that is set corresponding to a gain of the jth amplifier.

According to this configuration, whether or not to select the output signal from the (j−1)th amplifier can be determined by determining whether or not the voltage of the input signal input to the jth amplifier is within the determination voltage range. Therefore, since the signal delay time of the jth amplifier does not affect the determination time, a quick response can be implemented.

In the integrated circuit device, the determination circuit may include first to Nth comparators that compare the voltages of the output signals from the first to Nth amplifiers with the high-potential-side determination voltage and the low-potential-side determination voltage.

According to this configuration, whether or not the voltage of the output signal is within the determination voltage range can be determined using the comparator.

In the integrated circuit device, the control circuit may perform a different calculation process on digital data from the A/D converter corresponding to an output signal selected by the selector from the output signals from the first to Nth amplifiers.

According to this configuration, an appropriate calculation process corresponding to the selection state of the selector can be performed on the digital data output from the A/D converter. Therefore, digital data that can be easily handled by a system in the subsequent stage can be output, for example.

In the integrated circuit device, the control circuit may multiply the digital data from the A/D converter by a multiplication coefficient that corresponds to a reciprocal of a total gain of the first amplifier to a (j−1)th (j is an integer that satisfies 1<j≦N) amplifier among the first to Nth amplifiers when the selector has selected an output signal from the (j−1)th amplifier.

This implements a multiplication process that recovers the original voltage level of the signal that has been gain-adjusted by the first to (j−1)th amplifiers.

In the integrated circuit device, the control circuit may perform a calculation process based on n-bit (n is an integer equal to or larger than two) digital data from the A/D converter, and may output m-bit (m is an integer larger than n) digital data when a resolution of the A/D converter is n bits.

According to this configuration, digital data that indicates a correct A/D conversion voltage level can be transmitted to the subsequent stage even when performing a gain adjustment or the like using the amplifier.

In the integrated circuit device, the control circuit may shift a bit string the number of bits that is determined corresponding to an output signal selected by the selector from the output signals from the first to Nth amplifiers, the bit string being included in the m-bit digital data and indicates an absolute value by.

This implements a bit-shift process that recovers the original voltage level of the signal that has been gain-adjusted by the amplifier.

In the integrated circuit device, the first to Nth amplifiers may be cascaded inverting amplifiers; and the control circuit may set a sign bit of the m-bit digital data corresponding to an output signal selected by the selector from the output signals from the first to Nth amplifiers.

According to this configuration, since an appropriate sign bit is set corresponding to an output signal selected by the selector from the output signals from the amplifiers, consistent digital data with a sign bit can be transmitted to the subsequent stage.

According to anther embodiment of the invention, there is provided an electronic instrument comprising one of the above integrated circuit devices Preferred embodiments of the invention are described in detail below. Note that the following embodiments do not in any way limit the scope of the invention defined by the claims laid out herein. Note that all elements of the following embodiments should not necessarily be taken as essential requirements for the invention.

1. Integrated Circuit Device

FIG. 1 shows a configuration example of an integrated circuit device according to one embodiment of the invention. The integrated circuit device (analog front-end circuit) includes an amplifier circuit 10, an A/D converter 50, and a control circuit 70. The integrated circuit device also includes multi-stage D/A converters DAC1 to DAC3. Note that the integrated circuit device according to this embodiment is not limited to the configuration shown in FIG. 1. Various modifications may be made such as omitting some of the elements or adding other elements (e.g., filter).

The amplifier circuit 10 includes a plurality of amplifiers AM1 to AM3 (first to Nth amplifiers in a broad sense; N is an integer equal to or larger than two). The amplifier circuit 10 receives an input signal VI, and amplifies the input signal VI. The amplifiers AM1 to AM3 are cascaded, for example. Specifically, the amplifier AM1 receives the input signal VI from a sensor or the like, and outputs an output signal AQ1 to the amplifier AM2. The amplifier AM2 receives the output signal AQ1 from the amplifier AM1, and outputs an output signal AQ2 to the amplifier AM3. The amplifier AM3 receives the output signal AQ2 from the amplifier AM2, and outputs an output signal AQ3 to the A/D converter 50, for example. Note that the number of stages of amplifiers included in the amplifier circuit 10 is not limited to three. Various modifications may be made such as changing the number of stages of amplifiers to two or four or more, for example.

The D/A converters DAC1 to DAC3 (first to Nth D/A converters in a broad sense) are provided corresponding to the amplifiers AM1 to AM3. The D/A converters DAC1 to DAC3 perform an offset adjustment (amplifier offset adjustment or signal offset adjustment) based on offset adjustment data DA1 to DA3, respectively.

Specifically, the D/A converter DAC1 outputs a voltage VD1 corresponding to the offset adjustment data DA1. An offset adjustment of the amplifier AM1 is implemented by adding the voltage VD1 output from the D/A converter DAC1 to the voltage of the input signal VI. This makes it possible to cancel an offset voltage VOS1 of an operational amplifier of the amplifier AM1, or cancel the DC offset of the input signal VI. Likewise, the D/A converters DAC2 and DAC3 output voltages VD2 and VD3 corresponding to the offset adjustment data DA2 and DA3, respectively. An offset adjustment of the amplifiers AM2 and AM3 is implemented by adding the voltages VD2 and VD3 output from the D/A converters DAC2 and DAC3 to the voltages of the output signals AQ1 and AQ2 from the amplifiers AM1 and AM2, respectively. This makes it possible to cancel offset voltages VOS2 and VOS3 of operational amplifiers of the amplifiers AM2 and AM3, or cancel the DC offset of the input signal VI. A D/A converter using a ladder resistor circuit or the like may be used as the D/A converters DAC1 to DAC3. Specifically, a D/A converter that includes a ladder resistor circuit and an operational amplifier provided in the subsequent stage of the ladder resistor circuit may be used as the D/A converters DAC1 to DAC3.

The gains G1 to G3 of the amplifiers AM1 to AM3 are adjusted based on gain adjustment data DG1 to DG3, respectively. Specifically, the gains G1 to G3 of the amplifiers AM1 to AM3 are adjusted by adjusting the resistances of resistors (element values of passive elements) included in the amplifiers AM1 to AM3 based on the gain adjustment data DG1 to DG3, for example. This makes it possible to implement a gain adjustment corresponding to the amplitude of the input signal VI.

In FIG. 1, the D/A converters DAC1 to DAC3 are provided corresponding to all of the amplifiers AM1 to AM3 included in the amplifier circuit 10. Note that the D/A converters may be provided corresponding to only some (e.g., two stages) of the amplifiers AM1 to AM3.

The A/D converter 50 performs an A/D conversion process on a signal amplified by the amplifier circuit 10. Specifically, a high-potential-side reference voltage VRP and a low-potential-side reference voltage VRN that specify (set) the input voltage range of the A/D converter 50 are supplied to the A/D converter 50. The A/D converter 50 performs the A/D conversion process at a resolution of n bits (e.g., n=10) in the input voltage range specified by the high-potential-side reference voltage VRP and the low-potential-side reference voltage VRN, and outputs digital data ADQ (digital output value) obtained by the A/D conversion process. For example, the A/D converter 50 samples/holds the signal AQ3 output from the amplifier circuit 10 using an A/D conversion sampling clock signal, and performs the A/D conversion process on the sampled/held signal. Note that a prefilter such as an RC filter or a switched capacitor filter (SCF) may be provided in the preceding stage of the A/D converter 50 (i.e., between the A/D converter and the amplifier circuit).

A successive approximation type A/D converter may be used as the A/D converter 50, for example. In this case, the A/D converter 50 may include a sample-hold circuit, a comparator, a successive approximation register, and a D/A converter (not shown). The comparator compares an analog signal obtained by a D/A conversion process and output from the D/A converter with a sampled/held signal output from the sample-hold circuit. The successive approximation register stores data relating to an output signal from the comparator.

The D/A converter performs a D/A conversion process on the digital data output from the successive approximation register, and outputs the resulting analog signal. Note that the A/D converter 50 is not limited to the successive approximation type A/D converter, but may be a parallel comparison type A/D converter, a servo-balancing type A/D converter, or the like.

The control circuit 70 (control section, processing section, or calculation section) controls each circuit of the integrated circuit device. The control circuit 70 may be implemented by a logic circuit (e.g., gate array), a processor (e.g., CPU), or the like.

Specifically, the control circuit 70 sets an offset adjustment and a gain adjustment of the amplifier circuit 10. Specifically, the control circuit 70 sets an offset adjustment of the amplifiers AM1 to AM3 using the D/A converters DAC1 to DAC3, and sets a gain adjustment of the amplifiers AM1 to AM3. For example, when a filter having a variable cut-off frequency (e.g., switched-capacitor filter) is provided between the amplifier circuit 10 and the A/D converter 50, the control circuit 70 may set the cut-off frequency of the filter.

An offset adjustment may be set by inputting the offset adjustment data DA1 to DA3 to the D/A converters DAC1 to DAC3. A gain adjustment may be set by adjusting the resistances (element values) of the resistors (passive elements) included in the amplifiers AM1 to AM3 using the gain adjustment data GA1 to GA3.

Specifically, the control circuit 70 calculates the offset adjustment data DA1 to DA3 (first to Nth offset adjustment data) based on the gains of the amplifiers AM1 to AM3 (first to Nth amplifiers) during signal offset calibration of the input signal VI. More specifically, the control circuit 70 calculates the offset adjustment data DA2 ((i+1)th offset adjustment data) based on a rounding error value due to a rounding calculation process that calculates the offset adjustment data DA1 (ith offset adjustment data) among the offset adjustment data DA1 to DA3 and the gain G1 of the amplifier AM1 (ith amplifier), for example.

Figure 2A:
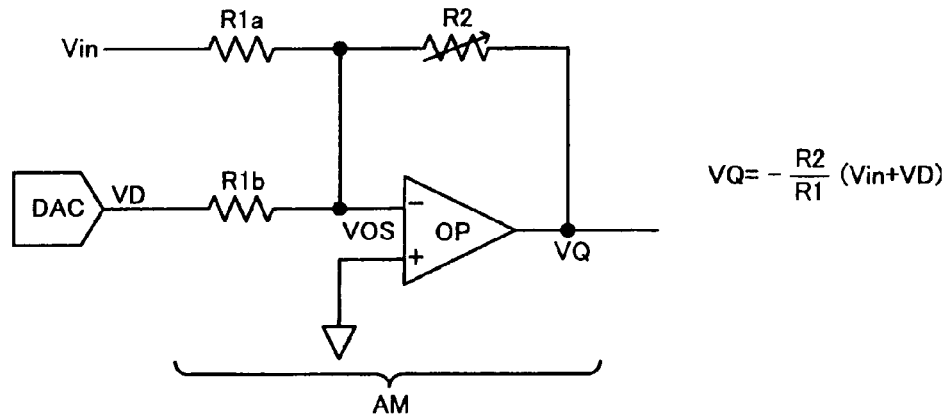
FIGS. 2A to 2C show connection configuration examples of an amplifier and a D/A converter.
Figure 2B:
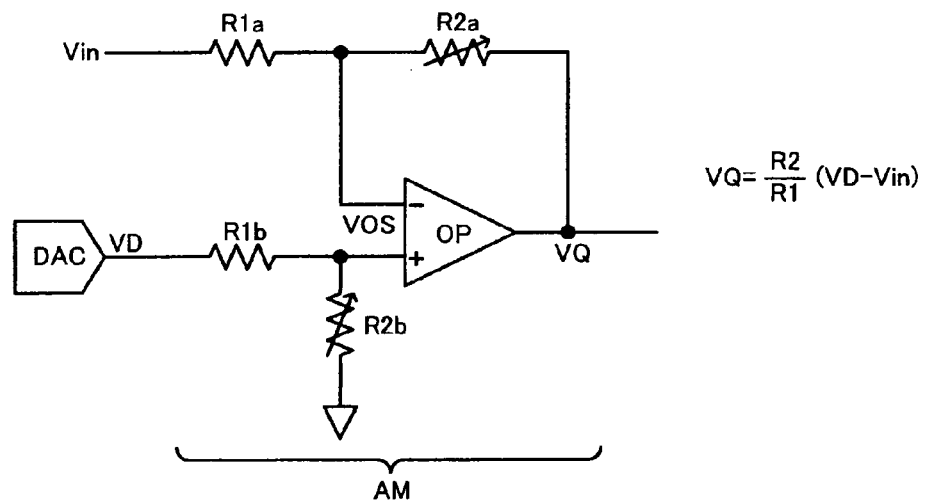
Figure 2C:
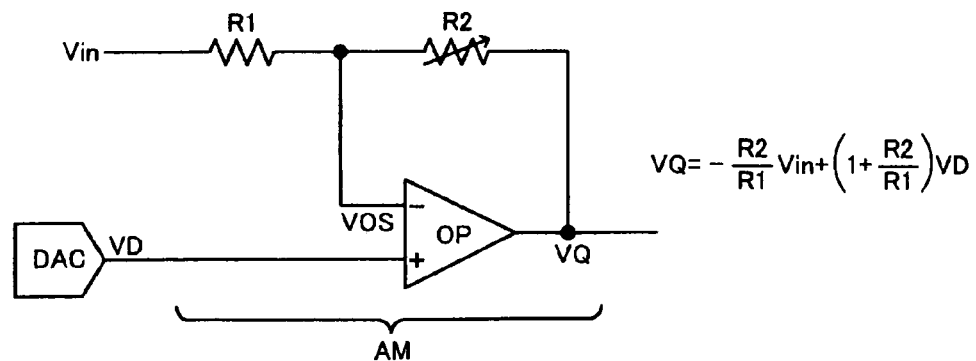

FIGS. 2A to 2C show specific connection configuration examples of the amplifier AM (AM1 to AM3) and the D/A converter DAC (DAC1 to DAC3) provided corresponding to the amplifier AM.

The amplifier AM shown in FIG. 2A includes an operational amplifier OP and resistors R1$a$, R1$b$, and R2. The resistor R1$a$ is provided between an input node of the input signal Vin and an inverting input terminal node of the operational amplifier OP. The resistor R1$b$ is provided between an input node of the output voltage VD from the D/A converter DAC and the inverting input terminal node of the operational amplifier OP. The variable resistor R2 is provided between an output terminal node and the inverting input terminal node of the operational amplifier OP. When the resistances of the resistors R1$a$ and R1$b$ are referred to as R1 and the resistance of the resistor R2 is referred to as R2, the gain of the amplifier AM shown in FIG. 2A is expressed by $-R2/R1$, and the output voltage is expressed by $VQ=-(R2/R1)\times(Vin+VD)$.

In the amplifier AM shown in FIG. 2B, the resistor R1$b$ is provided between the input node of the output voltage VD from the D/A converter DAC and a non-inverting input terminal node of the operational amplifier OPT and a resistor R2$b$ is provided between the non-inverting input terminal node of the operational amplifier OP and a low-potential-side power supply (AGND), differing from FIG. 2A. When the resistances of the resistors R2$a$ and R1$b$ are referred to as R2, the gain of the amplifier AM shown in FIG. 2B is expressed by $R2/R1$, and the output voltage is expressed by $VQ=(R2/R1)\times(VD-Vin)$.

In the amplifier AM shown in FIG. 2C, the resistor R1b is not provided so that the output voltage VD from the D/A converter DAC is input to the non-inverting input terminal node of the operational amplifier OP, differing from FIG. 2A. Note that the output voltage VD from the D/A converter DAC may be input to the inverting input terminal node of the operational amplifier OP, and the non-inverting input terminal of the operational amplifier OP may be connected to the low-potential-side power supply (AGND). The gain of the amplifier AM shown in FIG. 2C with respect to the input signal Vin is expressed by −R2/R1, the gain of the amplifier AM shown in FIG. 2C with respect to the output voltage VD is expressed by (1+R2/R1), and the output voltage is expressed by VQ=−(R2/R1)×Vin+(1+R2/R1)×VD.

As shown in FIGS. 2A to 2C, the gain of the amplifier AM can be adjusted by setting the resistance ratio R2/R1 based on the gain adjustment data. Moreover, an offset adjustment that cancels the offset voltage VOS between the non-inverting input terminal and the inverting input terminal of the operational amplifier OP and the like can be implemented by setting the output voltage VD of the D/A converter DAC based on the offset adjustment data.

In this embodiment, a plurality of amplifiers AM1 to AM3 are provided in the amplifier circuit 10, and a plurality of D/A converters DAC1 to DAC3 are provided corresponding to the amplifiers AM1 to AM3. Specifically, the integrated circuit device has a multi-stage amplifier/multi-stage DAC configuration.

According to this embodiment that employs such a configuration, an offset adjustment that cancels the offset voltages of the amplifiers AM1 to AM3, a DC offset of the input signal VI, and the like can be implemented while suppressing an increase in the circuit scale of the D/A converters DAC1 to DAC3. Specifically, an accurate offset adjustment can be implemented with a small circuit configuration as compared with a single-stage amplifier/single-stage DAC configuration.

According to this embodiment, a signal within an optimum voltage range can be input to the A/D converter 50 even if the input signal VI that varies in DC offset and amplitude is input. Therefore, the dynamic range of the A/D converter can be increased.

For example, since the DC offset, amplitude, and the like of an input signal utilized in a related-art integrated circuit device that includes an A/D converter have been determined to a certain extent corresponding to the specification and the like, it suffices that the A/D converter perform an A/D conversion process within an input voltage range corresponding to the specification.

However, when performing an A/D conversion process on a detection signal output from a sensor (sensor device) or the like, the DC offset of the input signal VI (detection signal) varies corresponding to the type of sensor, as indicated by A1 and A2 in FIG. 3. The amplitude of the input signal VI also varies corresponding to the type of sensor, as indicated by A3 and A4. Therefore, when performing an A/D conversion process on such an input signal VI, the dynamic range cannot be increased without increasing the A/D conversion resolution, as indicated by B1 in FIG. 4. Specifically, the number of bits of the A/D conversion resolution has been usually increased in order to absorb a change in DC offset, amplitude, and the like of the input signal. However, an increase in the number of bits of the A/D conversion resolution results in an increase in circuit scale, power consumption, and the like. Moreover, design becomes complicated.

According to this embodiment, since the multi-stage amplifiers AM1 to AM3, the multi-stage D/A converters DAC1 to DAC3, and offset adjustment registers RA1 to RA3 corresponding to the multi-stage amplifiers AM1 to AM3 are provided, the DC offset of the input signal VI can be accurately adjusted with a small circuit configuration. Therefore, even if the DC offset of the input signal VI has changed as indicated by A1 and A2 in FIG. 3, an offset adjustment that sets the amplitude center (DC offset) of the signal input to the A/D converter 50 at the center of the input voltage range (VRP to VRN) of the A/D converter 50 can be implemented. This significantly increases the dynamic range.

According to this embodiment, since a gain adjustment can be implemented using the multi-stage amplifiers AM1 to AM3, the gain of the amplitude of the input signal VI can be accurately adjusted using a small circuit. Therefore, even if the amplitude of the input signal VI has changed as indicated by A3 and A4 in FIG. 3, the A/D input amplitude (swing level) (i.e., the amplitude of the signal input to the A/D converter 50) can be made almost constant (see A5) irrespective of the amplitude of the input signal VI. This further increases the dynamic range.

For example, when the A/D input amplitude (maximum input amplitude) of the A/D converter is referred to as VAT and the voltage corresponding to the least significant bit (1 LSB) of the A/D converter is referred to as VLSB, the dynamic range DR can be expressed by DR=VAT/VLSB.

According to related-art technology, when the amplitude of the input signal VI is small (see A3 in FIG. 3), the A/D input amplitude VAT also decreases. Therefore, in order to increase the dynamic range DR (=VAT/VLSB), it is necessary to increase the number of bits of the A/D conversion resolution to reduce the voltage VLSB (see B1 in FIG. 4). As a result, an increase in the dynamic range DR is limited.

Figure 4:
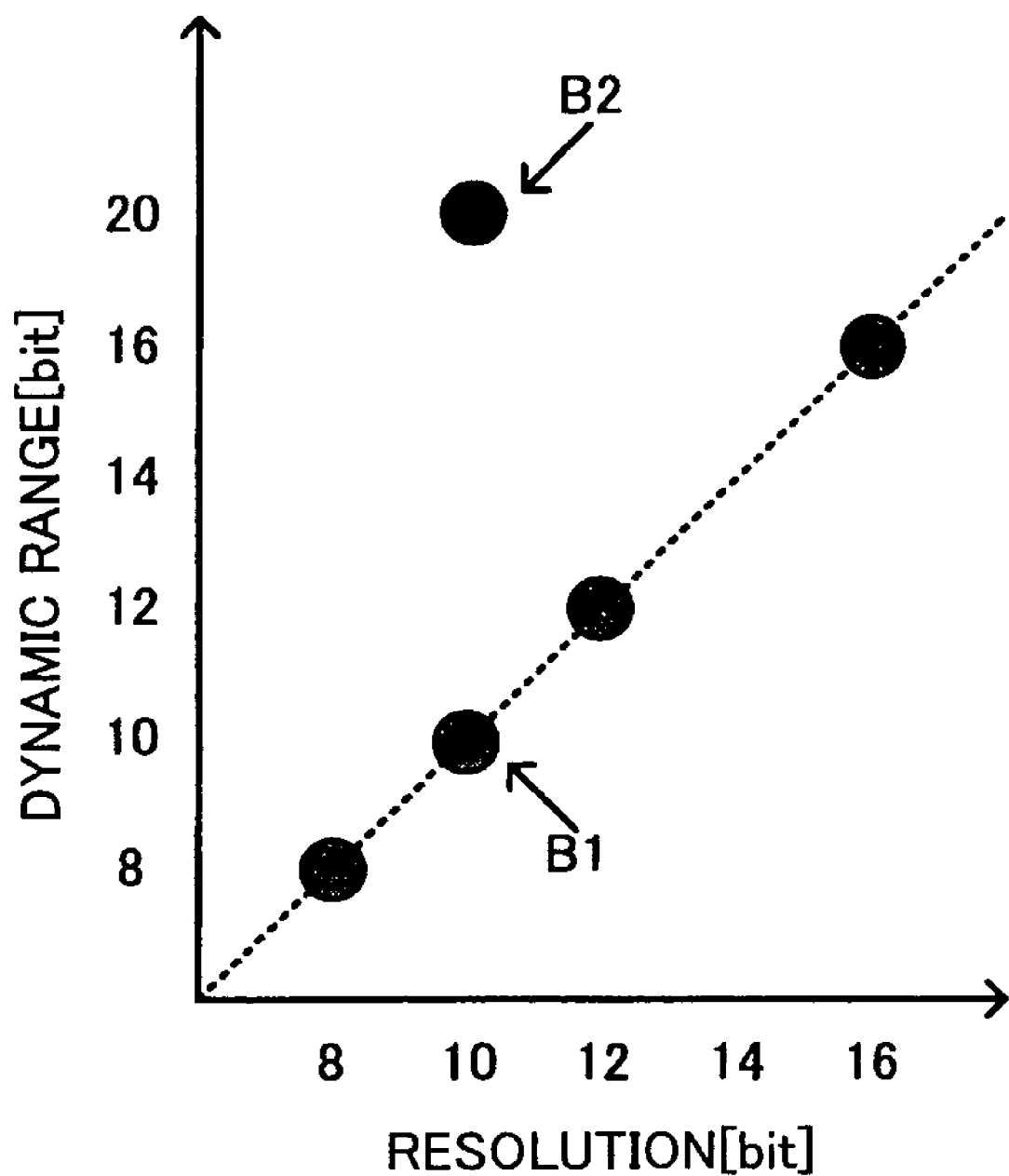
FIG. 4 is a view showing the relationship between a dynamic range and resolution.

According to this embodiment, even if the amplitude of the input signal VI has changed as indicated by A3 and A4 in FIG. 4, the A/D input amplitude can be maximized (see A5) by an automatic gain adjustment using the multi-stage amplifiers AM1 to AM3. Therefore, the dynamic range DR can be increased without changing the A/D conversion resolution (e.g., 10 bits) (see B2 in FIG. 4).

According to related-art technology, when the input signal VI has a DC offset (see A1 and A2 in FIG. 3), the output of the amplifier is easily saturated due to amplification of the input signal VI. Therefore, the gain of the amplifier cannot be increased so that the input signal VI cannot be amplified sufficiently. As a result, the input voltage range of the signal input to the A/D converter becomes narrower than the original dynamic range DR of the A/D converter so that the substantial dynamic range DR cannot be increased.

According to this embodiment, even if the input signal VI has a DC offset (see A1 and A2 in FIG. 3), the amplitude center of the signal input to the A/D converter 50 can be set at the center of the input voltage range of the A/D converter 50 by an offset adjustment using the multi-stage amplifiers AM1 to AM3 and the multi-stage D/A converters DAC1 to DAC3, for example. The A/D input amplitude can be maximized (see A5 in FIG. 3) by performing the above-described offset adjustment and gain adjustment. Therefore, the dynamic range DR can be increased without changing the A/D conversion resolution.

In the development/trial production stage of a new sensor, for example, the DC offsets the amplitude, and the like of a detection signal output from the sensor may be unknown. According to this embodiment, since an automatic offset adjustment and an automatic gain adjustment are performed on the input signal VI (i.e., detection signal output from the sensor), the user can connect the sensor to the integrated circuit device without taking much account of the DC offset, the amplitude, and the like of the detection signal. Therefore, an integrated circuit device (sensor measurement assistance IC) convenient to the user can be provided. Moreover, since it is unnecessary to produce a new integrated circuit device by way of trial corresponding to the type of sensor, the development cost can be reduced.

2. Multi-Stage Amplifier/Multi-Stage DAC Configuration

As shown in FIG. 1, this embodiment employs the multi-stage amplifier/multi-stage DAC configuration. The advantages of the multi-stage amplifier/multi-stage DAC configuration are described below.

As the configuration of the amplifier circuit, a configuration in which a high-pass filter (HPF) that includes a capacitor C and a resistor R is provided in the preceding stage of an amplifier AM (see FIG. 5A), or a single-stage amplifier/single-stage DAC configuration (see FIG. 5B) may be employed, for example.

In the configuration using the HPF (FIG. 5A), a DC component is cut off utilizing the HPF to cancel the DC offset. The configuration using the HPF achieves high accuracy, but results in a decrease in calibration response speed and an increase in size, as shown in FIG. 5C.

Specifically, the frequency band of the input signal VI (detection signal) from the sensor varies (e.g., within the range from 1 Hz to 16 KHz) corresponding to the type of sensor. For example, when the frequency of the input signal VI is 1 Hz, it is necessary to reduce the cut-off frequency of the HPF shown in FIG. 5A to a value (e.g., 0.1 Hz or less) sufficiently lower than 1 Hz so that the input signal VI having a frequency of 1 Hz to passes through.

However, since the cut-off frequency of the HPF is determined by the reciprocal of CR, it is necessary to increase the capacitance of the capacitor C and the resistance of the resistor R in order to reduce the cut-off frequency of the HPF. Therefore, the size of the capacitor C and the resistor R increases when setting the cut-off frequency at 0.1 Hz, for example. When the capacitor C and the resistor R are provided as external parts, convenience to the user is impaired. Moreover, it is difficult to variably set the capacitance and the resistance corresponding to the frequency band of the input signal VI. When the capacitance of the capacitor C and the resistance of the resistor R are increased, the calibration response speed decreases so that quick calibration cannot be implemented.

The single-stage amplifier/single-stage DAC configuration shown in FIG. 5B achieves a high calibration response speed, but results in an increase in size and a decrease in accuracy, as shown in FIG. 5C.

On the other hand, the multi-stage amplifier/multi-stage DAC configuration according to this embodiment has advantages over the configuration using the HPF and the single-stage amplifier/single-stage DAC configuration with regard to the calibration response speed, size, and accuracy. The details are described below.

For example, when canceling a DC offset VS (input offset) of the input signal VI using the single-stage amplifier/single-stage DAC configuration shown in FIG. 5B, the offset adjustment data DA may be set so that VD=−VS.

An output range QR required for the D/A converter DAC shown in FIG. 5B is almost equal to the DC offset VS of the input signal VI (e.g., about 3 V).

The D/A converter DAC is required to have an accuracy such that the A/D converter 51 does not produce an error. Therefore, when the 1 LSB-equivalent voltage (DAC accuracy) of the D/A converter DAC is referred to as VLSB, the 1 LSB-equivalent voltage (A/D accuracy) of the A/D converter 51 is referred to as ADLSB, and the gain of the amplifier AM is referred to as G, the relationship "VLSB≦ADLSB/G" is satisfied. Therefore, when ADLSB=0.003 V and G=32, VLSB≦0.003/32=93.75 µV.

The number k of bits required for the D/A converter DAC is determined by $2^k \geq QR/VLSB$. Therefore, when the output range QR of the D/A converter DAC is about 3 V, the number k of bits required for the D/A converter DAC is 15 (k=15) since $2^{15}$=32768≧3/(0.003/32)=32000.

Specifically, when using the single-stage amplifier/single-stage DAC configuration, a 15-bit DAC is required (see FIG. 6A). For example, since it is necessary to reduce the 1 LSB-equivalent voltage VLSB (DAC accuracy) as the accuracy of the A/U converter 51 increases (the 1 LSB-equivalent voltage ADLSB decreases), it is necessary to further increase the number of bits of the D/A converter DAC, as indicated by the relational expression "$2^k \geq QR/VLSB$".

However, the size of the D/A converter DAC increases exponentially with respect to the number of bits, as shown in FIG. 5D. Therefore, when the number of bits of the D/A converter DAC is set at 15, the size of the D/A converter DAC increases to a large extent. As a result, the size of the integrated circuit device also increases. Specifically, it is difficult to reduce the circuit scale while increasing the calibration accuracy when using the single-stage amplifier/single-stage DAC configuration.

In this embodiment, the multi-stage amplifier/multi-stage DAC configuration is employed, as shown in FIG. 6B. The DC offset of the input signal VI is referred to as VS, the gains of the amplifiers AM1 to AM3 are respectively referred to as G1 to G3, the output voltages of the D/A converters DAC1 to DAC3 are respectively referred to as VD1 to VD3, and the output voltage of the amplifier AM3 is referred to as VAQ. In this case, the relationship "VAQ=G1×G2×G3×VS+G1×G2×G3×VD1+G2×G3×VD2+G3×VD3" is satisfied.

Therefore, the DC offset VS of the input signal VI can be canceled by setting the output voltages VD1 to VD3 of the D/A converters DAC1 to DAC3 so that VS=−{VD1+VD2/G1+VD3/(G1×G2)} is satisfied.

When using the multi-stage amplifier/multi-stage DAC configuration shown in FIG. 6B, the output range QR1 of the D/A converter DAC1 may be set to be almost equal to the DC offset VS of the input signal VI (e.g., about 3 V). Specifically, most of the DC offset VS is corrected by the output voltage VD1 of the first-stage D/A converter DAC1, and an error value is corrected by the output voltages VD2 and VD3 of the subsequent-stage D/A converters DAC2 and DAC3.

When the 1 LSB-equivalent voltages (DAC accuracy) of the D/A converters DAC1, DAC2, and DAC3 are referred to as VLSB1, VLSB2, and VLSB3, the output range QR2 of the D/A converter DAC2 satisfies the relationship "QR2≧G1× VLSB1" (described in detail later). The output range QR3 of the D/A converter DAC3 satisfies the relationship "QR3≧G2×VLSB2".

For example, since the 1 LSB-equivalent voltage VLSB3 (accuracy) required for the D/A converter DAC3 is within a range such that the A/D converter 50 does not produce an error, the relationship "VLSB3≦ADLSB/G3" is satisfied when the 1 LSB-equivalent voltage of the A/D converter 50 is referred to as ADLSB.

The number k of bits required for the D/A converter DAC1 is determined by the relational expression "$2^k \geq QR1/VLSB1$". Likewise, the numbers k of bits required for the D/A converters DAC2 and DAC3 are respectively determined by the relational expressions "$2^k \geq QR2/VLSB2$" and "$2^k \geq QR3/VLSB3$".

Therefore, when the gains G1, G2, and G3 of the amplifiers AM1 to AM3 are 4, 4, and 2, respectively, the relationship shown in FIG. 6C is satisfied, for example.

Specifically, the output range QR1 of the D/A converter DAC1 is almost equal to the DC offset VS of the input signal VI (e.g., about 3 V). Therefore, when the number k of bits of the D/A converter DAC1 is five (k=5), the 1 LSB-equivalent voltage VLSB1 of the D/A converter DAC1 may be set at 96 mV (see FIG. 6C) based on the relational expression "$VLSB1=QR1/2^5$".

The output range QR2 and the 1 LSB-equivalent voltage VLSB2 of the D/A converter DAC2 satisfy the relationships "$QC2 \geq G1 \times VLSB1$" and "$VLSB2=QR2/2^5$". Therefore, the output range QR2 and the 1 LSB-equivalent voltage VLSB2 may be set so that $QR2=G1 \times VLSB1=4 \times 96$ mV=0.384 V and $VLSB2=QR2/2^5=0.384/2^5$ V=12 mV.

The output range QR2 and the 1 LSB-equivalent voltage VLSB3 of the D/A converter DAC3 satisfy the relationships "$QR3 \geq G2 \times VLSB2$" and "$VLSB3=QR3/2^5$". Therefore, the output range QR3 and the 1 LSB-equivalent voltage VLSB3 may be set so that $QR3=G2 \times VLSB2=4 \times 12$ mV=48 V and $VLSB3=QR3/2^5=48/2^5$ V=1.5 mV.

As is clear from the comparison between FIG. 6A and FIG. 6C, the single-stage amplifier/single-stage DAC configuration requires a DAC resolution of 15 bits while it suffices to provide three 5-bit D/A converters DAC1 to DAC3 when using the multi-stage amplifier/multi-stage DAC configuration, for example. As is clear from FIG. 5D, the circuit area of one 15-bit D/A converter DAC is significantly larger than the circuit area of the three 5-bit D/A converters DAC1 to DAC3. Therefore, the circuit scale can be significantly reduced by the multi-stage amplifier/multi-stage DAC configuration according to this embodiment as compared with the single-stage amplifier/single-stage DAC configuration.

According to the single-stage amplifier/single-stage DAC configuration shown in FIG. 6A, the 1 LSB-equivalent voltage VLSB (DAC accuracy) is 93.75 μV even though the number of bits of the D/A converter DAC is increased to 15. As a result, the offset calibration accuracy cannot be increased to a large extent.

According to the multi-stage amplifier/multi-stage DAC configuration shown in FIG. 6C, most of the DC offset VS is corrected by the first-stage D/A converter DAC1, and a correction error is corrected by the subsequent-stage D/A converters DAC2 and DAC3. Since the 1 LSB-equivalent voltage VLSB3 (DAC accuracy) of the D/A converter DAC3 is as small as 1.5 mV, accurate offset calibration can be implemented as compared with the single-stage amplifier/single-stage DAC configuration shown in FIG. 6A.

3. Method of Setting Output Range and 1 LSB-Equivalent Voltage of D/A Converter A method of setting the output range and the 1 LSB-equivalent voltage of the D/A converter according to this embodiment is described in detail below.

Figure 7A:
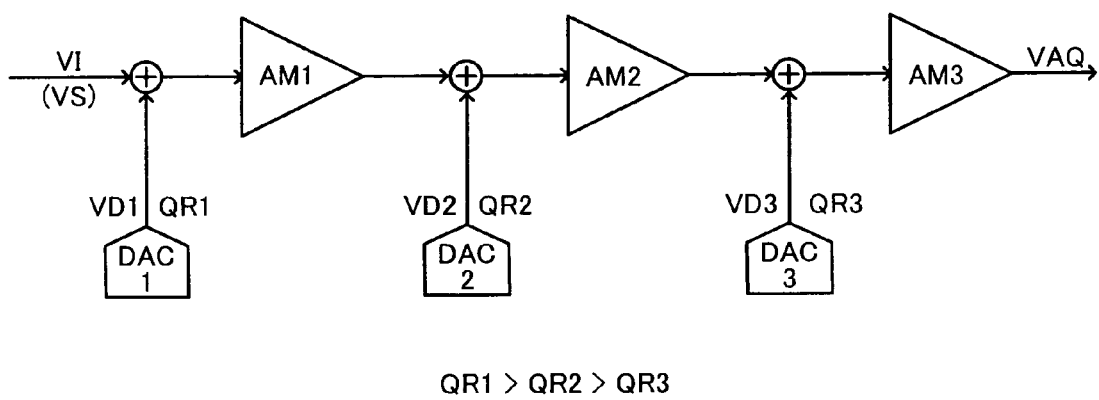
FIGS. 7A and 7B are views illustrative of a method of setting the output range and the 1 LSB-equivalent voltage of a D/A converter.

In FIG. 7A, the output range of the subsequent-stage D/A converter is set to be narrower than the output range of the preceding-stage D/A converter. The output range of the D/A converter DAC1 (ith D/A converter) among the D/A converters DAC1 to DAC3 (first to Nth D/A converters) is referred to as QR1, and the output range of the D/A converter DAC2 ((i+1)th D/A converter) in the subsequent stage of the D/A converter DAC1 is referred to as QR2. The output ranges of the D/A converters DAC1 and DAC2 are set so that the relationship "QR1>QR2" is satisfied. Likewise, the output ranges of the D/A converters DAC2 and DAC3 are set so that the relationship "QR2>QR3" is satisfied. Note that modifications may be made, such as setting the output ranges so that the relationships "QR1>QR2" and "QR2=QR3" are satisfied, or setting the output ranges so that the relationships "$^4QR1=QR2$" and "QR2>QR3" are satisfied.

Figure 7B:
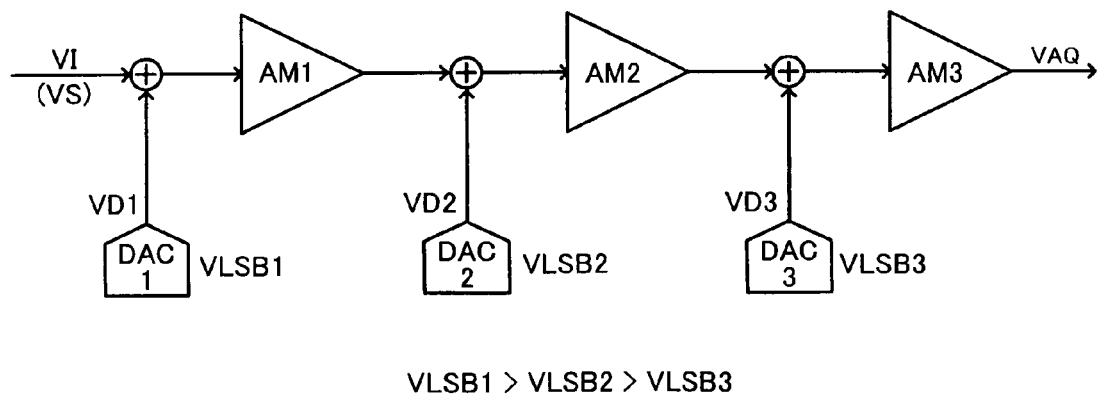

In FIG. 7B, the 1 LSB-equivalent voltage of the subsequent-stage D/A converter is set to be lower than the 1 LSB-equivalent voltage of the preceding-stage D/A converter. Specifically, when the 1 LSB-equivalent voltage of the D/A converter DAC1 (ith D/A converter) among the D/A converters DAC1 to DAC3 is referred to as VLSB1 and the 1 LSB-equivalent voltage of the D/A converter DAC2 ((i+1)th D/A converter) in the subsequent stage of the D/A converter DAC1 is referred to as VLSB2, the relationship "VLSB1>VLSB2" is satisfied. Likewise, the 1 LSB-equivalent voltages of the D/A converters DAC2 and DAC3 are set so that the relationship "VLSB2>VLSB3" is satisfied. Note that modifications may be made, such as setting the 1 LSB-equivalent voltages so that the relationships "VLSB1>VLSB2" and "VLSB2=VLSB3" are satisfied, or setting the 1 LSB-equivalent voltages so that the relationships "VLSB1=VLSB2" and "VLSB2>VLSB3" are satisfied.

Figure 8:
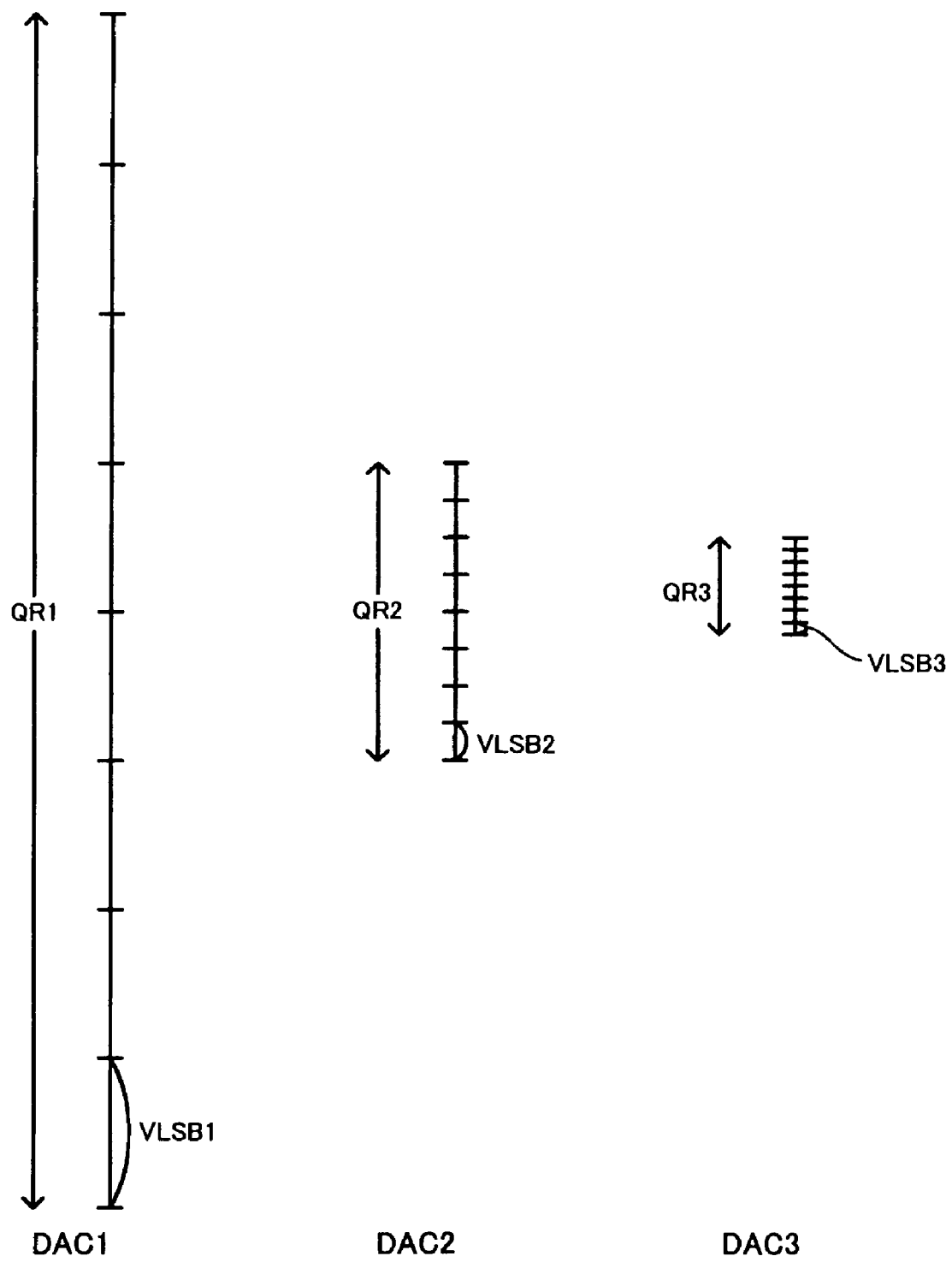
FIG. 8 is a view illustrative of a method of setting the output range and the 1 LSB-equivalent voltage of a D/A converter.

FIG. 8 is a view showing the details of the relationships shown in FIGS. 7A and 7B. As shown in FIG. 8, the output range QR1 of the preceding-stage D/A converter DAC1 is wider than the output range QR3 of the subsequent-stage D/A converter DAC3. The 1 LSB-equivalent voltage VLSB1 of the preceding-stage D/A converter DAC1 is higher than the 1 LSB-equivalent voltage VLSB3 of the subsequent-stage D/A converter DAC3.

When the output range QR1 of the D/A converter DAC1 is increased, as shown FIG. 7A, most of the DC offset VS of the input signal VI can be canceled by the output voltage VD1 of the D/A converter DAC1 by setting the output range QR1 of the D/A converter DAC1 to be almost equal to the range of the DC offset VS of the input signal VI, for example. Since most of the DC offset VS is canceled by the D/A converter DAC1, an error value that has not been removed by the D/A converter DAC1 can be removed by the output voltages VD2 and VD3 of the subsequent-stage D/A converters DAC2 and DAC3 without increasing the output ranges QR2 and QR3 of the subsequent-stage D/A converters DAC2 and DAC3 to a large extent. Specifically, the DC offset VS can be appropriately corrected by setting the output ranges so that the relationship "QR1>QR2>QR3" is satisfied.

The D/A converter DAC1 roughly corrects the DC offset VS, and accurate offset correction is implemented by the subsequent-stage D/A converters DAC2 and DAC3. Therefore, since the D/A converter DAC1 need not have high accuracy, the 1 LSB-equivalent voltage VLSB1 can be increased, as shown in FIG. 7B. On the other hand, the D/A converter DAC2 must accurately correct an error value that has not been removed by the D/A converter DAC1, and the D/A converter DAC3 must accurately correct an error value that has not been removed by the D/A converter DAC2. Therefore, the 1 LSB-equivalent voltages VLSB2 and VLSB3 are set to be lower than the 1 LSB-equivalent voltage VLSB1. Specifically, the DC offset VS can be accurately calibrated by setting the 1 LSB-equivalent voltages so that the relationship "VLSB1>VLSB2>VLSB3" is satisfied.

For example, when using the single-stage amplifier/single-stage DAC configuration shown in FIG. 5B, if the output range QR of the D/A converter DAC is increased in order to deal with the range of the DC offset VS and the 1 LSB-equivalent voltage of the D/A converter DAC is reduced in order to implement accurate calibration, the number of bits of the D/A converter DAC increases (see FIG. 6A) so that the circuit scale increases.

On the other hand, when the relationships "QR1>QR>QR3" and "VLSB1>VLSB2>VLSB3" are satisfied (see FIGS. 7A and 7B), the number of bits of the D/A converter DAC1 need not be increased to a large extent even if the output range QR of the D/A converter DAC is increased in order to deal with the range of the DC offset VS since the 1 LSB-equivalent voltage VLSB1 is high, as shown in FIG. 8. Therefore, the number of bits of the D/A converter DAC1 can be reduced (see FIG. 6C).

On the other hand, the number of bits of the D/A converter DAC3 need not be increased to a large extent even if the 1 LSB-equivalent voltage VLSB3 of the D/A converter DAC3 is reduced in order to implement accurate calibration since the output range VR3 of the D/A converter DAC3 is narrow, as shown in FIG. 8. Therefore, the number of bits of the D/A converter DAC3 can also be reduced (see FIG. 6C).

According to the method shown in FIGS. 7A and 7B, an increase in circuit scale can be prevented while increasing the calibration accuracy when calibrating the DC offset VS.

Figure 9:
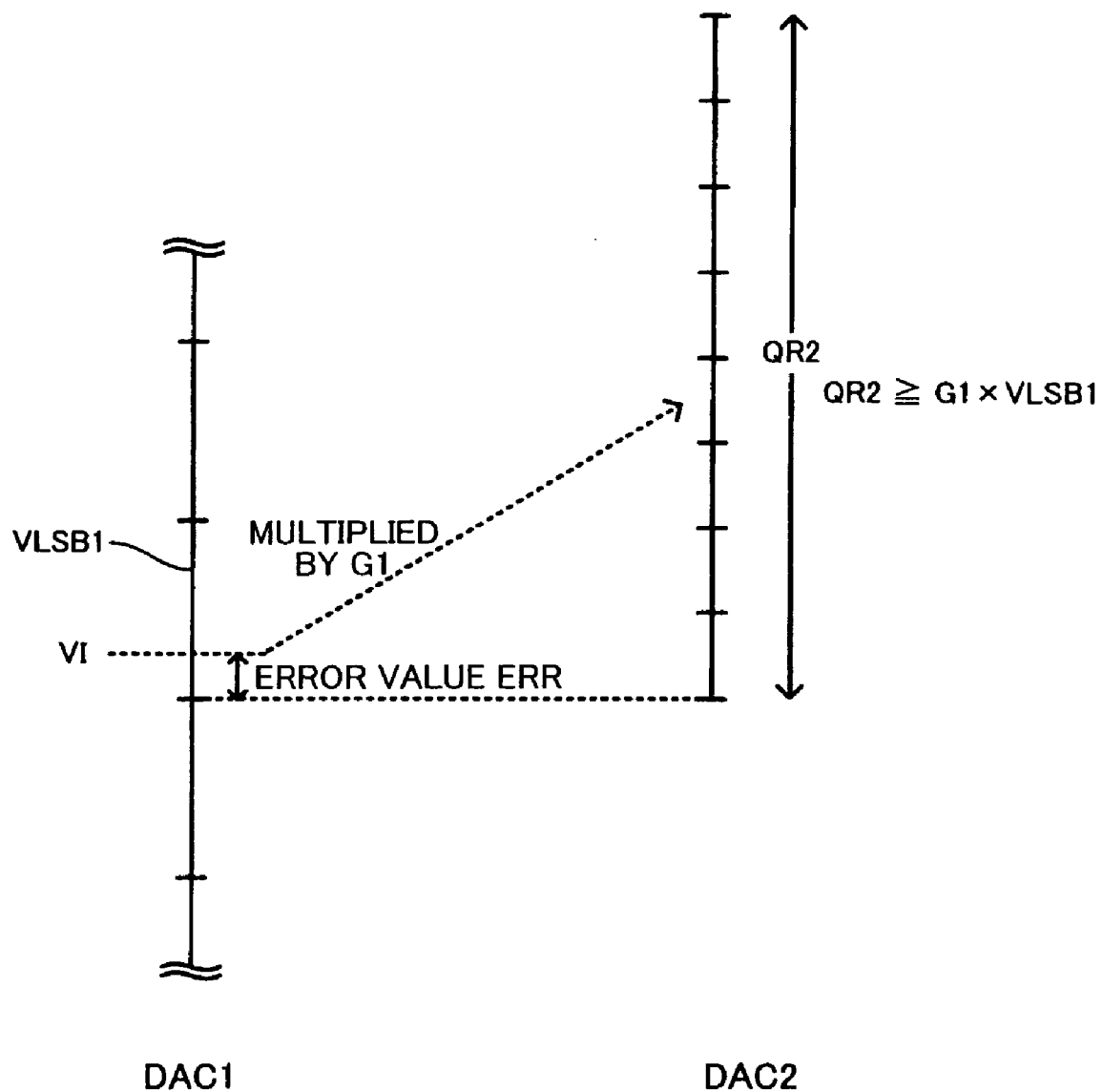
FIG. 9 is a view illustrative of a method of setting the output range and the 1 LSB-equivalent voltage of a D/A converter.

When the gain of the amplifier AM1 (ith amplifier) is referred to as G1 and the 1 LSB-equivalent voltage of the D/A converter DAC1 (ith D/A converter) is referred to as VLSB1, the relationship "QR2≧G1×VLSB1" is satisfied, as shown in FIG. 9. Likewise, when the gain of the amplifier AM2 is referred to as G2 and the 1 LSB-equivalent voltage of the D/A converter DAC2 is referred to as VLSB2, the relationship "QR3≧G2×VLSB2" is satisfied.

Specifically, an error value ERR that has not been removed by the D/A converter DAC1 must be removed by the D/A converter DAC2, as shown in FIG. 9. The error value ERR is amplified by the amplifier AM1 by a factor of G1. Therefore, the output range QR2 of the D/A converter DAC2 must be greater than G1×ERR. Specifically, the relationship "QR2≧G1×ERR" is satisfied.

Since the error value ERR is a quantization error of the D/A converter DAC1, the error value ERR is equal to or less than the 1 LSB-equivalent voltage VLSB1 of the D/A converter DAC1. Specifically, the relationship "ERR≦VLSB1" is satisfied. Therefore, the relationship "QR2≧G1×VLSB1" is satisfied from the relationships "QR2≧G1×ERR" and "ERR≦VLSB1". Likewise, the relationship "QR3≧G2×VLSB2" is satisfied. These relationships ensure that the error value that has not been removed by the preceding-stage D/A converter can be removed by the subsequent-stage D/A converter.

4. Offset Calibration

The details of offset calibration according to this embodiment are described below. In this embodiment, amplifier offset calibration that cancels the offset voltages of the amplifiers AM1 to AM3 is performed in a state in which a sensor or the like is not connected to the integrated circuit device. Signal offset calibration that adjusts the DC offset of the input signal VI is then performed in a state in which a sensor or the like is connected to the integrated circuit device.

In FIGS. 10A to 13, the offset adjustment registers RA1 to RA3 (first to Nth offset adjustment registers in a broad sense) are provided corresponding to the amplifiers AM1 to AM3 (first to Nth amplifiers). The offset adjustment registers RA1 to RA3 store the offset adjustment data DA1 to DA3 (first to Nth offset adjustment data in a broad sense). The offset adjustment data DA1 to DA3 is offset adjustment data for the amplifiers AM1 to AM3, and is respectively input to the D/A converters DAC1 to DAC3, for example. The offset adjustment registers RA1 to RA3 may be implemented by a flip-flop, a memory (RAM), or the like.

Gain adjustment registers RG1 to RG3 (first to Nth gain adjustment registers in a broad sense) are provided corresponding to the amplifiers AM1 to AM3. The gain adjustment registers RG1 to RG3 store the gain adjustment data DG1 to DG3 (first to Nth gain adjustment data in a broad sense). The gain adjustment data DG1 to DG3 adjusts the gains G1 to G3 of the amplifiers AM1 to AM3. The gain adjustment registers RG1 to RG3 may be implemented by a flip-flop, a memory, or the like.

Offset value storage sections RV1 to RV3 (first to Nth offset value storage sections in a broad sense) store offset value data DV1 to DV3 (first to Nth offset value data in a broad sense) that is offset value data relating to the amplifiers AM1 to AM3. The offset value data DV1 to DV3 respectively corresponds to the offset voltages VOS1 to VOS3 of the amplifiers AM1 to AM3, for example. The offset adjustment data DA1 to DA3 may be set based on the offset value data DV1 to DV3, the 1 LSB-equivalent voltages of the D/A converters DAC1 to DAC3, and the like, for example.

The offset value storage sections RV1 to RV3 may be implemented by a register formed by a flip-flop, a memory, or the like, or may be implemented by a nonvolatile memory (e.g., EEPROM), a fuse element, or the like.

4.1 Amplifier Offset Calibration

FIGS. 10A to 11B are views illustrative of amplifier offset calibration that automatically cancels the offset voltages VOS1 to VOS3 of the amplifiers AM1 to AM3.

In this embodiment, when subjecting the amplifiers AM1 to AM3 (first to Nth amplifiers) to amplifier offset calibration, the offset value data DV1 to DV3 (first to Nth offset value data) is calculated based on the digital data ADQ from the A/D converter 50 and the gains G1 to G3 (gain adjustment data) of the amplifiers AM1 to AM3. The calculated offset value data DV1 to DV3 is set (stored) in the offset value storage sections RV1 to RV3 (first to Nth offset value storage sections).

In FIGS. 10A to 11B, offset calibration is performed in the order from the subsequent-stage amplifier (e.g., in the order of the amplifiers AM3, AM2, and AM1).

Figure 10A:
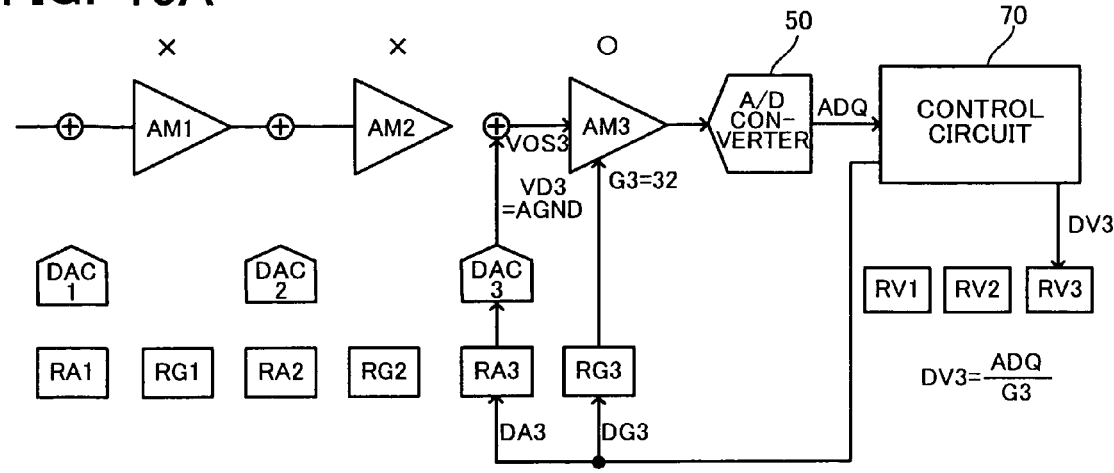
FIGS. 10A to 10C are views illustrative of amplifier offset calibration according to one embodiment of the invention.

Specifically, when performing amplifier offset calibration, offset calibration that measures the offset voltage VOS3 of the amplifier AM3 (jth amplifier in a broad sense; j is an integer that satisfies 1≦N) among the amplifiers AM1 to AM3 (first to Nth amplifiers) is performed, as shown in FIG. 10A.

Figure 10B:
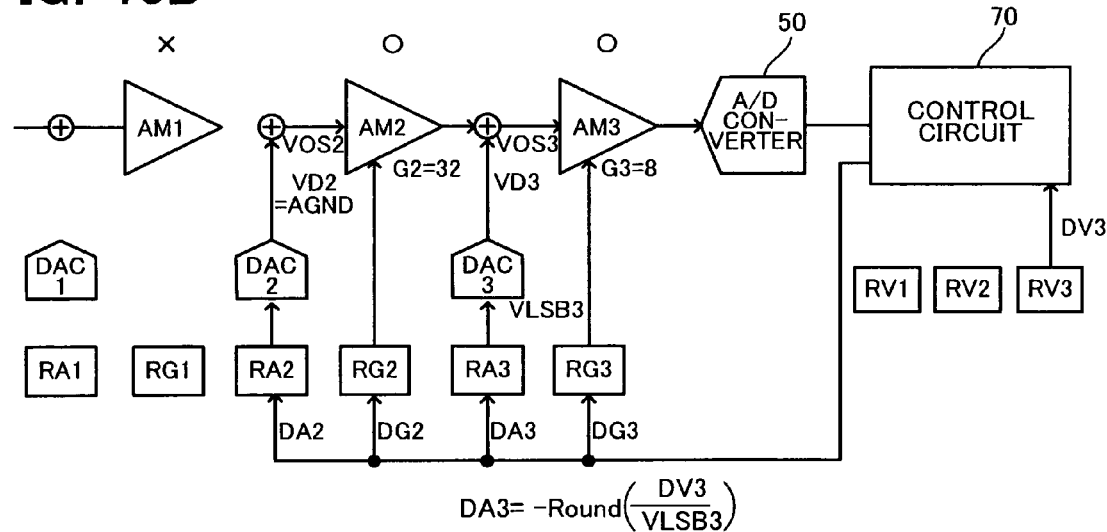
Figure 10C:
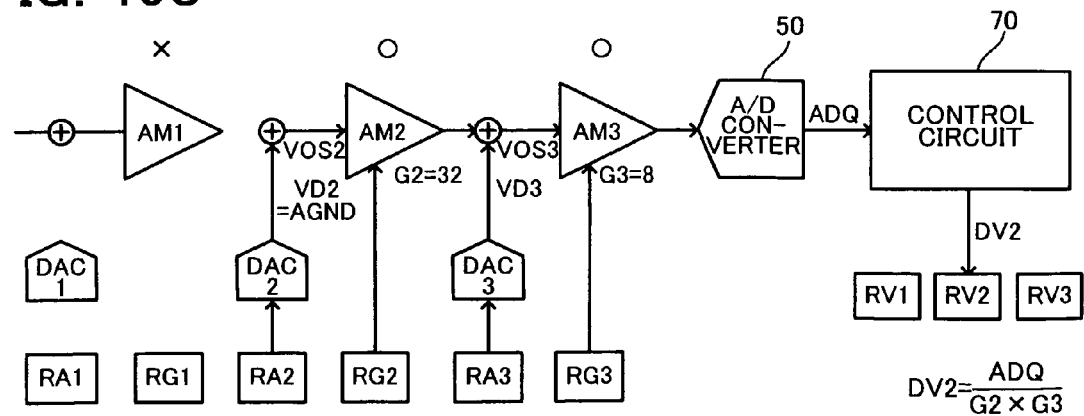
Figure 11A:
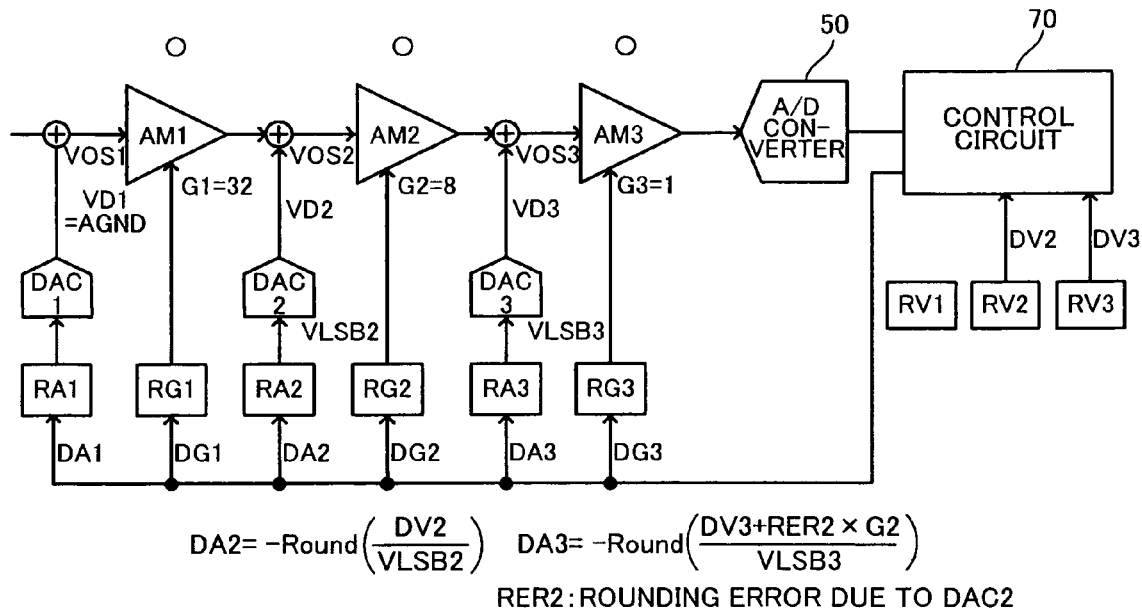
FIGS. 11A and 11B are views illustrative of amplifier offset calibration according to one embodiment of the invention.
Figure 11B:
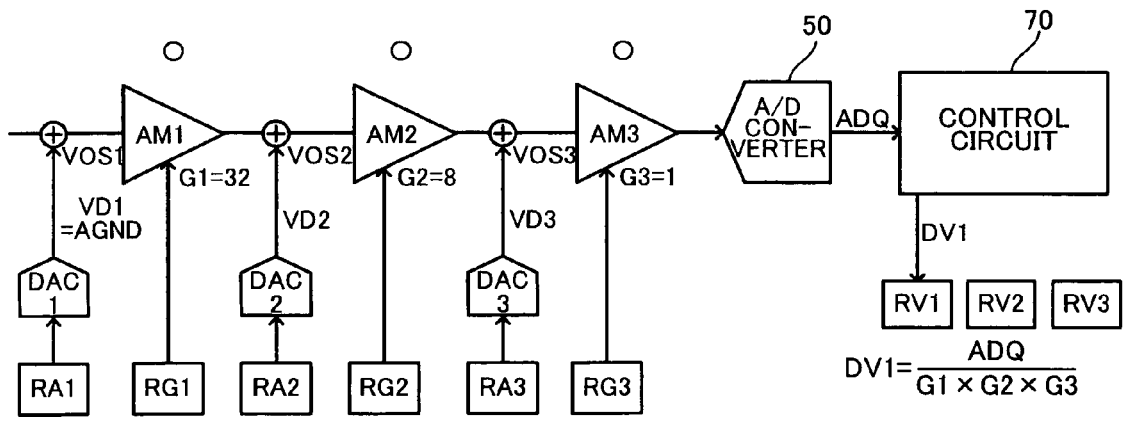

Offset calibration that measures the offset voltage VOS2 of the amplifier AM2 ((j−1)th amplifier in a broad sense) in the preceding stage of the amplifier AM3 is then performed, as shown in FIGS. 10B and 10C. Offset calibration that measures the offset voltage VOS1 of the amplifier AM1 is then performed, as shown in FIGS. 11A and 11B.

In FIG. 10A, the amplifiers AM1 and AM2 are disabled, and the amplifier AM3 is enabled. The control circuit 70 sets the gain adjustment data DG3 in the gain adjustment register RG3 so that the gain G3 of the amplifier AM3 is set at a large value (e.g., G3=32) (e.g., maximum gain). Specifically, when subjecting the amplifier AM3 to offset calibration, the gain adjustment data DG3 is set so that the gain G3 of the amplifier AM3 is set at a large value. Therefore, the measurement accuracy of the offset voltage VOS3 of the amplifier AM3 subjected to offset calibration can be improved.

The control circuit 70 sets the offset adjustment data DA3 that sets the output voltage VD3 of the D/A converter DAC3 at an analog reference power supply voltage AGND in the offset adjustment register RA3. Therefore, the D/A converter DAC3 outputs the voltage VD3 set at the analog reference power supply voltage AGND to the amplifier AM3. The analog reference power supply voltage AGND is a voltage (intermediate voltage) between a high-potential-side power supply voltage (VDD) and a low-potential-side power supply voltage (GND=0 V) (e.g., AGND=VDD/2). Note that the analog reference power supply voltage AGND may be set at 0 V.

The control circuit 70 monitors the digital data ADQ from the A/D converter 50 after setting the offset adjustment data DA3 and the gain adjustment data DG3. In FIG. 10A, since the output voltage VD3 of the D/A converter DAC3 is set at the analog reference power supply voltage AGND, the digital data ADQ corresponds to the offset voltage VOS3 of the amplifier AM3. The control circuit 70 calculates the offset value data DV3 corresponding to the offset voltage VOS3 of the amplifier AM3 based on the digital data ADQ from the A/D converter 50 and the gain G3 of the amplifier AM3. Specifically, the offset voltage VOS3 of the amplifier AM3 is amplified by the amplifier AM3 by a factor of G3 so that the digital data ADQ corresponding to G3×VOS3 is output from the A/D converter 50. Therefore, the control circuit 70 calculates the offset value data DV3 (i.e., the measured value of the offset voltage VOS3) by calculating DV3=ADQ/G3, and sets (stores) the offset value data DV3 in the offset value storage section RV3.

Then, the amplifier AM1 is disabled, and the amplifiers AM2 and AM3 are enabled, as shown in FIG. 10B. The control circuit 70 sets the gain adjustment data DG2 and DG3 in the gain adjustment registers RG2 and RG3 to set the gain G2 of the amplifier AM2 at 32 and set the gain G3 of the amplifier AM3 at 8, for example.

The control circuit 70 sets the offset adjustment data DA2 that sets the output voltage VD2 of the D/A converter DAC2 at the analog reference power supply voltage AGND in the offset adjustment register RA2. Therefore, the D/A converter DAC2 outputs the voltage VD2 set at the analog reference power supply voltage AGND to the amplifier AM2.

The control circuit 70 reads the offset value data DV3 set in FIG. 10A from the offset value storage section RV3. The control circuit 70 calculates the offset adjustment data DA3 by calculating DA3=−Round(DV3/VLSB3), and sets the offset adjustment data DA3 in the offset adjustment register RA3. Therefore, the offset voltage VOS3 of the amplifier AM3 is canceled.

Note that VLSB3 that indicates the DAC accuracy is the 1 LSB-equivalent voltage VLSB3 of the D/A converter DAC3. Specifically, the 1 LSB-equivalent voltage VLSB3 is a voltage corresponding to the amount of change in the output voltage VD3 when changing the input data of the D/A converter DAC3 by 1 LSB (1 bit). Round(X) is a function that indicates rounding X off. Since data that indicates an integer in decimal notation must be input to the D/A converter, such a rounding calculation process is necessary When DA3=−Round(DV3/VLSB3) is set in the offset adjustment register RA3 (see FIG. 10B), the D/A converter DAC3 outputs a voltage that cancels the offset voltage VOS3 of the amplifier AM3 as the output voltage VD3. Therefore, when subjecting the amplifier AM2 to offset calibration, the offset voltage VOS3 of the amplifier AM3 can be canceled so that the effects of the offset voltage VOS3 can be reduced.

When using the amplifier having the configuration shown in FIG. 2A or 2B, when the gain with respect to the input signal Vin is referred to as GS and the gain with respect to the output voltage VD of the D/A converter DAC is referred to as GD, GS=GD=−R2/R1 or R2/R1 (i.e., the gain GS is the same as the gain GD). According to the configuration shown in FIG. 2C, since GS=−R2/R1 and GD=(1+R2/R1), the gain GS differs from the gain GD. Therefore, when using the amplifier having the configuration shown in FIG. 2C, the offset adjustment data DA3 is calculated as indicated by DA3=−Round (KSD×DV3/VLSB3) (where KSD is the ratio of the gain GS to the gain GD). This also applies to the following description.

In FIG. 10B, when subjecting the amplifier AM2 (j−1)th amplifier) to offset calibration, the gain G2 of the amplifier AM2 is set to be higher than the gain G3 of the subsequent-stage amplifier AM3 (jth amplifier). Therefore, the measurement accuracy of the offset voltage VOS2 of the amplifier AM2 subjected to offset calibration can be improved.

In FIG. 10B, the offset voltage VOS3 of the amplifier AM3 is canceled by setting DA3=−Round(DV3/VLSB3) in the offset adjustment register RA3. However, the rounding calculation process indicated by DA3=−Round(DV3/VLSB3) involves a rounding error value RER3 that is the difference between DV3/VLSB3 and Round(DV3/VLSB3). Therefore, the offset voltage VOS3 cannot be completely canceled even if DA3=−Round(DV3/VLSB3) is set in the offset adjustment register RA3.

In FIG. 10B, the effects of the rounding error value RER3 of the D/A converter DAC3 are reduced by setting the gain G2 of the amplifier AM2 to be higher than the gain G3 of the amplifier AM3 to improve the measurement accuracy of the offset voltage VOS2 of the amplifier AM2.

The control circuit 70 monitors the digital data ADQ from the A/D converter 50 (see FIG. 10C) after setting the offset adjustment data DA2 and DA3 and the gain adjustment data DG2 and DG3 (see FIG. 10B). In FIG. 10B, since the output voltage VD2 of the D/A converter DAC2 is set at the analog reference power supply voltage AGND, the digital data ADQ corresponds to the offset voltage VOS2 of the amplifier AM2. Therefore, the control circuit 70 calculates the offset value data DV2 based on the digital data ADQ from the A/D converter 50 and the gains G2 and G3 of the amplifiers AM2 and AM3. Specifically, the control circuit 70 calculates the offset value data DV2 by calculating DV2=ADQ/(G2×G3), and sets (stores) the offset value data DV2 in the offset value storage section RV2.

The amplifiers AM1, AM2, and AM3 are then enabled, as shown in FIG. 11A. The control circuit 70 sets the gain adjustment data DG1, DG2, and DG3 in the gain adjustment registers RG1, RG2, and RG3 to set the gain G1 of the amplifier AM1 at 32, set the gain G2 of the amplifier AM2 at 8, and set the gain G3 of the amplifier AM3 at 1, for example.

The control circuit 70 sets the offset adjustment data DA1 that sets the output voltage VD1 of the D/A converter DAC1 at the analog reference power supply voltage AGND in the offset adjustment register RA1.

The control circuit 70 reads the offset value data DV2 set in FIG. 10C from the offset value storage section RV2. The control circuit 70 calculates the offset adjustment data DA2 by calculating DA2=−Round(DV2/VLSB2), and sets the offset adjustment data DA2 in the offset adjustment register RA2. Therefore, the offset voltage VOS2 of the amplifier AM2 is canceled.

The control circuit 70 reads the offset value data DV3 set in FIG. 10A from the offset value storage section RV3. The control circuit 70 calculates the offset adjustment data DA3 by calculating DA3-Round{(DV3+RER2×G2)/VLSB3}, and sets the offset adjustment data DA3 in the offset adjustment register RA3. Therefore, the offset voltage VOS3 of the amplifier AM3 is canceled.

Note that VLSB2 and VLSB3 are the 1 LSB-equivalent voltages of the D/A converters DAC2 and DAC3. RER2 is a rounding error value of the D/A converter DAC2. The rounding error value RER2 is the difference between DV2/VLSB2 and Round(DV2/VLSB2). According to the above configuration, since the rounding error value RER2 due to the rounding calculation process that calculates the offset adjustment data DA2 can be reflected in the offset adjustment data DA3 and set in the offset adjustment register RA3, the offset calibration accuracy can be improved.

In FIG. 11A, when subjecting the amplifier AM1 to offset calibration, the gains G1, G2, and G3 of the amplifiers AM1, AM2, and AM3 are set so that the gain G1 of the amplifier AM1 is higher than the gains G2 and G3 of the subsequent-stage amplifiers AM2 and AM3. Therefore, the measurement accuracy of the offset voltage VOS1 of the amplifier AM1 subjected to offset calibration can be improved.

The control circuit 70 monitors the digital data ADQ from the A/D converter 50 (see FIG. 11B) after setting the offset adjustment data DA1, DA2, and DA3 and the gain adjustment data DG1, DG2, and DG3 (see FIG. 11A). In FIG. 11A, since the output voltage VD1 of the D/A converter DAC1 is set at the analog reference power supply voltage AGND, the digital data ADQ corresponds to the offset voltage VOS1 of the amplifier AM1. Therefore, the control circuit 70 calculates the offset value data DV1 corresponding to the offset voltage VOS1 of the amplifier AM1 based on the digital data ADQ from the A/D converter 50 and the gains G1, G2, and G3 of the amplifiers AM1, AM2, and AM3. Specifically, the control circuit 70 calculates the offset value data DV1 by calculating DV1=ADQ/(G1×G2×G3), and sets the offset value data DV1 in the offset value storage section RV1.

The amplifier offset calibration process according to this embodiment is summarized as follows.

In this embodiment, offset calibration (jth offset calibration) that measures the offset voltage VOS3 of the amplifier AM3 (jth amplifier) among the amplifiers AM1 to AM3 is performed, as shown in FIG. 10A.

In this offset calibration, the control circuit 70 calculates the offset value data DV3 (jth offset value data) based on the digital data ADQ from the A/D converter 50 and the gain G3 of the amplifier AM3, as shown in FIG. 10A. Specifically, the control circuit 70 calculates DV3=ADQ/G3, and sets the offset value data DV3 in the offset value storage section RV3.

Then, offset calibration ((j−1)th offset calibration) that measures the offset voltage VOS2 of the amplifier AM2 ((j−1)th amplifier) among the amplifiers AM1 to AM3 is performed, as shown in FIGS. 10B and 10C.

In this offset calibration, the control circuit 70 calculates the offset adjustment data DA3 (jth offset adjustment data) based on the offset value data DV3 (jth offset value data), and sets the offset adjustment data DA3 in the offset adjustment register RA3 (jth offset adjustment register), as shown in FIG. 10B. Specifically, the control circuit 70 calculates DA3=−Round(DV3/LSB3), and sets the offset adjustment data DA3 in the offset adjustment register RA3.

The control circuit 70 then calculates the offset value data DV2 ((j−1)th offset value data) based on the digital data ADQ from the A/D converter 50 and the gains G2 and G3 of the amplifiers AM2 and AM3 ((j−1)th and jth amplifiers), and sets the offset value data DV2 in the offset value storage section RV2 ((j−1)th offset value storage section), as shown in FIG. 10C. Specifically, the control circuit 70 calculates DV2=ADQ/(G2×G3), and sets the offset value data DV2 in the offset value storage section RV2.

Then, offset calibration ((j−2)th offset calibration) that measures the offset voltage VOS1 of the amplifier AM1 ((j−1)th amplifier) among the amplifiers AM1 to AM3 is performed, as shown in FIGS. 11A and 11B.

In this offset calibration, the control circuit 70 calculates the offset adjustment data DA2 ((j−1)th offset adjustment data) based on the offset value data DV2 ((j−1)th offset value data), and sets the offset adjustment data DA2 in the offset adjustment register RA2 ((j−1)th offset adjustment register), as shown in FIG. 11A. Specifically, the control circuit 70 calculates DA2=−Round(DV2/VLSB2), and sets the offset adjustment data DA2 in the offset adjustment register RA2.

The control circuit 70 calculates the offset adjustment data DA3 (jth offset adjustment data) based on the offset value data DV2 and DV3 ((j−1)th and jth offset value data), and sets the offset adjustment data DA3 in the offset adjustment register RA3 (jth offset adjustment register).

Specifically, the control circuit 70 performs a rounding calculation process that calculates the offset adjustment data DA2 ((j−1)th offset adjustment data) based on the offset value data DV2 ((j−1)th offset value data). Specifically, the control circuit 70 performs a rounding calculation process indicated by DA2=−Round(DV2/VLSB2). The control circuit 70 calculates the offset adjustment data DA3 (jth offset adjustment data) based on the rounding error value RER2 due to the rounding calculation process, the gain G2 of the amplifier AM2 ((j−1)th amplifier), and the offset value data DV3 (jth offset value data). The control circuit 70 sets the offset adjustment data DA3 in the offset adjustment register RA3(jth offset adjustment register). Specifically, the control circuit 70 calculates DA3=−Round{(DV3+RER2×G2)/VLSB3}, and sets the offset adjustment data DA3 in the offset adjustment register RA3. Therefore, the rounding error value RER2 due to the D/A converter DAC2 can be canceled by the output voltage VD3 of the D/A converter DAC3 so that more accurate offset calibration can be implemented.

The control circuit 70 then calculates the offset value data DV1 ((j−2)th offset value data) based on the digital data ADQ from the A/D converter 50 and the gains G1, G2, and G3 of the amplifiers AM1, AM2, and AM3 ((j−2)th, (j−1)th, and jth amplifiers), and sets the offset value data DV1 in the offset value storage section RV1 ((j−2)th offset value storage section), as shown in FIG. 11B. Specifically, the control circuit 70 calculates DV1=ADQ/(G1×G2×G3), and sets the offset value data DV1 in the offset value storage section RV1.

Therefore, the offset value data DV1 to DV3 corresponding to the offset voltages VOS1 to VOS3 of the amplifiers AM1 to AM3 is automatically calculated and stored in the offset value storage sections RV1 to RV3. Signal offset calibration described below is performed using the offset value data DV1 to DV3 stored in the offset value storage sections RV1 to RV3 to implement signal offset calibration on the input signal VI and the like.

4.2 Signal Offset Calibration

Figure 12A:
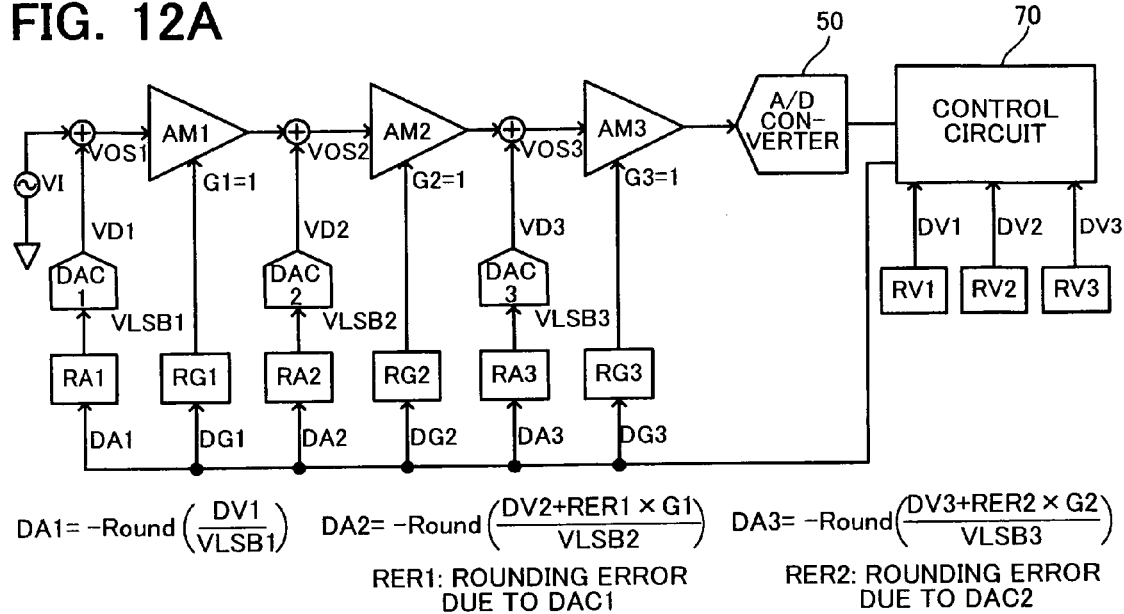
FIGS. 12A to 12C are views illustrative of signal offset calibration according to one embodiment of the invention.
Figure 12B:
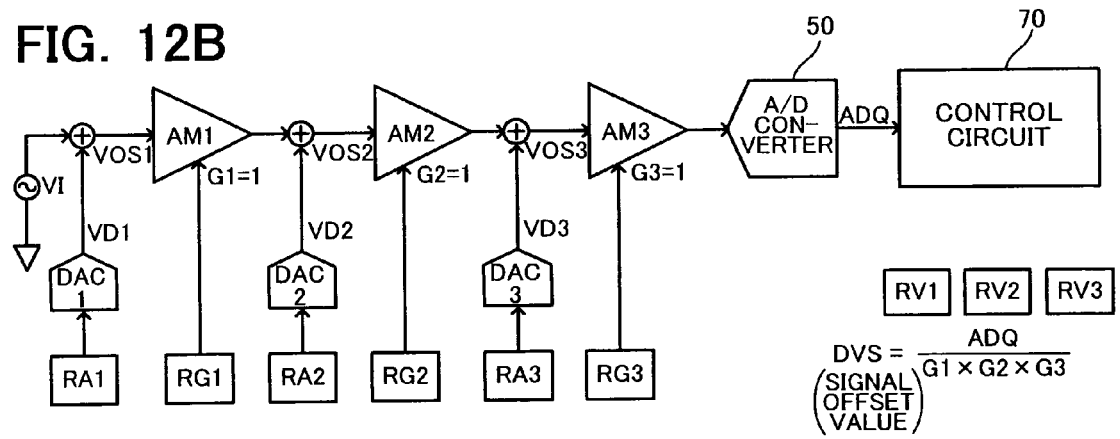
Figure 12C:
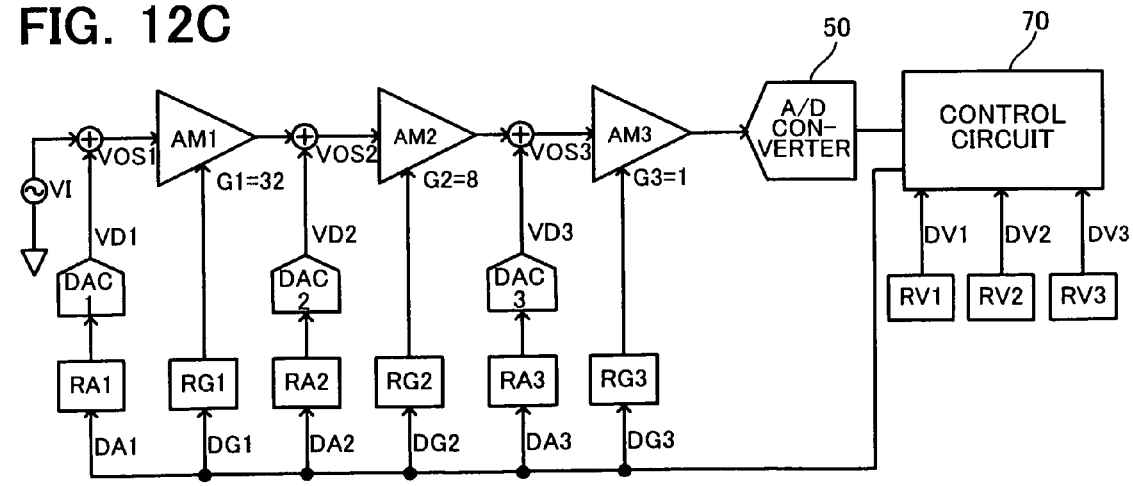
Figure 13:
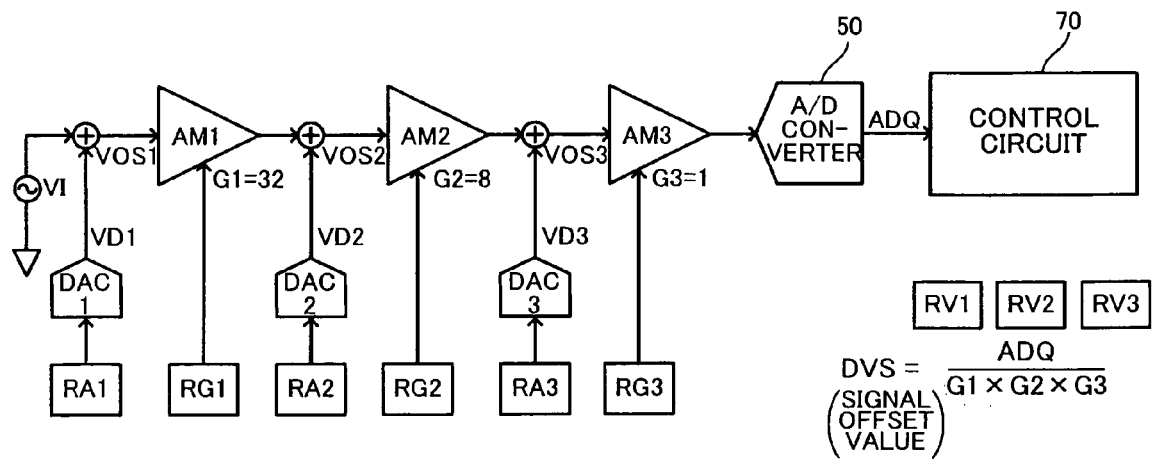
FIG. 13 is a view illustrative of signal offset calibration according to one embodiment of the invention.

FIGS. 12A to 13 are views illustrative of signal offset calibration performed on the input signal VI. In this embodiment, amplifier offset calibration that cancels the offset voltages VOS1 to VOS3 of the amplifiers AM1 to AM3 is performed as described with reference to FIGS. 10A to 11B. A sensor or the like is then connected to the integrated circuit device, and signal offset calibration is performed on the input signal VI from the sensor or the like. Specifically, calibration that sets the amplitude center of the signal input to the A/D converter 50 at the center of the input voltage range of the A/D converter 50 (see A5 in FIG. 3) is performed. In this embodiment, the offset adjustment data DA1 to DA3 (first to Nth offset adjustment data) is calculated during signal offset calibration based on the offset value data DV1 to DV3 (first to Nth offset value data) stored in the offset value storage sections RV1 to RV3 (first to Nth offset value storage sections). The offset adjustment data DA1 to DA3 is set in the offset adjustment registers RA1 to RA3 (first to Nth offset adjustment registers).

In FIGS. 12A to 13, signal offset calibration is performed in the order from the preceding-stage amplifier (e.g., in the order of the amplifiers AM1, AM2, and AM3). Specifically, the control circuit 70 calculates the offset adjustment data DA1 (ith offset adjustment data; i is an integer that satisfies $1 \leq i < N$) during signal offset calibration, and sets the offset adjustment data DA1 in the offset adjustment register RA1 (ith offset adjustment register). The control circuit 70 then calculates the offset adjustment data DA2 ((i+1)th offset adjustment data), and sets the offset adjustment data DA2 in the offset adjustment register RA2 ((i+1)th offset adjustment register). The control circuit 70 then calculates the offset adjustment data DA3, and sets the offset adjustment data DA3 in the offset adjustment register RA3.

In FIG. 12A, the control circuit 70 sets the gain adjustment data DG1 to DG3 in the gain adjustment registers RG1 to RG3 to set the gains G1 to G3 of the amplifiers AM1 to AM3 at a small value (egg, G1=G2=G3=1) (e.g., minimum gain). Specifically, the control circuit 70 sets the gains of the amplifiers AM1 to AM3 at gains under a first gain condition.

For example, the input signal VI from the sensor or the like varies in amplitude and DC offset. Therefore, the output of the amplifier may be saturated when the gains G1 to G3 of the amplifiers AM1 to AM3 are set at a large value so that appropriate A/D conversion data may not be obtained.

A situation in which the output of the amplifier is saturated can be prevented by setting the gains of the amplifiers AM1 to AM3 at low gains under the first gain condition (e.g., G1=62=G3=1), as shown in FIG. 12A.

The control circuit 70 then reads the offset value data DV1 from the offset value storage section RV1. The control circuit 70 calculates the offset adjustment data DA1 by calculating DA1=-Round(DV1/VLSB1), and sets the offset adjustment data DA1 in the offset adjustment register RA1, as shown in FIG. 12A. Therefore, the D/A converter DAC1 outputs the voltage VD1 corresponding to the offset adjustment data DA1 (=-Round(DV1/VLSB1) to the amplifier AM1.

The offset value data DV1 corresponds to the offset voltage VOS1 of the amplifier AM1, as described with reference to FIG. 11B. Therefore, the offset voltage VOS1 of the amplifier AM1 can be canceled by causing the D/A converter DAC1 to output the voltage VD1 corresponding to the offset adjustment data DA1 (=-Round(DV1/VLSB1).

The control circuit 70 reads the offset value data DV2 from the offset value storage section RV2. The control circuit 70 calculates the offset adjustment data DA2 by calculating DA2=-Round{(DV2+RER1×G1)/VLSB2}, and sets the offset adjustment data DA2 in the offset adjustment register RA2. Therefore, the D/A converter DAC2 outputs the voltage VD2 corresponding to the offset adjustment data DA2 (=-Round{(DV2+RER1×G1)/VLSB2}) to the amplifier AM2.

The offset value data DV2 corresponds to the offset voltage VOS2 of the amplifier AM2, as described with reference to FIG. 10C. Therefore, the offset voltage VOS2 of the amplifier AM2 can be canceled by causing the D/A converter DAC2 to output the voltage VD2 corresponding to the offset adjustment data DA2 (=-Round {(DV2+RER1×G1)/VLSB2}).

RER1 is a rounding error value of the D/A converter DAC1. The rounding error value RER1 is the difference between DV1/VLSB1 and Round(DV1/VLSB1). An accurate offset adjustment can be implemented by reflecting the rounding error value RER1 of the D/A converter DAC1 in the D/A converter DAC2.

In FIG. 12A, the offset voltage VOS1 of the amplifier AM1 is canceled by setting DA1=-Round(DV1/VLSB1) in the offset adjustment register RA1. However the rounding calculation process indicated by DA1=-Round(DV1/VLSB1) involves the rounding error value RER1 that is the difference between DV1/VLSB1 and Round(DV1 VLSB1). Therefore, the offset voltage VOS1 cannot be completely canceled even if DA1=-Round(DV1/VLSB1) is set in the offset adjustment register RA1.

In this embodiment, the offset adjustment data DA2 is calculated based on the rounding error value RER1, the gain G1 of the amplifier AM1, and the offset value data DV2. Specifically, the rounding error value RER1 is multiplied by G1 and added to the offset value data DV2, and the offset adjustment data DA2 is calculated by the calculation expression "DA2=-Round{(DV2+RER1×G1)/VLSB2}". Therefore, the rounding error value RER1 of the offset voltage VOS1 that has not been canceled by the D/A converter DAC1 can be canceled by the D/A converter DAC2 so that the offset calibration accuracy can be improved.

The control circuit 70 reads the offset value data DV3 from the offset value storage section RV3. The control circuit 70 calculates the offset adjustment data DA3 by calculating DA3=-Round{(DV3+RER2×G2)/VLSB3)}, and sets the offset adjustment data DA3 in the offset adjustment register RA3. Therefore, the D/A converter DAC3 outputs the voltage VD3 corresponding to the offset adjustment data DA3 (=-Round{(DV3+RER2×G2)/VLSB3}) to the amplifier AM3.

The offset value data DV3 corresponds to the offset voltage VOS3 of the amplifier AM3, as described with reference to FIG. 10A. Therefore, the offset voltage VOS3 of the amplifier AM3 can be canceled by causing the D/A converter DAC3 to output the voltage VD3 corresponding to the offset adjustment data DA3 (=-Round{(DV3+RER2×G2)/VLSB3}).

RER2 is the rounding error value of the D/A converter DAC2. The rounding error value RER is the difference between (DV2+RER1×G1)/VLSB2 and Round{(DV2+RER1×G1)/VLSB2}. An accurate offset adjustment can be implemented by reflecting the rounding error value RER2 of the D/A converter DAC2 in the D/A converter DAC3.

The control circuit 70 then monitors the digital data ADQ from the A/D converter 50, as shown in FIG. 12B. In this case, the offset voltages VOS1 to VOS3 of the amplifiers AM1 to AM3 have been canceled by setting the offset adjustment data DA1 to DA3 in the offset adjustment registers RA1 to RA3 as shown in FIG. 12A. Therefore, the digital data ADQ from the A/D converter 50 is data that indicates the signal offset value of the input signal VI.

Therefore, the control circuit 70 calculates signal offset value data DVS based on the digital data ADQ from the A/D converter 50 and the gains G1 to G3 of the amplifiers AM1 to AM3. Specifically, the control circuit 70 calculates the signal offset value data DVS by calculating DVS=ADQ/(G1×G2×G3), and sets the signal offset value data DVS in a register (not shown).

The control circuit 70 then determines the gains G1 to G3 of the amplifiers AM1 to AM3 based on the amplitudes of the signals AQ1 to AQ3 under the first gain condition (i.e., G1–G2=G3=1) shown in FIG. 12A and the like, and sets the gain adjustment data DG1 to DG3 corresponding to the gains G1 to G3 of the amplifiers AM1 to AM3 in the gain adjustment registers RG1 to RG3. In FIG. 12C, the gains of the amplifiers AM1 to AM3 are set so that G1=32, G2=8, and G3=1, for example. Specifically, the gains of the amplifiers AM1 to AM3 are set at gains under a second gain condition (G1=32, G2=8, and G3=1) in which the gains of the amplifiers AM1 to AM3 are set to be higher than those under the first gain condition (G1=G2=G3=1) shown in FIG. 12A.

Specifically, since the input signal VI from the sensor or the like varies in amplitude and DC offset, the gains of the amplifiers AM1 to AM3 are set at low gains under the first gain condition (G1=G2=G3=1) in FIG. 12A. The gains under the second gain condition are determined based on the amplitudes of the signals AQ1 to AQ3 and the like under the first gain condition, and the gains of the amplifiers AM1 to AM3 are reset as shown FIG. 12C. For example, the gain set under the second gain condition is increased as the amplitude decreases. Therefore, even if the amplitude of the input signal VI has changed as indicated by A1 to A4 in FIG. 3, for example, the A/D input amplitude (swing level) of the A/D converter 50 can be made almost constant (see A5 in FIG. 3) independent of the amplitude of the input signal VI. This increases the dynamic range.

As shown FIG. 12C, the gain of the preceding-stage amplifier is set to be higher than the gain of the subsequent-stage amplifier under the second gain condition. For example, the gain G1 of the amplifier AM1 is set to be higher than the gains G2 and G3 of the amplifiers AM2 and AM3. Noise can be reduced by setting the gain of the preceding-stage amplifier to be higher than the gain of the subsequent-stage amplifier.

The control circuit 70 then calculates the offset adjustment data DA1 to DA3 by performing a calculation process similar to that shown in FIG. 12A in a state in which the gains G1 to G3 of the amplifiers AM1 to AM3 are set at the gains under the second gain condition, and sets the offset adjustment data DA1 to DA3 in the offset adjustment registers RA1 to RA3. The control circuit 70 calculates the signal offset value data DVS and the like based on the digital data ADQ from the A/D converter 50 and the gains G1 to G3 of the amplifiers AM1 to AM3, as shown FIG. 13.

The signal offset calibration process according to this embodiment is summarized as follows.

The control circuit 70 sets the gains G1 to G3 under the first gain condition, as shown in FIG. 12A. The control circuit 70 calculates the offset adjustment data DA1 (jth offset adjustment data) based on the offset value data DV1 (jth offset value data), and sets the offset adjustment data 9A2 in the offset adjustment register RA2. Specifically, the control circuit 70 calculates DA1=−Round(DV1/VLSB1), and sets the offset adjustment data DA1 in the offset adjustment register RA1.

The control circuit 70 calculates the offset adjustment data DA2 ((i+1)th offset adjustment data) based on the offset value data DV1 and DV2 (ith and (i+1)th offset value data) and the gain G1 of the amplifier AM1 (ith amplifier), and sets the offset adjustment data DA2 in the offset adjustment register RA2 ((i+1)th offset adjustment register). Specifically, the control circuit 70 calculates the offset adjustment data DA2 based on the rounding error value RER1 of the rounding calculation process that calculates the offset adjustment data DA1 based on the offset value data DV1, the gain G1 of the amplifier AM1, and the offset value data DV2. Specifically, the control circuit 70 calculates DA2=−Round{(DV2+RER1×G1)/VLSB2}, and sets the offset adjustment data DA2 in the offset adjustment register RA2. Likewise, the control circuit 70 calculates DA3=−Round{(DV3+RER2×G2)/VLSB3}, and sets the offset adjustment data DA3 in the offset adjustment register RA3.

After the offset adjustment data DA1 to DA3 (first to Nth offset adjustment data) has been set in the offset adjustment registers RA1 to RA3, the control circuit 70 calculates the signal offset value data DVS of the input signal VI based on the digital data ADQ from the A/D converter 50 and the gains G1 to G3 of the amplifiers AM1 to AM3 (first to Nth amplifiers), as shown FIG. 12B. Specifically, the control circuit 70 calculates DVS=ADQ/(G1×G2×G3).

After the control circuit 70 has set the gains of the amplifiers AM1 to AM3 at gains under the first gain condition and calculated the signal offset value data DVS of the input signal VI, the control circuit 70 resets the gains G1 to G3 of the amplifiers AM1 to AM3 to gains under the second gain condition that are higher than those under the first gain condition, as shown FIG. 12C. The control circuit 70 sets the offset adjustment data DA1 to DA3 by performing a calculation process similar to that shown in FIG. 12A, and again calculates the signal offset value data DVS of the input signal, as shown FIG. 13.

Accurate real-time calibration can be implemented by performing signal offset calibration as described above.

5. Modification 5.1 First Configuration Example of Modification

Figure 14:
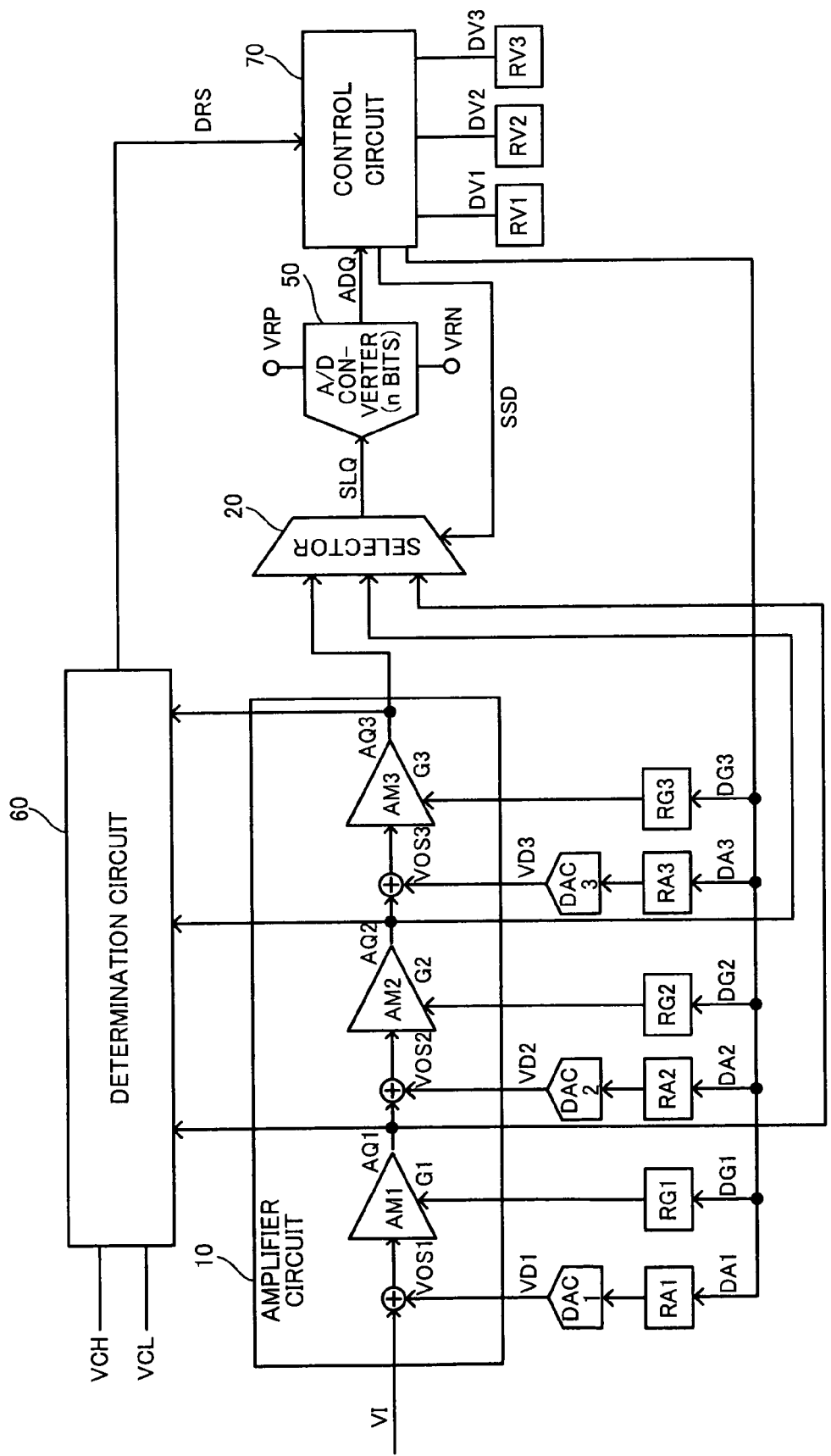
FIG. 14 shows a first configuration example of a modification of one embodiment of the invention.

A modification of this embodiment is described below. FIG. 14 shows a first configuration example of the modification of this embodiment. In FIG. 14, a selector 20 and a determination circuit 60 are provided in addition to the elements shown in FIG. 1.

Note that a modification in which only the determination circuit 60 is provided in FIG. 14 without providing the selector 20 is also possible. In FIG. 14, a filter such as a switched-capacitor filter (SCF) of which the cut-off frequency is variably set corresponding to the frequency band of the input signal may be provided between the selector 20 and the A/D converter 50, for example. The filter functions as a prefilter for the A/D converter 50. Alternatively, a digital filter of which the cut-off frequency is variably set corresponding to the frequency band of the input signal may be provided in the control circuit 70.

The selector 20 (multiplexer) selects one of the output signals AQ1 to AQ3 (first to Nth output signals) from the amplifiers AM1 to AMN (first to Nth amplifiers). The selector 20 outputs the selected output signal as a selector output signal SLQ. Specifically, the selector 20 selects one of the output signals AQ1 to AQ3 based on a select instruction signal SSD output from the control circuit 70, and outputs the selected output signal. The selector 20 may include a plurality of logic gates, a plurality of transfer transistors, and the like. The A/D converter 50 performs an A/D conversion process on the selector output signal SLQ from the selector 20.

The determination circuit 60 (comparison circuit) performs a determination process (voltage comparison process) on the output signals AQ1 to AQ3 from the amplifiers AM1 to AM3 of the amplifier circuit 10. Specifically, the determination circuit 60 determines (compares) whether or not the voltage of the output signal from each of the amplifiers AM1 to AM3 is within a determination voltage range. The determination circuit 60 outputs a determination result signal DRS (e.g., error signal) to the control circuit 70. The determination voltage range is specified by a high-potential-side determination voltage VCH and a low-potential-side determination voltage VCL, for example.

The high-potential-side determination voltage VCH may be set at a voltage equal to or lower than the high-potential-side reference voltage VRP that specifies the input voltage range of the A/D converter 50 (VCH≦VRP), for example. The low-potential-side determination voltage VCL may be set at a voltage equal to or higher than the low-potential-side reference voltage VRN that specifies the input voltage range of the A/D converter 50 (VCL≧VRN). For example, the voltage range specified by the high-potential-side determination voltage VCH and the low-potential-side determination voltage VCL may be narrower than the voltage range specified by the high-potential-side reference voltage VRP and the low-potential-side reference voltage VRN by a margin (e.g., 1 to 90%).

The determination circuit 60 may include a plurality of comparators that compare the voltages of the output signals AQ1 to AQ3 from the amplifiers AM1 to AM3 with the high-potential-side determination voltage VCH and the low-potential-side determination voltage VCL. In this case, each comparator may be a comparator that has a hysteresis function. Alternatively, a circuit that holds the peak voltage of the output signals AQ1 to AQ3 may be provided, and the peak voltage may be compared with the determination voltages VCH and VCL using a comparator or the like.

The control circuit 70 instructs the selector 20 to select one of the output signals AQ1 to AQ3 from the amplifiers AM1 to AM3 based on the determination result of the determination circuit 60. For example, the control circuit 70 receives the determination result signal DRS from the determination circuit 60, generates the select instruction signal SSD, and outputs the select instruction signal SSD to the selector 20. More specifically, when the determination circuit 60 has determined that the voltage of the output signal from the jth amplifier (e.g., the amplifier AM3) among the amplifiers AM1 to AM3 is not within the determination voltage range specified by the high-potential-side determination voltage VCH and the low-potential-side determination voltage VCL, the control circuit 70 instructs the selector 20 to select the output signal from the (j−1)th amplifier (e.g., the amplifier AM2) in the preceding stage of the jth amplifier. When the determination circuit 60 has determined that the voltage of the signal input to the jth amplifier (e.g., the amplifier AM3) among the amplifiers AM1 to AM3 is not within a determination voltage range (jth determination voltage range) that is set corresponding to the gain of the jth amplifier, the control circuit 70 may instruct the selector 20 to select the output signal from the (j−1)th amplifier (e.g., the amplifier AM2) in the preceding stage of the jth amplifier.

According to the modification shown in FIG. 14, when the voltage of the output signal AQ3 from the amplifier AM3 has exceeded the determination voltage range specified by the high-potential-side determination voltage VCH and the low-potential-side determination voltage VCL, for example, the output signal AQ2 from the amplifier AM2 in the preceding stage of the amplifier AM3 is selected by the selector 20, and is subjected to A/D conversion by the A/D converter 50. When the voltage of the output signal AQ2 from the amplifier AM2 has exceeded the determination voltage range specified by the high-potential-side determination voltage VCH and the low-potential-side determination voltage VCL, the output signal AQ1 from the amplifier AM1 in the preceding stage of the amplifier AM2 is selected by the selector 20, and is subjected to A/D conversion by the A/D converter 50. According to this configuration, even if the input signal VI that varies in amplitude and the like is input, a signal within an optimum voltage range is input to the A/D converter 50. Therefore, the dynamic range of the A/D converter 50 can be increased.

According to this modification, an output signal within a voltage range close to the input voltage range (VRP to VRN) of the A/D converter 50 is selected by the selector 20, input to the A/D converter 50, and subjected to A/D conversion. Therefore, even if the amplitude of the input signal VI has changed (see A3 and A4 in FIG. 3), the A/D input amplitude (swing level) can be made almost constant (see A5). Therefore, the dynamic range DR can be increased without changing the A/D conversion resolution (e.g., 10 bits).

According to this modification, an output signal having an appropriate amplitude is automatically selected from the output signals AQ1 to AQ3 from the amplifiers AM1 to AM3, and is input to the A/D converter 50. Therefore, the user can connect the sensor to the integrated circuit device without taking much account of the amplitude and the like of the detection signal. Therefore, a user-friendly integrated circuit device can be provided. Moreover, since it is unnecessary to produce a new integrated circuit device by way of trial corresponding to the type of sensor, the development cost can be reduced.

In the automatic adjustment method according to this modification, since an automatic adjustment time lag occurs due to only the determination period of the determination circuit 60 and the select period of the selector 20, it is possible to quickly deal with a change in signal and the like and make a real-time automatic adjustment. Therefore, a dynamic range automatic adjustment method that is optimum for a signal (AC signal such as a sound signal) that requires a quick automatic adjustment, a detection signal that can be sampled only once (hard disk drive fall detection), and the like can be provided.

The control circuit 70 may set the gains under the second gain condition based on the determination result of the determination circuit 60. Specifically, the control circuit 70 determines the gains under the second gain condition (see FIG. 12C) utilizing the determination result of the determination circuit 60.

For example, the default gains under the second gain condition are referred to as G1=GC1, G2=GC2, and G3=GC3. For example, GC1=32, GC2=8, and GC3=4. When the determination circuit 60 has determined that the voltages of the signals AQ1 to AQ3 are within the determination voltage range specified by the high-potential-side determination voltage VCH and the low-potential-side determination voltage VCL, the control circuit 70 employs the default gains under the second gain condition (e.g., G1=GC1=32, G2=GC2=8, and G3=GC3=2).

When the determination circuit 60 has determined that the voltages of the signals AQ1 and AQ2 are within the determination voltage range specified by the high-potential-side determination voltage VCH and the low-potential-side determination voltage VCL and the voltage of the signal AQ3 is not within the determination voltage range specified by the high-potential-side determination voltage VCH and the low-potential-side determination voltage VCL, the control circuit 70 reduces the gain G3 (e.g., G3=1). Specifically, the control circuit 70 sets the gains so that G1=GC1=32, G2=GC2=8, and G3=1.

When the determination circuit 60 has determined that the voltage of the signal AQ1 is within the determination voltage range specified by the high-potential-side determination voltage VCH and the low-potential-side determination voltage VCL and the voltages of the signals AQ2 and AQ3 are not within the determination voltage range specified by the high-potential-side determination voltage VCH and the low-potential-side determination voltage VCL, the control circuit 70 reduces the gains G2 and G3 (e.g., G2=4 and G3=1). Specifically, the control circuit 70 sets the gains so that G1=GC1=32, G2=4, and G3=1.

When the determination circuit 60 has determined that the voltages of the signals AQ1, AQ2, and AQ3 are not within the determination voltage range specified by the high-potential-side determination voltage VCH and the low-potential-side determination voltage VCL, the control circuit 70 reduces the gains G1, G2, and G3 (e.g., G1=16, G2=4, and G3=1).

After reducing the gains, the determination circuit 60 again determines whether or not the voltages of the signals AQ1 to AQ3 are within the determination voltage range. When the determination circuit 60 has determined that the voltages of the signals AQ1 to AQ3 are not within the determination voltage range, the above-described process may be repeated.

Figure 15:
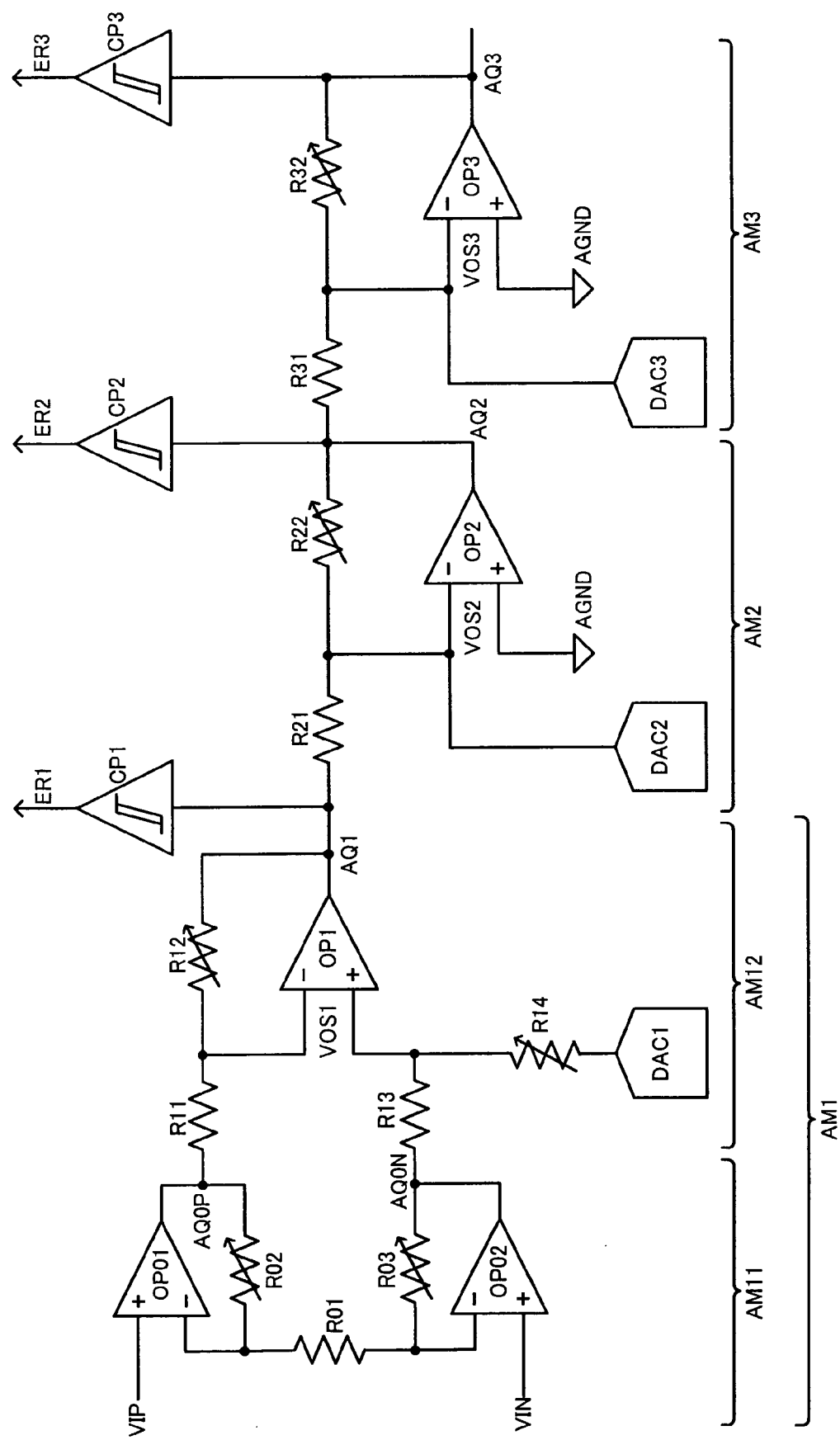
FIG. 15 shows a specific circuit configuration example of an amplifier circuit and a determination circuit.

FIG. 15 shows a specific circuit configuration example of the amplifier circuit 10 and the determination circuit 60. The amplifier AM1 includes amplifiers AM11 and AM12. The amplifier AM11 includes operational amplifiers OP01 and OP02 and resistors R01, R02, and R03. The resistors R02 and R03 are variable resistors, for example. The amplifier AM12 includes an operational amplifier OP1 and resistors R11, R12, R13, and R14. The resistors R12 and R14 are variable resistors, for example. The amplifiers AM11 and AM12 form an instrumentation amplifier that utilizes the operational amplifiers OP01, OP02, and OP1. The instrumentation amplifier is a differential-input/single-ended output balanced-input amplifier. The instrumentation amplifier is characterized in that the common mode rejection ratio (CMRR) can be increased. A sensor that outputs differential detection signals and a sensor that outputs a single-ended detection signal can be connected to the first-stage differential amplifier by utilizing the instrumentation amplifier as the first-stage differential amplifier. For example, when connecting a sensor that outputs differential detection signals to the first-stage differential amplifier, a first signal (positive) that forms the differential detection signals is input as the signal VIP, and a second signal (negative) that forms the differential detection signals is input as the signal VIN. When connecting a sensor that outputs a single-ended detection signal to the first-stage differential amplifier, the single-ended detection signal is input as the signal VIP, and a VIN terminal is set at a reference analog voltage AGND, for example.

The amplifier AM2 includes an operational amplifier OP2 and resistors R21 and R22. The resistor R22 is a variable resistor, for example. The gain G2 of the amplifier AM2 is adjusted using the resistor R22. The amplifier AM3 includes an operational amplifier OP3 and resistors R31 and R32. The resistor R32 is a variable resistor, for example. The gain G3 of the amplifier AM3 is adjusted using the resistor R32. The amplifiers AM2 and AM3 are inverting amplifiers.

Specifically, the output terminal of the operational amplifier OP2 is connected to the output node of the inverting amplifier AM2. The first resistor R21 is provided between the inverting input terminal (first input terminal in a broad sense) of the operational amplifier OP2 and the input node of the inverting amplifier AM2. The second resistor R22 is provided between the output node of the inverting amplifier AM2 and the inverting input terminal of the operational amplifier OP2. The non-inverting input terminal (second input terminal in a broad sense) of the operational amplifier OP2 is set at the analog reference power supply voltage AGND, for example. The configuration of the inverting amplifier AM3 is the same as the configuration of the inverting amplifier AM2.

It is unnecessary to use rail-to-rail operational amplifiers as the operational amplifiers OP2 and OP3 of the amplifiers AM2 and AM3 by utilizing the inverting amplifiers as the amplifiers AM2 and AM3. For example, when utilizing non-inverting amplifiers as the amplifiers AM2 and AM3, a signal having a large amplitude is distorted. It is necessary to use a rail-to-rail operational amplifier in order to prevent such a problem. However, a rail-to-rail operational amplifier has a disadvantage in that the circuit scale of the operational amplifier increases and it is difficult to improve the characteristics of the operational amplifier. The above-mentioned problems can be solved by utilizing the inverting amplifiers as the amplifiers AM2 and AM3.

In FIG. 15, the D/A converters DAC1, DAC2, and DAC3 that adjust the offset voltages VOS1, VOS2, and VOS3 of the operational amplifiers OP1, OP2, and OP3 and the DC offset of the input signal are provided.

In FIG. 15, a plurality of comparators (comparison circuits) CP1, CP2, and CP3 are provided as the determination circuit 60. The comparators CP1, CP2, and CP3 respectively compare the output signals AQ1, AQ2, and AQ3 from the amplifiers AM1 (AM11 and AM12), AM2, and AM3 with the high-potential-side determination voltage VCH and the low-potential-side determination voltage VCL. The comparators CP1, CP2, and CP3 determine whether or not the voltages of the output signals AQ1, AQ2, and AQ3 are within the determination voltage range specified by the high-potential-side determination voltage VCH and the low-potential-side determination voltage VCL. When the comparators CP1, CP2, and CP3 have determined that the voltages of the output signals AQ1, AQ2, and AQ3 are not within the determination voltage range, the comparators CP1, CP2, and CP3 respectively activate error signals ER1, ER2, and ER3 (signal DRS) that indicate the determination result. For example, when the voltages of the output signals AQ1, AQ2, and AQ3 are outside the determination voltage range, the comparators CP1, CP2, and CP3 respectively activate the signals ER1, ES2, and ER3. Each of the comparators CP1 to CP3 may include a first comparator that compares the voltage of the output signal with the determination voltage VCH, and a second comparator that compares the voltage of the output signal with the determination voltage VCL.

It is desirable that each of the comparators CP1 to CP3 have a hysteresis function. For example, when the voltage (peak voltage) of one of the signals AQ1 to AQ3 is close to the determination voltage VCH or VCL, a situation in which the signals ER1, ER2, and ER3 are alternately set at the H level and the L level occurs. This causes malfunction of the circuit. Such a situation can be prevented by providing the comparators CP1 to CP3 with a hysteresis function (hysteresis characteristics using two threshold voltages). Note that a peak-hold circuit that holds the peak voltage of the output signals AQ1 to AQ3 may be provided instead of a hysteresis type comparator.

Figure 16:
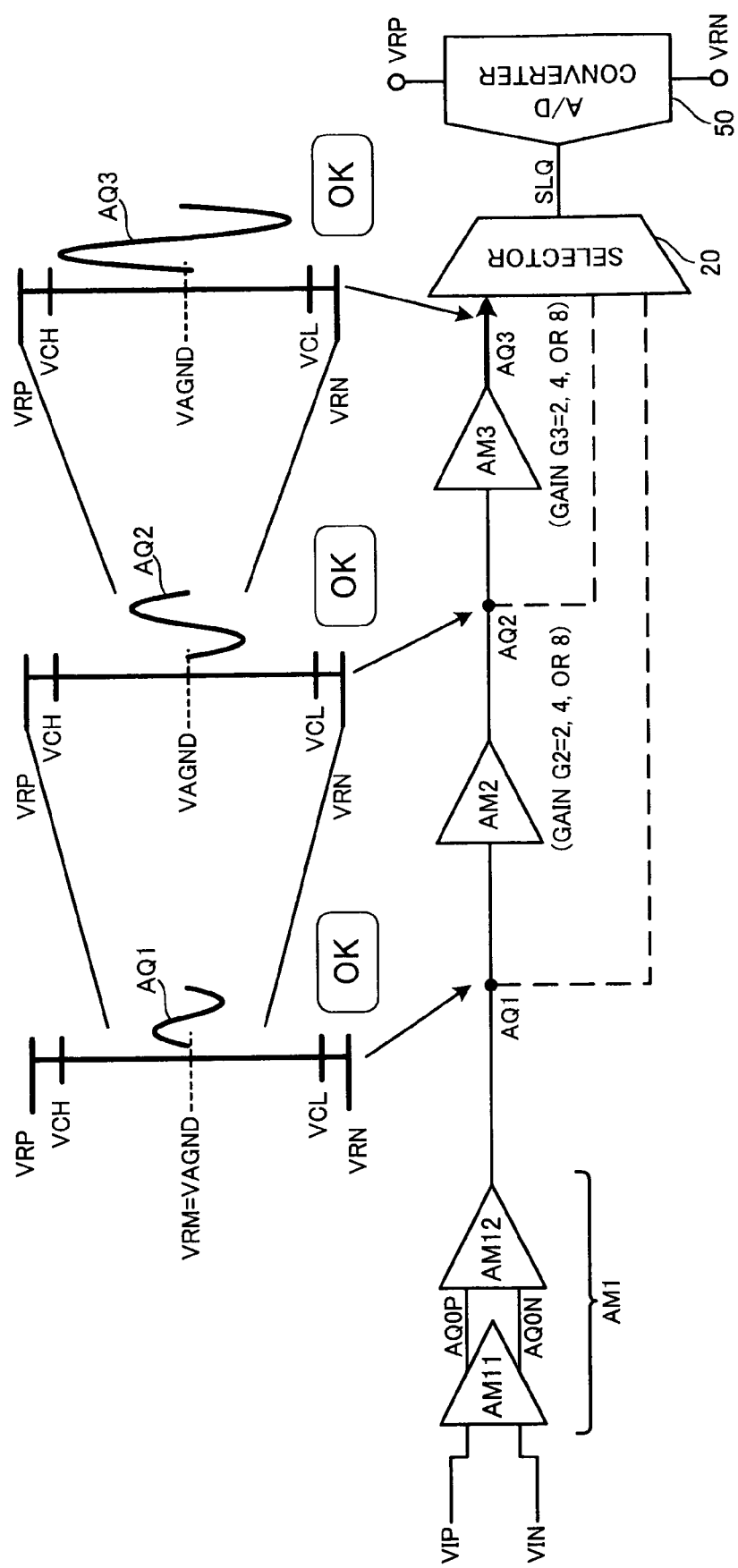
FIG. 16 is a view illustrative of an operation according to the first configuration example of the modification.

An operation according to the modification shown in FIGS. 14 and 15 is described below with reference to FIGS. 16 to 19. In FIG. 16, the voltage of the output signal AQ1 from the amplifier AM1 is within the determination voltage range specified by the high-potential-side determination voltage VCH and the low-potential-side determination voltage VCL. Therefore, the error signal ER1 from the comparator CP1 shown in FIG. 15 is set at the L level (inactive). In FIG. 16, the voltages of the output signals AQ2 and AQ3 from the amplifiers AM2 and AM3 are within the determination voltage range specified by the high-potential-side determination voltage VCH and the low-potential-side determination voltage VCL. Therefore, the error signals ES2 and ER3 output from the comparators CP2 and CP3 are also set at the L level (inactive).

As shown in FIG. 16, the high-potential-side determination voltage VCH is equal to or lower than the high-potential-side reference voltage VRP of the A/D converter 50, and the low-potential-side determination voltage VCL is equal to or higher than the low-potential-side reference voltage VRN. The voltage of the selector output signal SLQ can be set within the voltage range specified by the high-potential-side reference voltage VRP and the low-potential-side reference voltage VRN of the A/D converter 50 by setting the high-potential-side determination voltage VCH to be equal to or lower than the high-potential-side reference voltage VRP (VCH≦VRP) and setting the low-potential-side determination voltage VCL to be equal to or higher than the low-potential-side reference voltage VRN (VCL≧VRN). A margin of the detection range can be provided by setting the high-potential-side determination voltage VCH to be lower than the high-potential-side reference voltage VRP (VCH<VRP) and setting the low-potential-side determination voltage VCL to be higher than the low-potential-side reference voltage VRN (VCL>VRN).

In FIG. 16, since the signals ER1, ER2, and ER3 are set at the L level, the control circuit 70 that has received the signals ER1, ER2, and ER3 outputs the signal SSD that instructs the selector 20 to select the output signal AQ3 from the amplifier AM3 to the selector 20. The selector 20 then selects the signal AQ3. The signal AQ3 is input to the A/D converter 50 as the selector output signal SLQ, and subjected to A/D conversion. The amplitude of the signal AQ3 is larger than those of the signals AQ2 and AQ1. Specifically, the high-potential-side peak voltage and the low-potential-side peak voltage of the signal AQ3 are close to the reference voltages VRP and VRN of the A/D converter 50. Therefore, the input amplitude VAT of the A/D converter 50 can be increased so that the dynamic range DR (=VAT/VLSB) can be increased.

Figure 17:
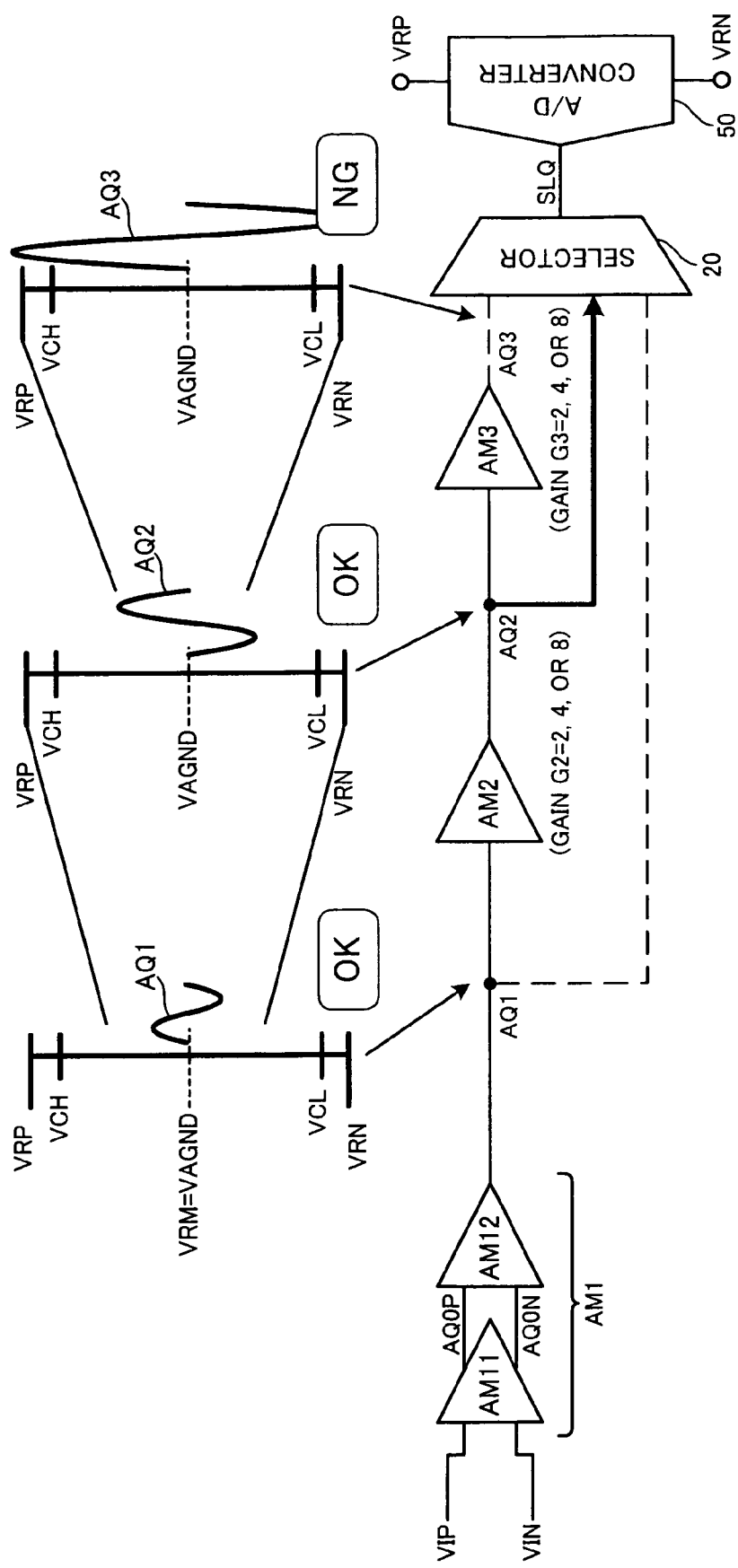
FIG. 17 is a view illustrative of an operation according to the first configuration example of the modification.

In FIG. 17, the voltages of the output signals AQ1 and AQ2 from the amplifiers AM1 and AM2 are within the determination voltage range specified by the high-potential-side determination voltage VCH and the low-potential-side determination voltage VCL. On the other hand, the voltage of the output signal AQ3 from the amplifier AM3 is outside the determination voltage range specified by the high-potential-side determination voltage VCH and the low-potential-side determination voltage VCL. In this case, the error signals ER1, ER2, and ER3 output from the comparators CP1, CP2, and CP3 are set at the L level, L level, and H level, respectively, so that saturation of the amplifier AM3 is detected. The control circuit 70 that has received the signals ER1, ER2, and ER3 outputs the signal SSD that instructs the selector 20 to select the output signal AQ2 from the amplifier AM2 to the selector 20. The selector 20 then selects the signal AQ2. The signal AQ2 is input to the A/D converter 50, and subjected to A/D conversion. The amplitude of the signal AQ2 is larger than that of the signal AQ1. Therefore, the input amplitude of the A/D converter 50 can be increased so that the dynamic range can be increased. Moreover, a situation in which the output signal AQ3 from the amplifier AM3 of which the output has been saturated is input to the A/D converter 50 and erroneously subjected to A/D conversion can be prevented.

Figure 18:
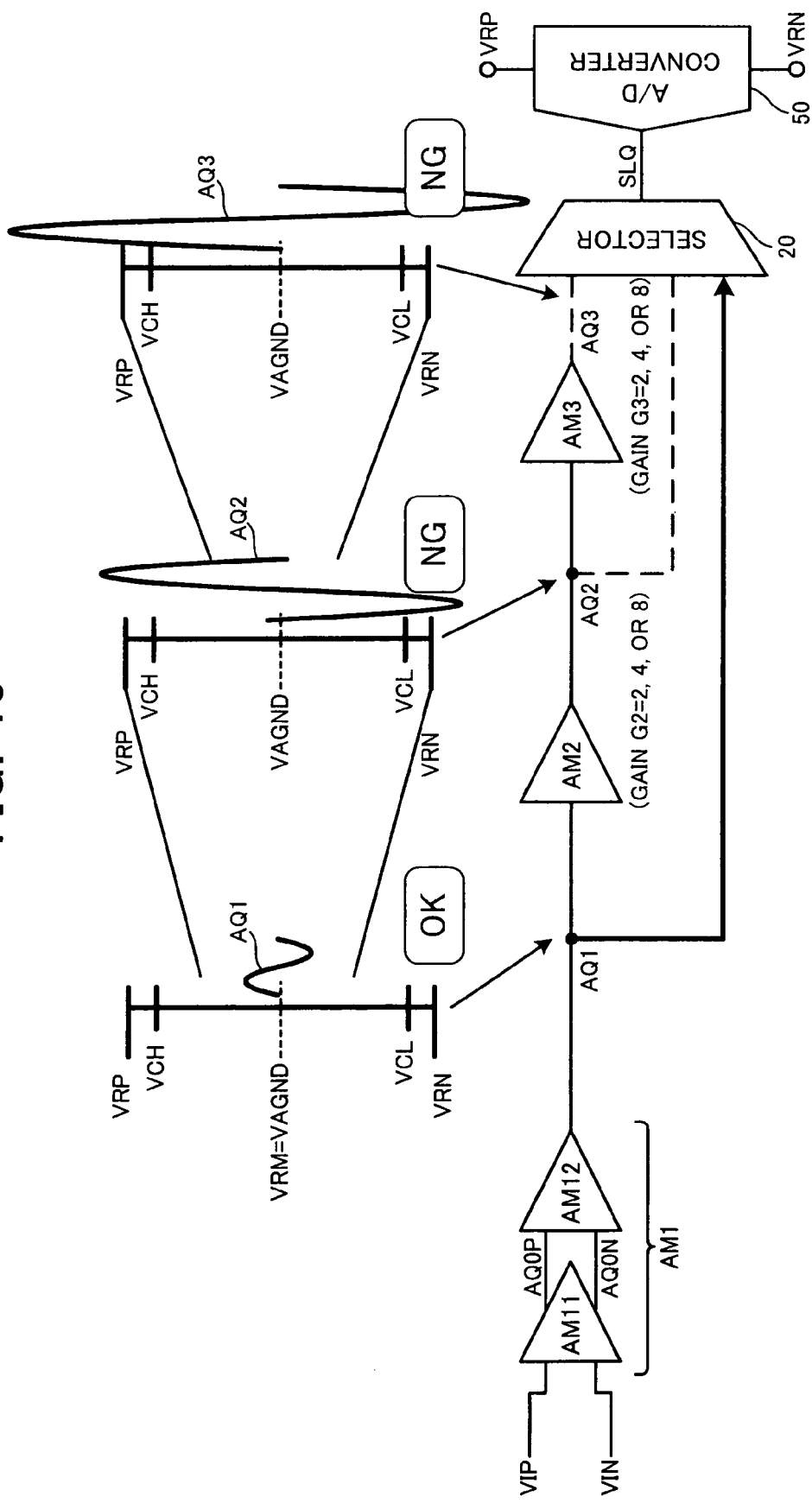
FIG. 18 is a view illustrative of an operation according to the first configuration example of the modification.

In FIG. 18, the voltage of the output signal AQ1 from the amplifier AM1 is within the determination voltage range, and the voltages of the output signals AQ2 and AQ3 from the amplifiers AM2 and AM3 are outside the determination voltage range. In this case, the error signals ER1, ER2, and ER3 are set at the L level, H level, and H level, respectively, so that saturation of the amplifiers AM2 and AM3 is detected. Therefore, the selector 20 selects the signal AQ1, and the signal AQ1 is subjected to A/D conversion. This prevents a situation in which the output signal AQ2 or AQ3 from the amplifier AM2 or AM3 of which the output has been saturated is input to the A/D converter 50 and erroneously subjected to A/D conversion.

Figure 19:
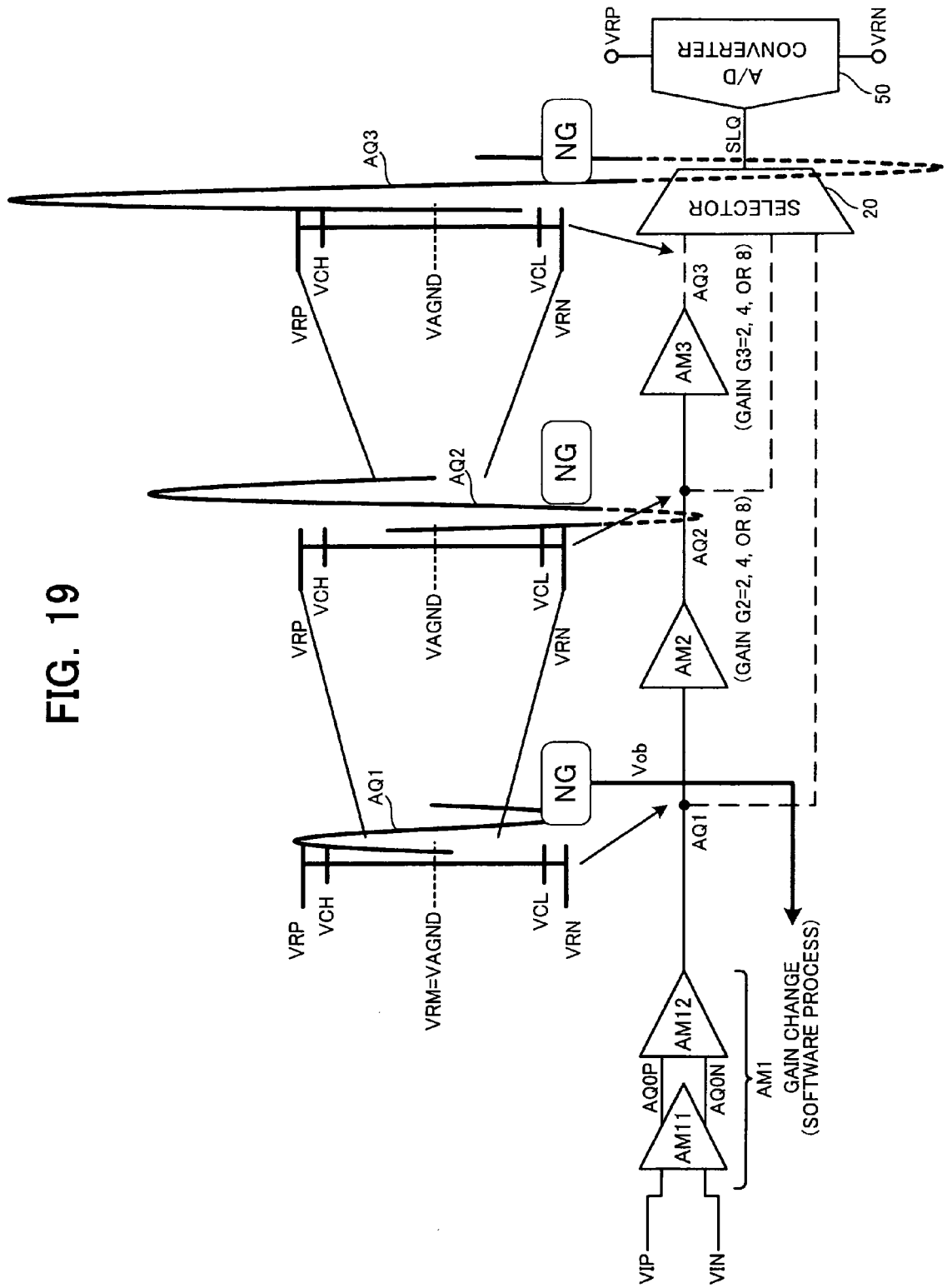
FIG. 19 is a view illustrative of an operation according to the first configuration example of the modification.

In FIG. 19, the voltages of the output signals AQ1, AQ2, and AQ3 from the amplifiers AM1, AM2, and AM3 are outside the determination voltage range. In this case, the error signals ER1, ER2, and ER3 are set at the H level so that saturation of the amplifiers AM1, AM2, and AM3 is detected. This prevents a situation in which the output signal AQ1, AQ2, or AQ3 from the amplifier AM1, AM2, or AM3 of which the output has been saturated is input to the A/D converter 50 and erroneously subjected to A/D conversion.

When the situation shown in FIG. 19 has occurred, the gain of the amplifier AM1 (AM11 and AM12) may be changed by a software process or the like so that the voltage of the signal AQ1 falls within the determination voltage range. In this case, since a time lag occurs due to the gain adjustment, the response is delayed. However, appropriate A/D conversion using the A/D converter 50 can be implemented.

5.2 Second Configuration Example of Modification

Figure 20:
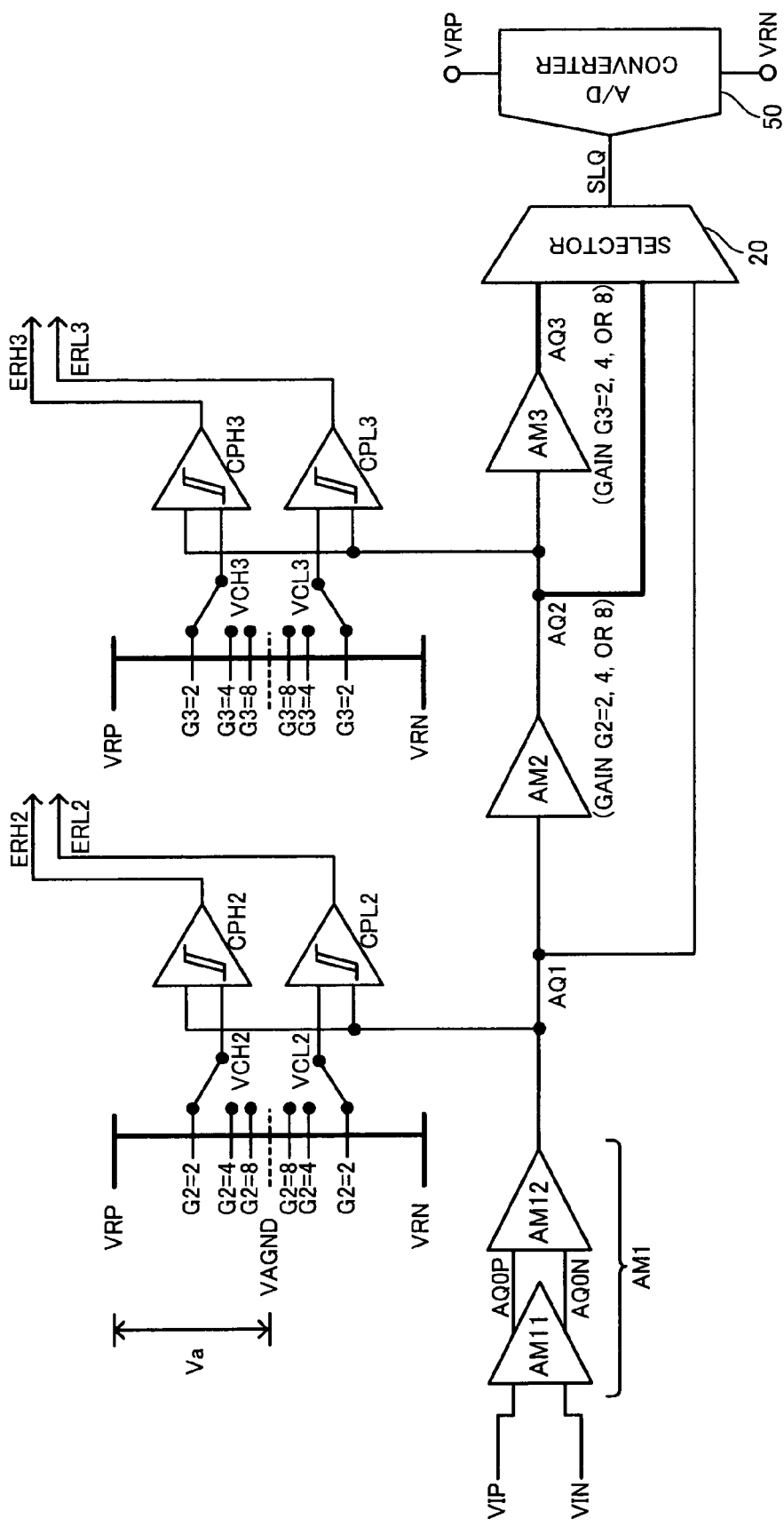
FIG. 20 shows a second configuration example of the modification.

FIG. 20 shows the main portion of a second configuration example of the modification. In the first configuration example shown in FIG. 14, whether or not the voltage of the output signal from each amplifier is within the determination voltage range is determined. In the second configuration example shown in FIG. 20, whether or not the voltage of the signal input to each amplifier is within a determination voltage range corresponding to the gain of each amplifier is determined. For example, when the voltage of the input signal AQ1 input to the amplifier AM2 (jth amplifier) has been determined to be outside the determination voltage range that is set corresponding to the gain G2 of the amplifier AM2, the control circuit 70 instructs the selector 20 to select the output signal AQ1 from the amplifier AM1 in the preceding stage of the amplifier AM2.

In FIG. 20, a comparator CPH2 compares the voltage of the input signal AQ1 input to the amplifier AM2 with a high-potential-side determination voltage VCH2. A comparator CPL2 compares the voltage of the input signal AQ1 input to the amplifier AM2 with a low-potential-side determination voltage VCL2.

The determination voltages VCH2 and VCL2 are set corresponding to the gain G2 of the amplifier AM2. For example, the high-potential-side determination voltage VCH2 decreases as the gain G2 of the amplifier AM2 increases, and the low-potential-side determination voltage VCL2 increases as the gain 62 increases. In other words, the determination voltage range specified by the high-potential-side determination voltage VCH2 and the low-potential-side determination voltage VCL2 becomes narrow as the gain G2 of the amplifier AM2 increases. The comparator CPH2 activates an error signal ERH2 when the voltage of the signal AQ1 has exceeded the determination voltage VCH2. The comparator CPL2 activates an error signal ERL2 when the voltage of the signal AQ1 has become lower than the determination voltage VCL2.

Likewise, comparators CPH3 and CPL3 compare the voltage of the input signal AQ2 input to the amplifier AM3 with determination voltages VCH3 and VCL3. The determination voltage range specified by the determination voltages VCH3 and VCL3 becomes narrow as the gain G3 of the amplifier AM3 increases. The comparator CPH3 activates an error signal ERH3 when the voltage of the signal AQ2 has exceeded the determination voltage VCH3. The comparator CPL3 activates an error signal ERL3 when the voltage of the signal AQ2 has become lower than the determination voltage VCL3.

Figure 21:
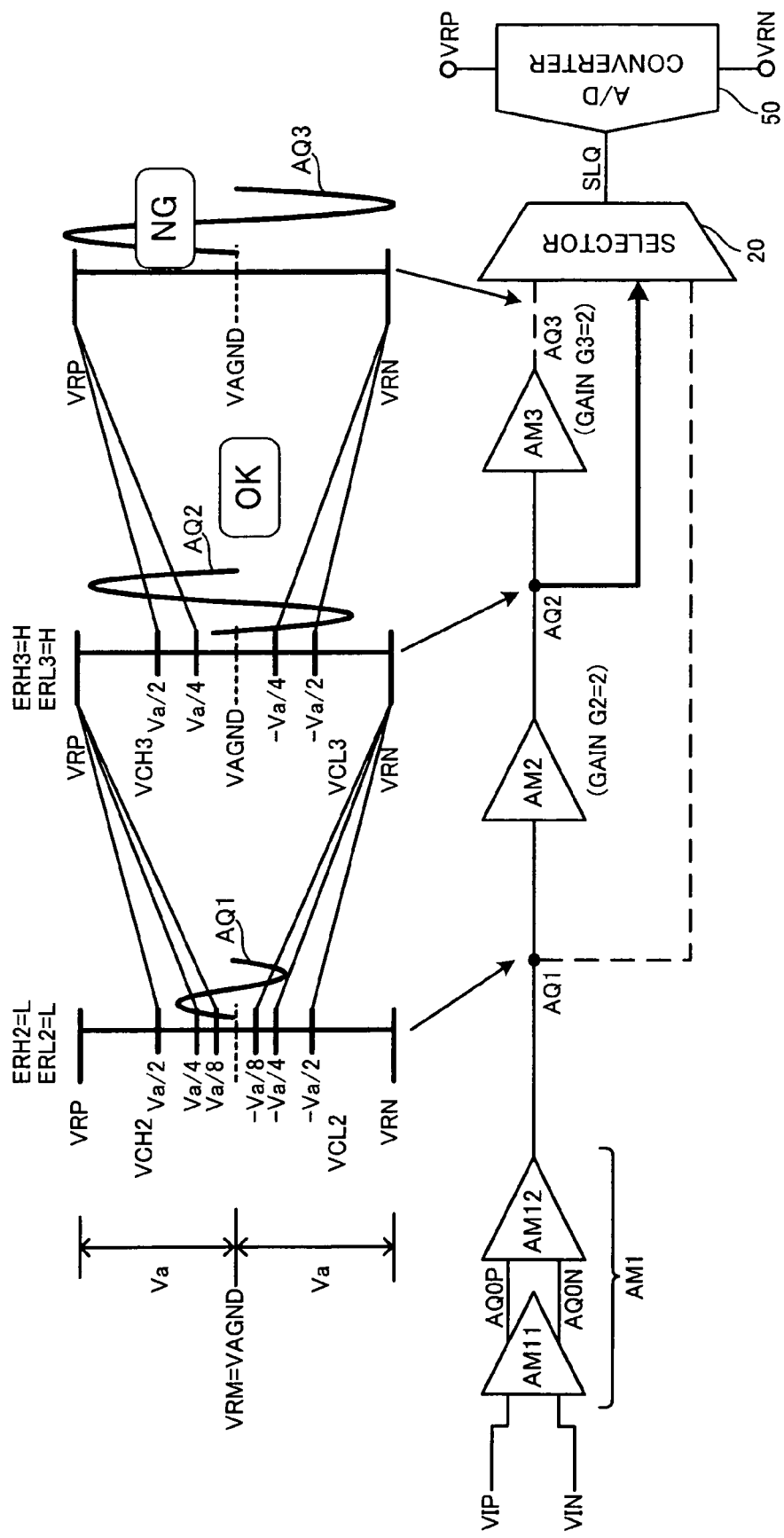
FIG. 21 is a view illustrative of an operation according to the second configuration example of the modification.

An operation according to the second configuration example is described below with reference to FIG. 21. In FIG. 21, the gains G2 and G3 of the amplifiers AM2 and AM3 are set at two (G2=G3=2). Therefore, when the reference voltage VRP is Va and the reference voltage VRN is −Va, the determination voltage VCH2 is Va/G2=Va/2, the determination voltage VCL2 is −Va/G2=−Va/2, the determination voltage VCH3 is Va/G3=Va/2, and the determination voltage VCL3 is −Va/G3=−Va/2.

In FIG. 21, the voltage of the input signal AQ1 input to the amplifier AM2 is within the determination voltage range specified by the voltages −Va/2 and Va/2 corresponding to the gain G2 of the amplifier AM2. Therefore, the error signals ERH2 and ERL2 are set at the L level (inactive). On the other hand, the voltage of the input signal AQ2 input to the amplifier AM3 is outside the determination voltage range specified by the voltages −Va/2 and Va/2 corresponding to the gain G3 of the amplifier AM3. Therefore, the error signals ERH3 and ERL3 are set at the H level (active). Specifically, the voltage of the signal obtained by amplifying the signal AQ2 using the amplifier AM3 with the gain G3 is outside the voltage range specified by the reference voltages VRP and VRN. In this case, the signal AQ2 is selected by the selector 20, input to the A/D converter 50 as the signal SLQ, and subjected to A/D conversion. This prevents a situation in which the output signal AQ3 from the amplifier AM3 of which the output has been saturated is input to the A/D converter 50 and erroneously subjected to A/D conversion.

For example, when saturation of the amplifier AM3 is determined based on the output signal AQ3 from the amplifier AM3 as in the first configuration example, a time lag occurs due to the signal delay time of the amplifier AM3 so that the determination time is delayed (increases).

In the second configuration example, saturation of the amplifier AM3 is determined based on the input signal AQ2 input to the amplifier AM3. Therefore, since the signal delay time of the amplifier AM3 does not affect the determination time, a quick response can be achieved as compared with the first configuration example. As a result, an integrated circuit device suitable for a signal that requires a quick automatic adjustment (e.g., an AC signal such as a sound signal), a signal that can be sampled only once, and the like can be provided.

5.3 Third Configuration Example of Modification

A third configuration example of the modification is described below with reference to FIGS. 22A to 24. In the third configuration example, the control circuit 70 (digital processing section) provided in the subsequent stage of the A/D converter 50 performs a calculation process based on the digital data ADQ from the A/D converter 50. Specifically, the control circuit 70 performs a different calculation process corresponding to the output signal (input signal) selected by the selector 20 from the output signals (input signals) from the amplifiers AM1, AM2, and AM3. For example, a digital calculation process performed on the digital data ADQ by the control circuit 70 when the output signal AQ1 from the amplifier AM1 has been selected differs from a digital calculation process performed on the digital data ADQ by the control circuit 70 when the output signal AQ2 from the amplifier AM2 has been selected.

Figure 22A:
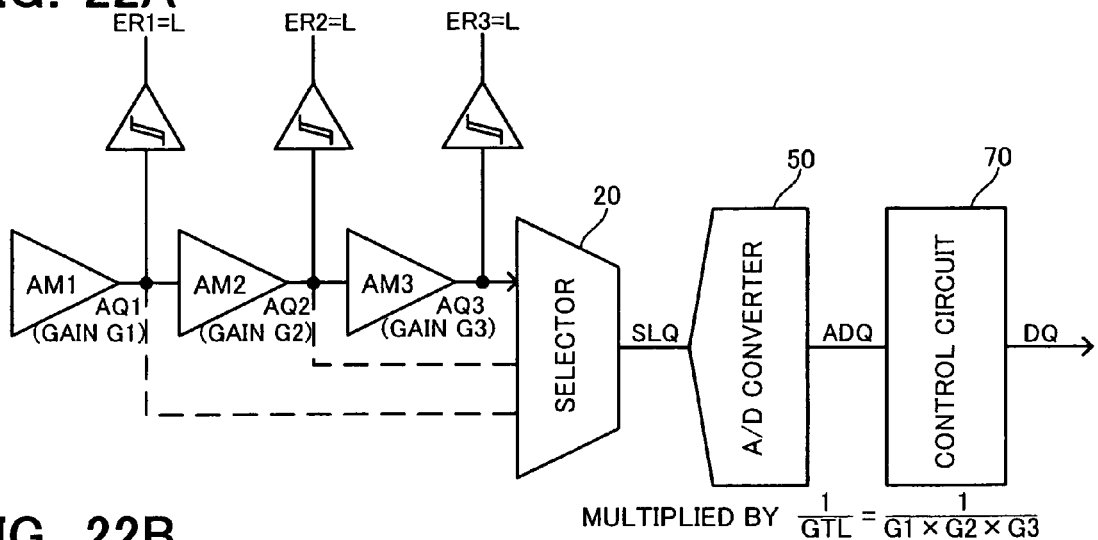
FIGS. 22A to 22C are views illustrative of an operation according to a third configuration example of the modification.

In FIG. 22A, the output signal AQ3 from the amplifier AM3 (j−1)th amplifier) among the amplifiers AM1 to AM3 is selected by the selector 20, for example. In this case, the control circuit 70 performs a calculation process (e.g., bit-shift process) that multiplies the digital data ADQ from the A/D converter 50 by a multiplication coefficient corresponding to the reciprocal 1/GTL of the total gain GTL of the amplifiers AM1 to AM3 (first to (j−1)th amplifiers). Specifically, when the gains of the amplifiers AM1, AM2, and AM3 are referred to as G1, G2, and G3, respectively, the total gain GTL is expressed by GTL=G1×G2×G3. The control circuit 70 multiplies the digital data ADQ by the multiplication coefficient 1/GTL=1/(G1×G2×G3) (reciprocal of the total gain GTL). Note that the multiplication coefficient may be set on the assumption that the gain G1 of the first-stage amplifier AM1 is one (G1=1).

Figure 22B:
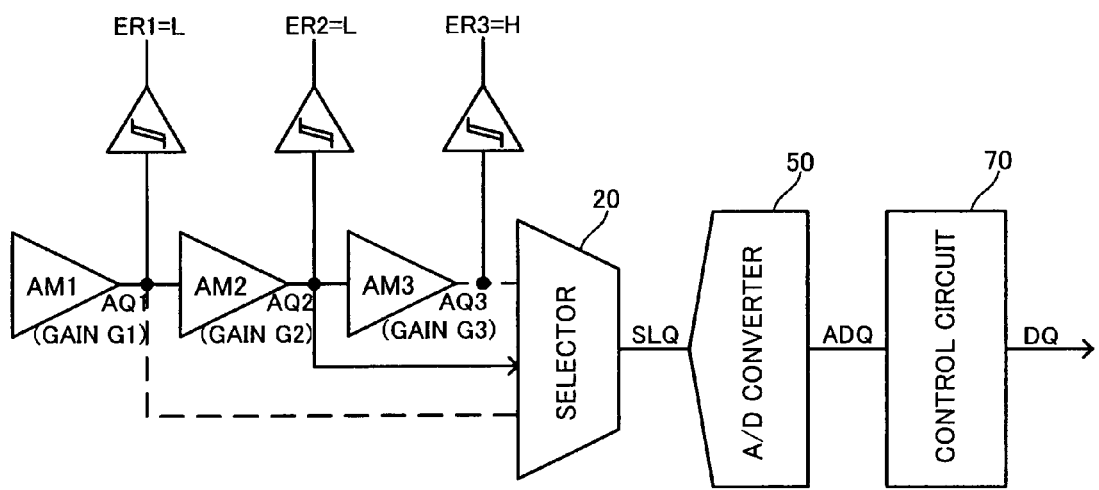

In FIG. 22B, the output signal AQ2 from the amplifier AM2 is selected by the selector 20. In this case, the control circuit 70 performs a calculation process that multiplies the digital data ADQ by the multiplication coefficient corresponding to the reciprocal 1/GTL of the total gain GTL of the amplifiers AM1 and AM2. Specifically, the total gain GTL is expressed by GTL=G1×G2, and the control circuit 70 multiplies the digital data ADQ by the multiplication coefficient 1/GTL=1/(G1×G2) (reciprocal of the total gain GTL).

Figure 22C:
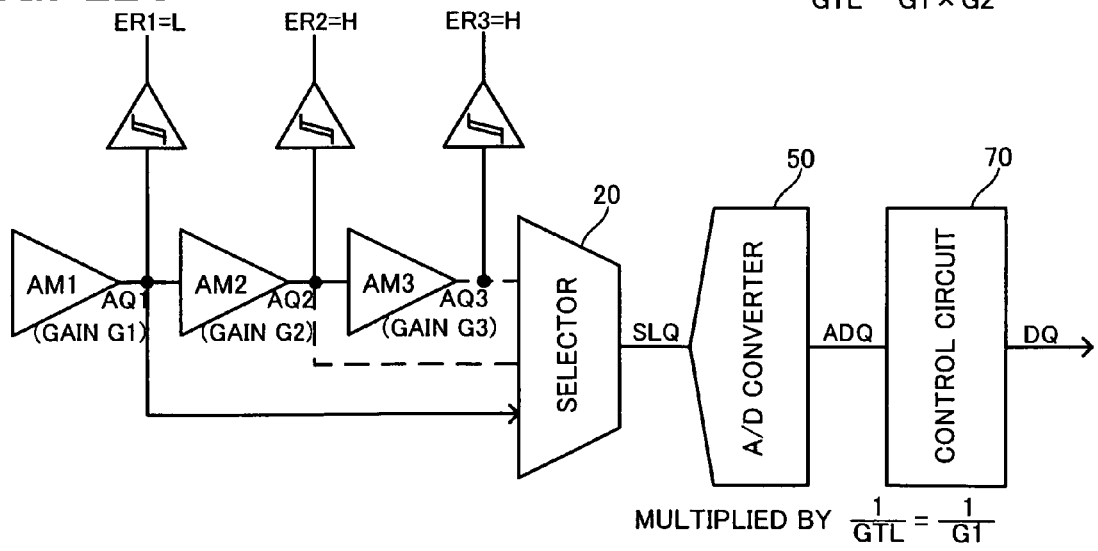

In FIG. 22C, the output signal AQ1 from the amplifier AM1 is selected by the selector 20. In this case, the total gain GTL is expressed by GTL=G1. When the gain G1 of the amplifier AM1 is regarded as one, the multiplication coefficient 1/GTL is one (1/GTL=1). Therefore, the control circuit 70 does not perform the multiplication process (bit-shift process).

Figure 23A:
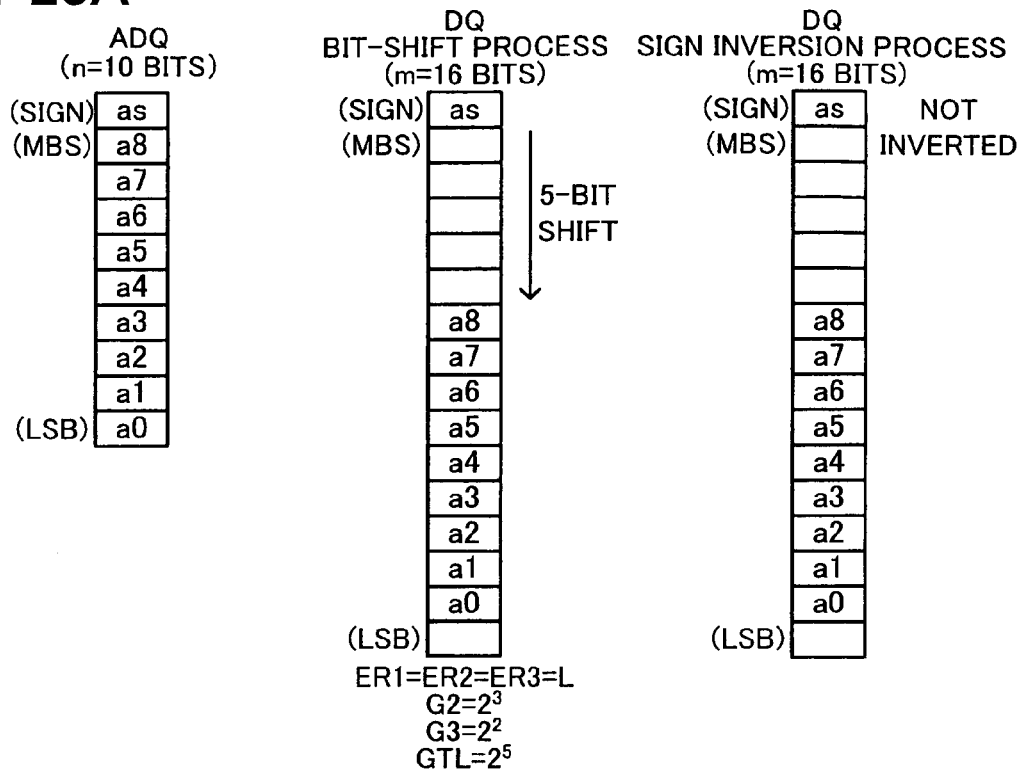
FIGS. 23A and 23B are views illustrative of digital processing performed by a control circuit.
Figure 23B:
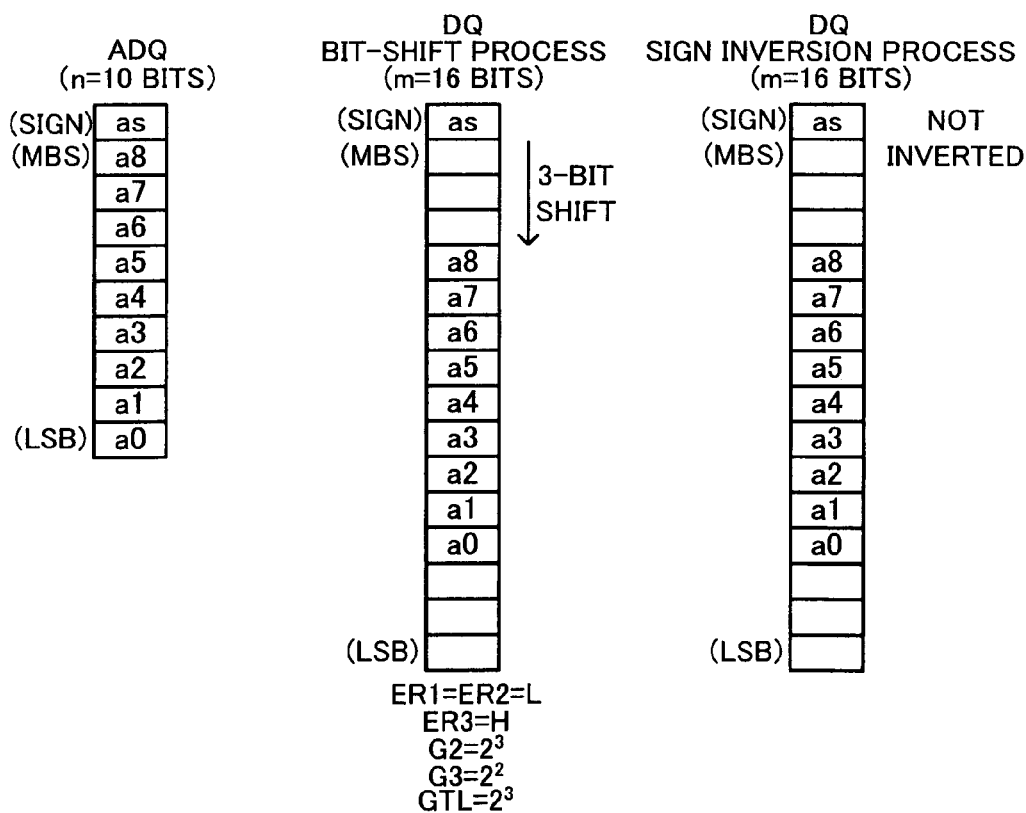
Figure 24:
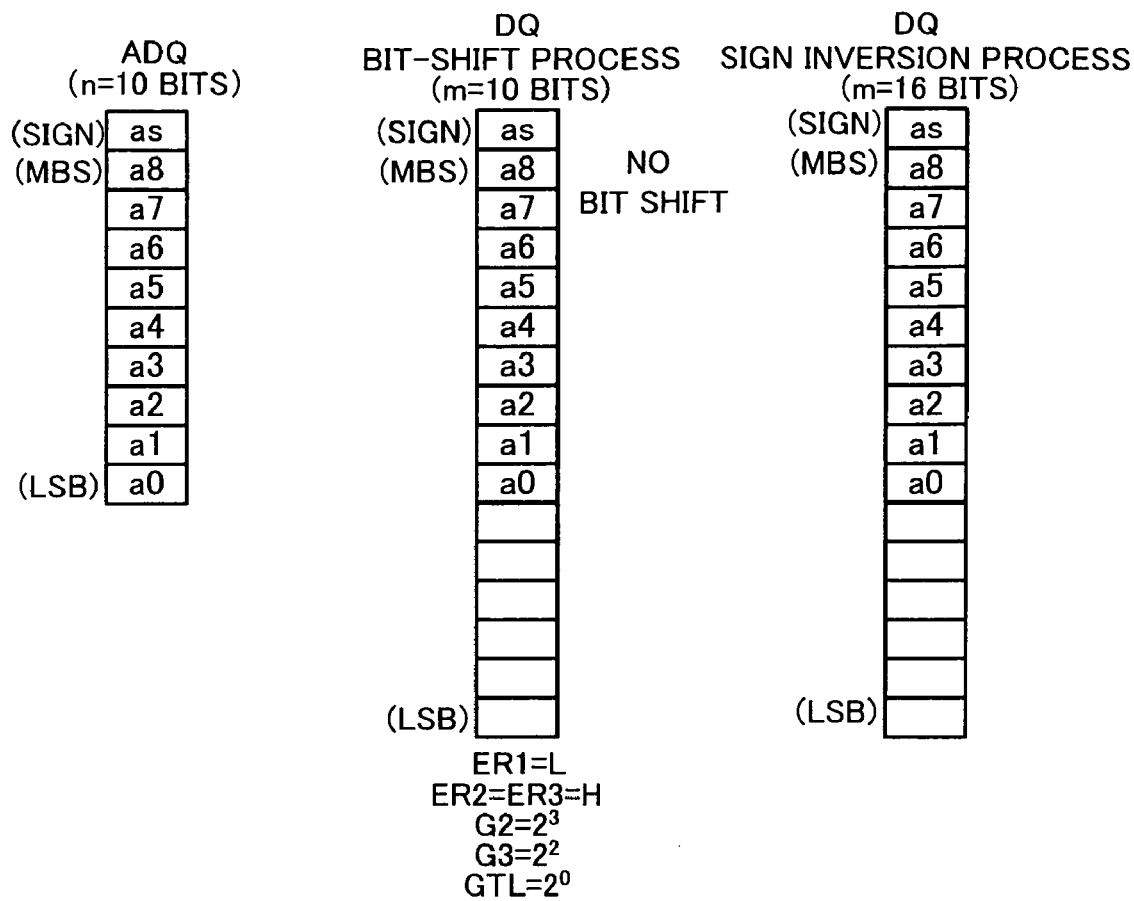
FIG. 24 is a view illustrative of digital processing performed by a control circuit.

A specific example of the calculation process of the control circuit 70 is described below with reference to FIGS. 23A to 24. In FIG. 23A, the resolution of the A/D converter 50 is 10 bits (n bits in a broad sense; n is an integer equal to or larger than two), for example. In this case, the control circuit 70 performs the calculation process based on the 10-bit (n-bit) digital data ADQ from the A/D converter 50, and outputs 16-bit (m-bits in a broad sense; m is an integer larger than n (m>n)) digital data DQ, for example. Specifically, the control circuit 70 increases the number of bits from 10 bits to 16 bits.

For example, when using a method that increases the A/D conversion dynamic range by making the A/D input amplitude (swing level) constant by means of a gain adjustment and an offset adjustment, as described with reference to FIG. 3, the gain adjustment amount and the offset adjustment amount change corresponding to the input signal. Therefore, the voltage level indicated by the digital data ADQ obtained by A/D conversion also changes corresponding to the gain adjustment amount and the offset adjustment amount. Therefore, it is not desirable to directly transmit the digital data to a system in the subsequent stage.

According to this embodiment, since the 10-bit digital data ADQ is converted into the 16-bit digital data DQ, the digital data DQ that indicates a correct A/D conversion voltage level can be transmitted to the system even when performing the gain adjustment and the like.

In FIG. 23A, the digital data ADQ obtained by A/D conversion is 10-bit (n-bit) data. Bits a0 to a8 form a bit string that indicates an absolute value (i.e., the absolute value of the voltage level), and a bit as is a sign bit that indicates a sign. The gains G2 and G3 of the amplifiers AM2 and AM3 are set at a power of two. Specifically, the gain G2 is set at $2^3$, and the gain G2 is set at $2^2$.

When the output signal AQ3 from the amplifier AM3 is selected by the selector 20 (see FIG. 22A), the error signals ER1, ER2, and ER3 are set at the L level, and the total gain GTL is expressed by GTL=G2×G3=$2^3 \times 2^2 2 \times^5$ (provided that G1=1). In this case, the control circuit 70 performs a 5-bit-shift process as the process that multiplies the digital data ADQ by the multiplication coefficient corresponding to the reciprocal of the total gain GTL (=$2^5$), as shown in FIG. 23A. Specifically, the control circuit 70 performs a bit-shift process that multiplies the voltage level of the signal that has been gain-adjusted by a factor of $2^2 \times 2^3 = 2^5$ using the amplifier AM2 (gain G2=$2^3$) and the amplifier AM3 (gain G3=$2^2$) by $1/2^5$ to recover the original voltage level.

When the output signal AQ2 from the amplifier AM2 is selected by the selector 20 (see FIG. 22B), the error signals ER1 and ER2 are set at the L level, and the error signal ER3 is set at the H level. The total gain GTL is expressed by GTL=G3=$2^3$. In this case, the control circuit 70 performs a 3-bit-shift process as the process that multiplies the digital data ADQ by the multiplication coefficient corresponding to the reciprocal of the total gain GTL (=$2^3$), as shown in FIG. 23B. Specifically, the control circuit 70 performs a bit-shift process that multiplies the voltage level of the signal that has been gain-adjusted by a factor of 23 using the amplifier AM2 (gain G2=$2^3$) by $\frac{1}{2}^3$ to recover the original voltage level.

When the output signal AQ3 is selected by the selector 20 (see FIG. 22C), the error signal ER1 is set at the L level, and the error signals and ER2 and ER3 are set at the H level. The total gain GTL is expressed by GTL-$2^0$=1. In this case, the control circuit 70 does not perform a bit-shift process, as shown in FIG. 24.

As described above, the control circuit 70 shifts at least the bit string a0 to a8 that is included in the m-bit (e.g., 16-bit) digital data DQ and indicates the absolute value by the number of bits (e.g., 5 bits) determined corresponding to the output signal selected by the selector 20 from the output signals from the amplifiers AM1, AM2, and AM3.

The voltage level indicated by the digital data DQ does not depend on the gain adjustment amount ($2^5$) as a result of performing the above-described bit-shift process. Therefore, the system in the subsequent stage that has received the digital data DQ can disregard the gain adjustment. Since a signal having a large amplitude (A5 in FIG. 3) can be input to the A/D converter 50, even if the amplitude of the input signal is small (A3 in FIG. 3), by performing a gain adjustment by a factor of $2^5$, the dynamic range can be increased (B2 in FIG. 4).

The amplifiers AM2 and AM3 are formed by the inverting amplifiers, as described with reference to FIG. 15. Since it is unnecessary to use a rail-to-rail operational amplifier by utilizing the inverting amplifiers as the amplifiers AM2 and AM3, a reduction in circuit scale and an improvement in the characteristics of the operational amplifier can be achieved. In this case, the sign of the 16-bit digital data DQ changes corresponding to the output signal selected by the selector 20 when no measures are taken.

Therefore, the control circuit 70 performs a process (inversion/non-inversion process) that sets the sign bit as of the 16-bit (m-bit) digital data corresponding to the output signal selected by the selector 20A from the output signals AQ2 and AQ3 from the amplifiers AM2 and AM3.

For example, when the output signal AQ3 from the amplifier AM3 is selected by the selector 20 (FIG. 22A), the selector output signal SLQ is a signal that has passed through the inverting amplifiers AM2 and AM3. In this case, the control circuit 70 does not invert the sign bit as, as shown in FIG. 23A.

When the output signal AQ2 from the amplifier AM2 is selected by the selector 20 (FIG. 22B), the selector output signal SLQ is a signal that has passed through the inverting amplifier AM2. In this case, the control circuit 70 inverts the sign bit as, as shown in FIG. 23B.

When the output signal AQ1 from the amplifier AM1 is selected by the selector 20 (FIG. 22C), the selector output signal SLQ has not passed through the inverting amplifiers AM2 and AM3. In this case, the control circuit 70 does not invert the sign bit as, as shown in FIG. 24.

According to this configuration, since an appropriate sign bit as is set corresponding to the signal AQ1, AQ2, or AQ3 selected by the selector 20, consistent 16-bit digital data DQ with a sign bit can be transmitted to the system.

The calculation process performed by the control circuit 70 is not limited to the above-described bit-shift process and sign setting process. The control circuit 70 may perform various processes necessary for the system to disregard the gain adjustment and the offset adjustment.

6. Electronic Instrument

An electronic instrument according to one embodiment of the invention is described below with reference to FIGS. 25A to 25C. Note that the electronic instrument according to this embodiment is not limited to the configurations shown in FIGS. 25A to 25C. Various modifications may be made such as omitting some of the elements or adding other elements.

Figure 25A:
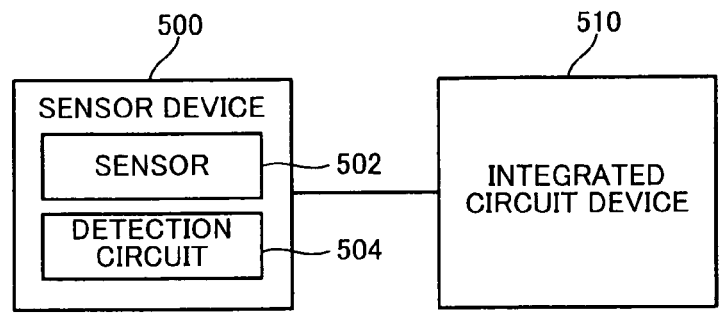
FIGS. 25A to 25C show configuration examples of an electronic instrument according to one embodiment of the invention.

FIG. 25A shows a first configuration example of the electronic instrument according to this embodiment. The electronic instrument according to the first configuration example includes a sensor device 500, and an integrated circuit device 510 (analog front-end (AFE) circuit) according to the above embodiment. In the electronic instrument shown in FIG. 25A, the sensor device 500 (physical quantity transducer) detects various physical quantities (e.g., force, acceleration, and mass). The sensor device 500 converts the physical quantity into a current (charge), a voltage, or the like, and outputs the current, voltage, or the like as a detection signal. The sensor device 500 includes a sensor 502 and a detection circuit 504. Note that the sensor device 500 may not include the detection circuit 504.

The integrated circuit device 510 receives the detection signal from the sensor device 500, subjects the detection signal to A/D conversion, and optionally performs a calculation process (signal processing) on digital data obtained by A/D conversion. The integrated circuit device 510 outputs the resulting digital data to a system (system board or system device such as a CPU) in the subsequent stage.

According to the first configuration example shown in FIG. 25A, various electronic instruments that include a smoke sensor, an optical sensor, a human detection sensor, a pressure sensor, a biosensor, a gyrosensor, and the like can be implemented.

Figure 25B:
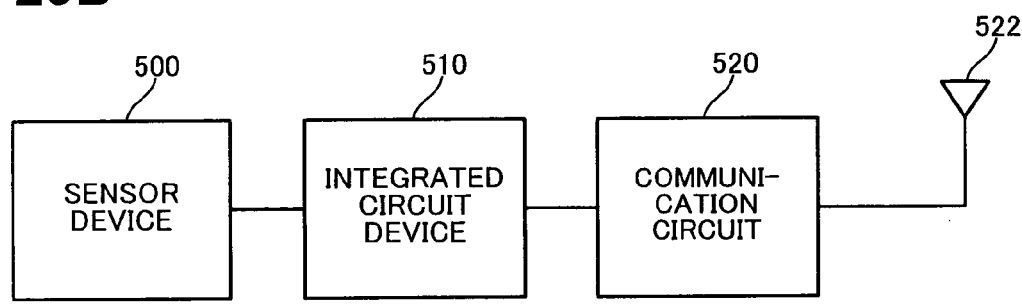

FIG. 25B shows a second configuration example of the electronic instrument according to this embodiment. In the second configuration example, a communication circuit (radio circuit) 520 and an antenna 522 are provided in addition to the elements of the first configuration example shown in FIG. 25A. The communication circuit 520 performs a modulation process and the like on the digital data from the integrated circuit device 510, and transmits the resulting data to an external instrument (target-side electronic instrument) using the antenna 522. The communication circuit 520 may receive data from an external instrument using the antenna 522, and perform an ID) authentication process or control the sensor device 500, for example.

According to the second configuration example shown in FIG. 25B, electronic instruments such as an IC tag (RF tag) used for radio frequency identification (RFID) that writes and reads data in a contactless manner utilizing wireless communication can be implemented in addition to the electronic instruments that can be implemented by the first configuration example shown in FIG. 25A, for example.

Figure 25C:
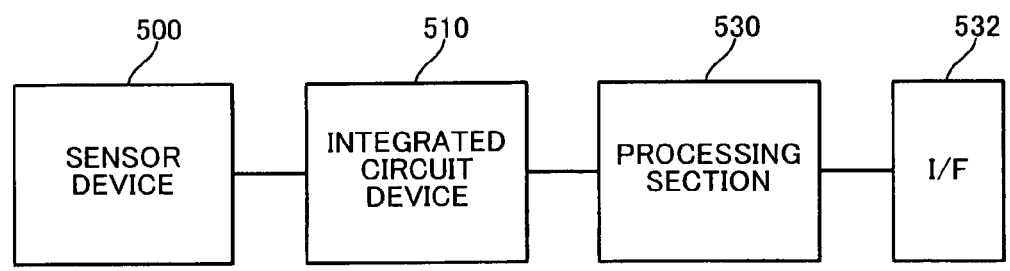

FIG. 25C shows a third configuration example of the electronic instrument according to this embodiment. The electronic instrument shown in FIG. 25C includes a processing section 530 and an interface (I/F) 532 in addition to the elements of the first configuration example shown in FIG. 25A. The processing section 530 receives the digital data from the integrated circuit device 510, and performs various processes. The I/F 532 performs data transfer conforming to the USB standard, the IEEE 1394 standard, or the like to and from an external instrument such as a personal computer (PC).

According to the third configuration example shown in FIG. 25C, electronic instruments such as an evaluation device (evaluation board) used for development and trial production of the sensor device 500 can be implemented in addition to the electronic instruments that can be implemented by the first and second configuration examples shown in FIGS. 25A and 25B.

Although some embodiments of the invention have been described in detail above, those skilled in the art would readily appreciate that many modifications are possible in the embodiments without materially departing from the novel teachings and advantages of the invention. Accordingly, such modifications are intended to be included within the scope of the invention. Any term (e.g., amplifiers AM1 to AM3 and D/A converters DAC1 to DAC3) cited with a different term (e.g., first to Nth amplifiers and first to Nth D/A converters) having a broader meaning or the same meaning at least once in the specification and the drawings may be replaced by the different term in any place in the specification and the drawings. The configurations and the operations of the integrated circuit device and the electronic instrument are not limited to those described with reference to the above embodiments. Various modifications and variations may be made.

What is claimed is:

1. An integrated circuit device comprising:
an amplifier circuit that includes first to Nth (N is an integer equal to or larger than two) amplifiers and receives an input signal, the first to Nth amplifiers being cascaded;
an A/D converter that performs an A/D conversion process on a signal amplified by the amplifier circuit;
first to Nth D/A converters that are provided corresponding to the first to Nth amplifiers and used to perform an offset adjustment of the first to Nth amplifiers; and
a control circuit that sets an offset adjustment of the first to Nth amplifiers using the first to Nth D/A converters and sets a gain adjustment of the first to Nth amplifiers,
an output range QR1 of an ith (i is an integer that satisfies $1 \leq i < N$) D/A converter among the first to Nth D/A converters being wider than an output range QR2 of an (i+1)th D/A converter among the first to Nth D/A converters that is provided in a subsequent stage of the ith D/A converter.

2. The integrated circuit device as defined in claim 1,
when a gain of an ith amplifier among the first to Nth amplifiers is referred to as G1 and a 1LSB-equivalent voltage of the ith D/A converter is referred to as VLSB1, $QR2 \geq G1 \times VLSB1$ being satisfied.

3. An electronic instrument comprising the integrated circuit device as defined in claim 1.

4. An integrated circuit comprising:
an amplifier circuit that includes first to Nth (N is an integer equal to or larger than two) amplifiers and receives an input signal, the first to Nth amplifiers being cascaded;
an A/D converter that performs an A/D conversion process on a signal amplified by the amplifier circuit;
first to Nth D/A converters that are provided corresponding to the first to Nth amplifiers and used to perform an offset adjustment of the first to Nth amplifiers; and
a control circuit that sets an offset adjustment of the first to Nth amplifiers using the first to Nth D/A converters and sets a gain adjustment of the first to Nth amplifiers,
a 1LSB-equivalent voltage VLSB1 of an ith (i is an integer that satisfies $1 \leq i < N$) D/A converter among the first to Nth D/A converters being higher than a 1LSB-equivalent voltage VLSB2 of an (i+1)th D/A converter among the first to Nth D/A converters that is provided in a subsequent stage of the ith D/A converter.

5. An electronic instrument comprising the integrated circuit device as defined in claim 4.

6. An integrated circuit device comprising:
an amplifier circuit that includes first to Nth (N is an integer equal to or larger than two) amplifiers and receives an input signal, the first to Nth amplifiers being cascaded;
an A/D converter that performs an A/D conversion process on a signal amplified by the amplifier circuit;
first to Nth D/A converters that are provided corresponding to the first to Nth amplifiers and used to perform an offset adjustment of the first to Nth amplifiers; and
a control circuit that sets an offset adjustment of the first to Nth amplifiers using the first to Nth D/A converters and sets a gain adjustment of the first to Nth amplifiers;
first to Nth offset adjustment registers that are provided corresponding to the first to Nth amplifiers and store first to Nth offset adjustment data, the first to Nth offset adjustment data being used to perform an offset adjustment of the first to Nth amplifiers; and
first to Nth gain adjustment registers that are provided corresponding to the first to Nth amplifiers and store first to Nth gain adjustment data, the first to Nth gain adjustment data being used to perform a gain adjustment of the first to Nth amplifiers.

7. The integrated circuit device as defined in claim 6,
the control circuit calculating the first to Nth offset adjustment data based on gains of the first to Nth amplifiers, and setting the first to Nth offset adjustment data in the first to Nth offset adjustment registers when performing signal offset calibration of the input signal.

8. The integrated circuit device as defined in claim 7,
the control circuit calculating (i+1)th (i is an integer that satisfies $1 \leq i < N$) offset adjustment data among the first to Nth offset adjustment data based on a rounding error value and a gain of an ith amplifier among the first to Nth amplifiers, and setting the (i+1)th offset adjustment data in an (i+1)th offset adjustment register among the first to Nth offset adjustment registers, the rounding error value being due to a rounding calculation process that calculates ith offset adjustment data among the first to Nth offset adjustment data.

9. The integrated circuit device as defined in claim 7,
the control circuit setting the gains of the first to Nth amplifiers at gains under a first gain condition, calculating signal offset value data of the input signal,
the control circuit setting the gains of the first to Nth amplifiers at gains under a second gain condition, and again calculating the signal offset value data of the input signal, the gains under the second gain condition being set to be higher than the gains under the first gain condition.

10. An electronic instrument comprising the integrated circuit device as defined in claim 6.

11. An integrated circuit device comprising:
an amplifier circuit that includes first to Nth (N is an integer equal to or larger than two) amplifiers and receives an input signal, the first to Nth amplifiers being cascaded;
an A/D converter that performs an A/D conversion process on a signal amplified by the amplifier circuit;
first to Nth D/A converters that are provided corresponding to the first to Nth amplifiers and used to perform an offset adjustment of the first to Nth amplifiers;
a control circuit that sets an offset adjustment of the first to Nth amplifiers using the first to Nth D/A converters and sets a gain adjustment of the first to Nth amplifiers;

a selector that selects an output signal among output signals from the first to Nth amplifiers, and outputs the selected output signal to the A/D converter as a selector output signal; and a determination circuit that determines whether or not a voltage of the output signal from each of the first to Nth amplifiers is within a determination voltage range specified by a high-potential-side determination voltage and a low-potential-side determination voltage, the control circuit instructing the selector to select an output signal among the output signals from the first to Nth amplifiers based on a determination result of the determination circuit.

12. The integrated circuit device as defined in claim 11, the control circuit instructing the selector to select an output signal from a (j−1)th (j is an integer that satisfies $1<j\leqq N$) amplifier among the first to Nth amplifiers when the determination circuit has determined that a voltage of an output signal from a jth amplifier among the first to Nth amplifiers is not within the determination voltage range.

13. The integrated circuit device as defined in claim 11, the control circuit instructing the selector to select an output signal from a (j−1)th (j is an integer that satisfies $1<j\leqq N$) amplifier among the first to Nth amplifiers when the determination circuit has determined that a voltage of a signal input to a jth amplifier among the first to Nth amplifiers is not within a jth determination voltage range that is set corresponding to a gain of the jth amplifier.

14. The integrated circuit device as defined in claim 11, the determination circuit including first to Nth comparators that compare the voltages of the output signals from the first to Nth amplifiers with the high-potential-side determination voltage and the low-potential-side determination voltage.

15. The integrated circuit device as defined in claim 11, the control circuit performing a different calculation process on digital data from the A/D converter corresponding to an output signal selected by the selector from the output signals from the first to Nth amplifiers.

16. The integrated circuit device as defined in claim 15, the control circuit multiplying the digital data from the A/D converter by a multiplication coefficient that corresponds to a reciprocal of a total gain of the first amplifier to a (j−1)th (j is an integer that satisfies $1<j\leqq N$) amplifier among the first to Nth amplifiers when the selector has selected an output signal from the (j−1)th amplifier.

17. The integrated circuit device as defined in claim 15, the control circuit performing a calculation process based on n-bit (n is an integer equal to or larger than two) digital data from the A/D converter, and outputting m-bit (m is an integer larger than n) digital data when a resolution of the A/D converter is n bits.

18. The integrated circuit device as defined in claim 17, the control circuit shifting a bit string by the number of bits that is determined corresponding to an output signal selected by the selector from the output signals from the first to Nth amplifiers, the bit string being including in the m-bit digital data and indicates an absolute value.

19. The integrated circuit device as defined in claim 17, the first to Nth amplifiers being cascaded inverting amplifiers; and the control circuit setting a sign bit of the m-bit digital data corresponding to an output signal selected by the selector from the output signals from the first to Nth amplifiers.

* * * * *